US012610664B2

(12) United States Patent
Lee et al.

(10) Patent No.: US 12,610,664 B2
(45) Date of Patent: Apr. 21, 2026

(54) DISPLAY DEVICE AND METHOD OF FABRICATING THE SAME

(71) Applicant: Samsung Display Co., LTD., Yongin-si (KR)

(72) Inventors: Jin Woo Lee, Yongin-si (KR); Zu Seok Oh, Yongin-si (KR); Jeong Hyun Lee, Yongin-si (KR); Kyung Ah Choi, Yongin-si (KR); Kook Hyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 18/334,251

(22) Filed: Jun. 13, 2023

(65) Prior Publication Data

US 2024/0014351 A1      Jan. 11, 2024

(30) Foreign Application Priority Data

Jul. 7, 2022      (KR) ........................ 10-2022-0084029

(51) Int. Cl.
H10H 20/831 (2025.01)
H01L 25/075 (2006.01)
(Continued)

(52) U.S. Cl.
CPC ..... H10H 20/8312 (2025.01); H01L 25/0753 (2013.01); H01L 25/167 (2013.01);
(Continued)

(58) Field of Classification Search
CPC ........... H10H 20/8312; H10H 20/8514; H10H 20/855; H10H 20/857; H10H 20/032;
(Continued)

(56) References Cited

U.S. PATENT DOCUMENTS

| | | | |
|---|---|---|---|
| 9,570,425 B2 | 2/2017 | Do | |
| 9,773,761 B2 | 9/2017 | Do | |
| 11,094,741 B2 | 8/2021 | Kim et al. | |
| 11,817,432 B2 | 11/2023 | Bae et al. | |

(Continued)

FOREIGN PATENT DOCUMENTS

| | | | |
|---|---|---|---|
| KR | 10-1436123 B1 | 11/2014 | |
| KR | 10-1490758 B1 | 2/2015 | |

(Continued)

*Primary Examiner* — Anne M Hines
*Assistant Examiner* — Jose M Diaz
(74) *Attorney, Agent, or Firm* — Womble Bond Dickinson (US) LLP

(57) ABSTRACT

A display device may include: a substrate; and a pixel on the substrate, and including an emission area and a non-emission area. The pixel may include: a light emitting element in the emission area, the light emitting element including a first end and a second end; a first pixel electrode electrically connected to the first end of the light emitting element; a second pixel electrode electrically connected to the second end of the light emitting element; an organic transmission layer covering the first end and the second end of the light emitting element, organic transmission layer including a light diffusion particle; and a color conversion layer on the organic transmission layer, the color conversion layer including a color conversion particle to convert a first color of light emitted from the light emitting element to a second color of light.

19 Claims, 38 Drawing Sheets

(51) Int. Cl.

| | |
|---|---|
| *H01L 25/16* | (2023.01) |
| *H10H 20/01* | (2025.01) |
| *H10H 20/851* | (2025.01) |
| *H10H 20/855* | (2025.01) |
| *H10H 20/857* | (2025.01) |

(52) U.S. Cl.
   CPC ...... *H10H 20/8514* (2025.01); *H10H 20/855* (2025.01); *H10H 20/857* (2025.01); *H10H 20/032* (2025.01); *H10H 20/0361* (2025.01)

(58) Field of Classification Search
   CPC .. H10H 20/0361; H10H 20/034; H10H 20/84; H10H 20/8513; H10H 20/882; H10H 29/142; H01L 25/0753; H01L 25/167; H10D 86/021; H10D 86/441
   See application file for complete search history.

(56) References Cited

U.S. PATENT DOCUMENTS

| | | | |
|---|---|---|---|
| 2020/0051959 A1 | 2/2020 | Pschenitzka | |
| 2020/0212267 A1 | 7/2020 | Kwak et al. | |
| 2020/0403029 A1* | 12/2020 | Kim | H01L 25/0753 |
| 2021/0288217 A1 | 9/2021 | Li et al. | |
| 2021/0296537 A1 | 9/2021 | Lee et al. | |
| 2021/0327862 A1 | 10/2021 | Bae et al. | |
| 2022/0115565 A1 | 4/2022 | Kim | |

FOREIGN PATENT DOCUMENTS

| | | |
|---|---|---|
| KR | 10-2020-0010704 A | 1/2020 |
| KR | 10-2020-0079817 A | 7/2020 |
| KR | 10-2020-0145900 A | 12/2020 |
| KR | 10-2021-0116833 A | 9/2021 |
| KR | 10-2021-0129790 A | 10/2021 |
| KR | 10-2022-0033578 A | 3/2022 |
| KR | 10-2022-0047440 A | 4/2022 |

* cited by examiner

PXL(PXA)

ALE1

OP2(NEA)

OP1(EMA)

ALE1

ALE2

PE1

PE2

NEA

BNK

BNKP1

BNKP2

DR2

II

II'

DR1

CNT1     EP1  LD  EP2     CNT2

BNKP: BNKP1, BNKP2
ALE: ALE1, ALE2
PE: PE1, PE2
OP: OP1, OP2

LCP: CCL, CF

OPL: OPLa, OPLb

BNKP: BNKP1, BNKP2

T { DE, GE, ACT, SE

LCP: CCL, CF

OPL: OPLa', OPLb'

T { DE, GE, ACT, SE

LCP: CCL, CF
OPL: OPLa, OPLb $$T \begin{cases} DE \\ GE \\ ACT \\ SE \end{cases}$$

Penetration depth (μm)

Wavelength(nm)

460

| | |
|---|---|
| ——————— | 90% |
| — — — — — | 80% |
| •••••••••••••• | 70% |
| — — — — — | 50% |

Penetration depth (µm)

Wavelength(nm)

460

| | |
|---|---|
| ————————— | 90% |
| — — — — — | 80% |
| •••••••••••••• | 70% |
| —— — —— — —— | 50% |
| — ·— ·— ·— ·— | 40% |

VIA
PSV
ILD
GI
BFL
SUB

PCL

II                                                                II'

BNKP1          BNKP2

NEA          EMA(OP1)          NEA

PXL(PXA)

DISPLAY DEVICE AND METHOD OF FABRICATING THE SAME

CROSS-REFERENCE TO RELATED APPLICATION

The present application claims priority to and the benefit of Korean patent application No. 10-2022-0084029 filed on Jul. 7, 2022, the entire disclosure of which is incorporated by reference herein.

BACKGROUND

1. Field

Various embodiments of the present disclosure relate to a display device and a method of fabricating the display device.

2. Description of Related Art

Recently, as interest in information display increases, research and development on display devices have been continuously conducted.

SUMMARY

Various embodiments of the present disclosure are directed to a display device having improved reliability, and a method of fabricating the display device.

Furthermore, various embodiments of the present disclosure are directed to a display device that may be fabricated through a relatively simple fabrication process using a reduced number of masks so that the production cost can be reduced, and a method of fabricating the display device.

However, aspects and features of embodiments of the present disclosure are not limited to the above-described aspects and features, and various modifications are possible without departing from the spirit and scope of the present disclosure.

One or more embodiments of the present disclosure may provide a display device including: a substrate; and a pixel on the substrate, and including an emission area and a non-emission area. The pixel may include: a light emitting element in the emission area, the light emitting element including a first end and a second end; a first pixel electrode electrically connected to the first end of the light emitting element; a second pixel electrode electrically connected to the second end of the light emitting element; an organic transmission layer covering the first end and the second end of the light emitting element, the organic transmission layer including a light diffusion particle; and a color conversion layer on the organic transmission layer, the color conversion layer including a color conversion particle to convert a first color of light emitted from the light emitting element to a second color of light.

In one or more embodiments, the thickness of the organic transmission layer may be based on a wavelength of light emitted from the light emitting element.

In one or more embodiments, the light diffusion particle of the organic transmission layer may include a light scatterer having dispersibility in an organic solvent.

In one or more embodiments, the light scatterer may include at least one of titanium oxide ($TiO_2$), zirconium oxide ($ZrO_2$), aluminum oxide ($Al_2O_3$), indium oxide ($In_2O_3$), zinc oxide ($ZnO$), or tin oxide ($SnO_2$).

In one or more embodiments, the display device may further include a coating layer between the organic transmission layer and the color conversion layer.

In one or more embodiments, the display device may further include: a pixel circuit layer including a transistor electrically connected to the light emitting element, and a power line; a first bank pattern and a second bank pattern on the pixel circuit layer in the emission area, and spaced from each other; a first alignment electrode on the first bank pattern, and electrically connected to the transistor; a second alignment electrode on the second bank pattern, and electrically connected to the power line; and an insulating layer on the first alignment electrode and the second alignment electrode. The light emitting element may be on the insulating layer, and may be between the first alignment electrode and the second alignment electrode in a plan view.

In one or more embodiments, the display device may further include a first insulating pattern between the insulating layer and the light emitting element.

In one or more embodiments, the display device may further include a second insulating pattern on the light emitting element, where the first end and the second end of the light emitting element are exposed from the second insulating pattern.

In one or more embodiments, the pixel may include a first pixel configured to emit red light and a second pixel configured to emit green light.

In one or more embodiments, the organic transmission layer may include a first organic transmission layer in the first pixel, and a second organic transmission layer in the second pixel. The thickness of the first organic transmission layer may be less than the thickness of the second organic transmission layer.

In one or more embodiments, the color conversion layer may include: a first color conversion layer in the first pixel, and including a red color conversion particle to convert light emitted from the light emitting element of the first pixel to the red light; and a second color conversion layer in the second pixel, and including a green color conversion particle to convert light emitted from the light emitting element of the second pixel to the green light.

In one or more embodiments, the thickness of the organic transmission layer is 1.5 μm or more and less than 2.5 μm.

One or more embodiments of the present disclosure may provide a display device including: a substrate; a pixel on the substrate, and including an emission area and a non-emission area. The pixel may include: a pixel circuit layer including a transistor on the substrate, and a power line; a via layer on the transistor and the power line; a first alignment electrode and a second alignment electrode on the via layer and spaced from each other; a first bank pattern on the first alignment electrode; a second bank pattern on the second alignment electrode; an insulating layer on the first bank pattern and the second bank pattern; a light emitting element on the insulating layer and located between the first alignment electrode and the second alignment electrode, and including a first end and a second end in a longitudinal direction; a first pixel electrode electrically connected to the first end of the light emitting element; a second pixel electrode electrically connected to the second end of the light emitting element; an organic transmission layer covering the first end and the second end of the light emitting element, the organic transmission layer including a light diffusion particle; and a color conversion layer on the organic transmission layer, the color conversion layer including a color conversion particle to convert a first color of light emitted from the light emitting element to a second color of light.

One or more embodiments of the present disclosure may provide a method of fabricating a display device, including forming, on a substrate, a pixel including an emission area and a non-emission area. Forming the pixel may include: forming, on the substrate, a first alignment electrode and a second alignment electrode spaced from each other; forming an insulating layer on the substrate, the first alignment electrode, and the second alignment electrode; forming, on the insulating layer, a first bank defining the emission area and the non-emission area; aligning a light emitting element on the insulating layer between the first alignment electrode and the second alignment electrode using an electric field formed between the first alignment electrode and the second alignment electrode; forming a conductive layer on the light emitting element and the insulating layer; forming an organic transmission layer including a light diffusion particle on the conductive layer; forming a coating layer on the organic transmission layer; removing the organic transmission layer and a portion of the coating layer using a first mask to expose a portion of the conductive layer; removing the exposed portion of the conductive layer, and forming a first pixel electrode electrically connected to a first end of the light emitting element, and a second pixel electrode electrically connected to a second end of the light emitting element; and forming, on the organic transmission layer, a color conversion layer including a color conversion particle to convert a first color of light emitted from the light emitting element to a second color of light.

In one or more embodiments, forming the organic transmission layer may include spraying an organic solvent including the light diffusion particle on the emission area.

In one or more embodiments, forming the organic transmission layer may include patterning the organic transmission layer such that the organic transmission layer overlaps the emission area other than the non-emission area.

In one or more embodiments, forming the organic transmission layer may include applying an organic solvent including the light diffusion particle to the emission area and the non-emission area, and performing a front-side exposure operation. The organic transmission layer may be on the first bank in the emission area.

In one or more embodiments, forming the organic transmission layer may include forming a second bank on the first bank after forming the organic transmission layer.

In one or more embodiments, the thickness of the organic transmission layer may be based on a wavelength of light emitted from the light emitting element.

In one or more embodiments, the light diffusion particle of the organic transmission layer may comprise a light scatterer having dispersibility in an organic solvent.

According to an embodiment of the present invention, deterioration occurring at both ends of the light emitting device can be prevented by disposing an organic transmissive layer including light diffusing particles on the light emitting device.

In addition, when the inkjet method or the entire surface exposure method is used in the process of disposing the organic transmission layer between the light emitting element and the color conversion layer, a separate mask is not required, thereby simplifying the process and reducing costs.

However, effects, aspects, and features of the present disclosure are not limited to the above-described effects, aspects, and features, and various modifications are possible without departing from the spirit and scope of the present disclosure.

BRIEF DESCRIPTION OF THE DRAWINGS

FIGS. 27A to 27D are sectional views illustrating a method of forming the organic transmission layer illustrated in FIG. 6A in accordance with one or more embodiments.

DETAILED DESCRIPTION

Figure 1:
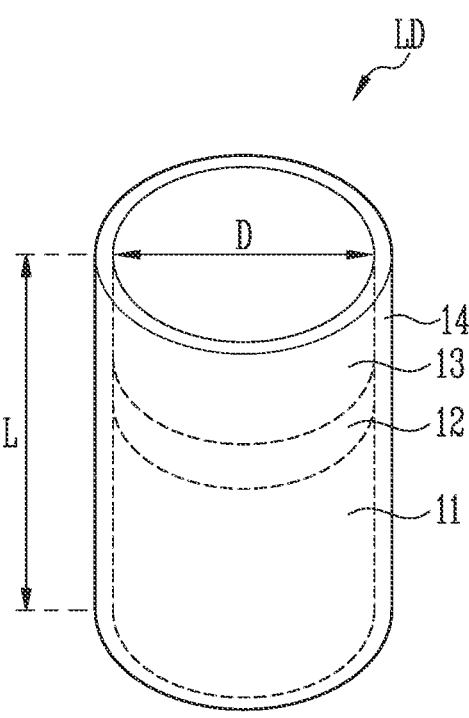
FIG. 1 is a perspective view schematically illustrating a light emitting element in accordance with one or more embodiments of the present disclosure.

Various embodiments of the present disclosure will hereinafter be described in detail with reference to the accompanying drawings. The same reference numerals are used throughout the different drawings to designate the same components, and repetitive description of the same components will be omitted.

Figure 2:
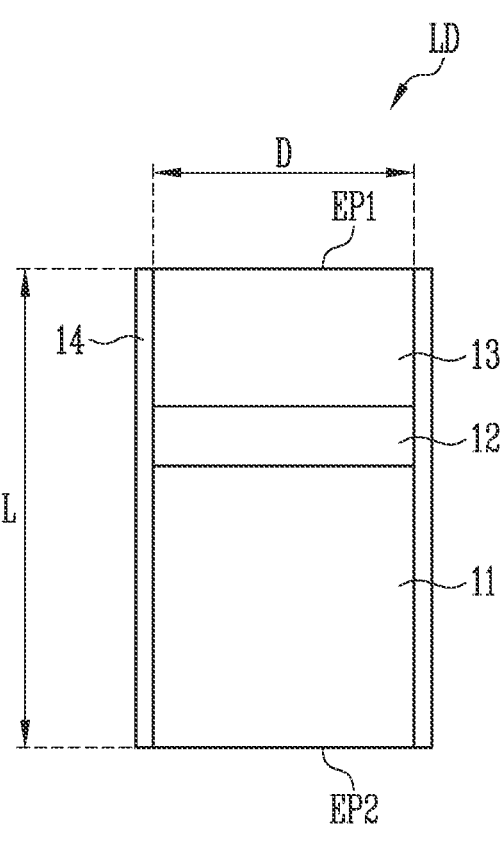
FIG. 2 is a sectional view illustrating the light emitting element of FIG. 1.

FIG. 1 is a perspective view schematically illustrating a light emitting element LD in accordance with one or more embodiments. FIG. 2 is a sectional view illustrating the light emitting element LD of FIG. 1.

In one or more embodiments, the type and/or shape of the light emitting element LD is not limited to the embodiments illustrated in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stack pattern") formed by successively stacking the first semiconductor layer 11, the active layer 12, and the second semiconductor layer 13.

The light emitting element LD may be formed in a shape extending in one direction. If the direction in which the light emitting element LD extends is defined as a longitudinal direction, the light emitting element LD may have a first end EP1 and a second end EP2 with respect to the longitudinal direction. One semiconductor layer of the first semiconductor layer 11 and the second semiconductor layer 13 may be disposed on the first end EP1 of the light emitting element LD, and the other semiconductor layer of the first semiconductor layer 11 and the second semiconductor layer 13 may be disposed on the second end EP2 of the light emitting element LD. For example, the second semiconductor layer 13 may be disposed at the first end EP1 of the light emitting element LD, and the first semiconductor layer 11 may be disposed at the second end EP2 of the light emitting element LD.

The light emitting element LD may be provided in various shapes. For example, as illustrated in FIG. 1, the light emitting element LD may have a rod-like shape, a bar-like shape, or a pillar-like shape that is long with respect to the longitudinal direction (i.e., to have an aspect ratio greater than 1). Alternatively, the light emitting element LD may have a rod-like shape, a bar-like shape, or a pillar-like shape which is short with respect to the longitudinal direction (or has an aspect ratio less than 1). As a further alternative, the light emitting element LD may have a rod-like shape, a bar-like shape, or a pillar-like shape having an aspect ratio of 1.

The light emitting element LD may include a light emitting diode (LED) fabricated to have a subminiature size, e.g., with a diameter D and/or a length L corresponding to a range from the nano scale (or the nanometer scale) to the micro scale (or the micrometer scale).

In case that the light emitting element LD is long (i.e., to have an aspect ratio greater than 1) with respect to the longitudinal direction, the diameter D of the light emitting element LD may approximately range from 0.5 μm to 6 μm, and the length L thereof may approximately range from 1 μm to 10 μm. However, the diameter D and the length L of the light emitting element LD are not limited thereto. The size of the light emitting element LD may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer that includes any one semiconductor material from among InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited to thereto, and various other materials may be used to form the first conductive semiconductor layer 11. The first semiconductor layer 11 may include, with respect to the longitudinal direction of the light emitting element LD, an upper surface that contacts the active layer 12, and a lower surface exposed to the outside. The lower surface of the first semiconductor layer 11 may correspond to one end (or a lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer that are provided as one unit. The stain reinforcing layer may have a lattice constant less than that of the barrier layer so that resistance to strain, e.g., compressive strain, to be applied to the well layer can be further reinforced. However, the structure of the active layer 12 is not limited to that of the foregoing embodiment.

The active layer 12 may emit light having a wavelength approximately ranging from 400 nm to 900 nm, and have a double hetero structure. In one or more embodiments, a clad layer doped with a conductive dopant may be formed over and/or under the active layer 12 with respect to the longitudinal direction of the light emitting element LD. For example, the clad layer may be formed of an AlGaN layer or an InAlGaN layer. In one or more embodiments, a material such as AlGaN or InAlGaN may be used to form the active layer 12, and various other materials may be used to form the active layer 12. The active layer 12 may include a first surface that contacts the first semiconductor layer 11, and a second surface that contacts the second semiconductor layer 13.

If an electric field having a certain voltage or more is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source (e.g., a light emitting source) of various light emitting devices as well as a pixel of a display device.

The second semiconductor layer 13 may be disposed on the second surface of the active layer 12 and include a semiconductor layer of a type different from that of the first semiconductor layer 11. For example, the second semiconductor layer 13 may include at least one p-type semiconductor layer. For instance, the second semiconductor layer 13 may include a p-type semiconductor layer that includes any one semiconductor material from among InAlGaN, GaN, AlGaN, InGaN, AlN, and InN, and is doped with a second conductive dopant (or a p-type dopant) such as Mg, Zn, Ca, Sr, or Ba. However, the material for forming the second semiconductor layer 13 is not limited thereto, and various other materials may be used to form the second semiconductor layer 13. The second semiconductor layer 13 may include, with regard to the longitudinal direction of the light emitting element LD, a lower surface that contacts the second surface of the active layer 12, and an upper surface exposed to the outside. Here, the upper surface of the second semiconductor layer 13 may correspond to a remaining end (or an upper end) of the light emitting element LD.

In one or more embodiments, the first semiconductor layer 11 and the second semiconductor layer 13 may have different thicknesses with respect to the longitudinal direction of the light emitting element LD. For example, the first semiconductor layer 11 may have a thickness greater than that of the second semiconductor layer 13 with respect to the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although the first semiconductor layer 11 and the second semiconductor layer 13 each are formed of a single layer, the present disclosure is not limited thereto. In one or more embodiments, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer that is disposed between semiconductor layers having different lattice structures and thus can function as a buffer layer to reduce a difference in lattice constant. Although the TSBR layer may be formed of a p-type semiconductor layer such as p-GaInP, p-AlInP, or p-AlGaInP, the present disclosure is not limited thereto.

In one or more embodiments, the light emitting element LD may further include a contact electrode (hereinafter referred to as a 'first contact electrode') disposed over the second semiconductor layer 13, as well as including the first semiconductor layer 11, the active layer 12, and the second semiconductor layer 13. Furthermore, in one or more embodiments, the light emitting element LD may further include another contact electrode (hereinafter referred to as a 'second contact electrode') disposed on one end of the first semiconductor layer 11.

Each of the first and second contact electrodes may be an ohmic contact electrode, but the present disclosure is not limited thereto. In one or more embodiments, each of the first and second contact electrodes may be a Schottky contact electrode. The first and second contact electrodes may include a conductive material. For example, the first and second contact electrodes may include an opaque metal such as chrome (Cr), titanium (Ti), aluminum (Al), gold (Au), nickel (Ni), and oxides or alloys thereof, which are used alone or in combination, but the present disclosure is not limited thereto. In one or more embodiments, the first and second contact electrodes may also include transparent conductive oxides such as indium tin oxide (ITO), indium zinc oxide (IZO), zinc oxide (ZnO$_x$), indium gallium zinc oxide (IGZO), and indium tin zinc oxide (ITZO). Here, the zinc oxide (ZnO$_x$) may be zinc oxide (ZnO) and/or zinc peroxide (ZnO$_2$).

Materials included in the first and second contact electrodes may be equal to or different from each other. The first and second contact electrodes may be substantially transparent or translucent. Therefore, light generated from the light emitting element LD may pass through each of the first and second contact electrodes and then may be emitted out of the light emitting element LD. In some embodiments, in case that light generated from the light emitting element LD is emitted out of the light emitting element LD through an area other than the opposite ends of the light emitting element LD rather than passing through the first and second contact electrodes, the first and second contact electrodes may include an opaque metal.

In one or more embodiments, the light emitting element LD may further include an insulating layer 14 (or referred to as "insulating film"). However, in some embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with a conductive material except the first and second semiconductor layers 11 and 13. Furthermore, the insulating layer 14 may reduce or minimize a surface defect of the light emitting element LD, thus enhancing the lifetime and emission efficiency of the light emitting element LD. In case that a plurality of light emitting elements LD are disposed in close contact with each other, the insulating layer 14 may prevent an undesired short-circuit from occurring between the light emitting elements LD. The presence or non-presence of the insulating layer 14 is not limited, so long as the active layer 12 can be prevented from short-circuiting with an external conductive material.

The insulating layer 14 may be provided to enclose an overall outer surface (e.g., an outer peripheral or circumferential surface) of the emission stack including the first semiconductor layer 11, the active layer 12, and the second semiconductor layer 13.

Although in the foregoing embodiment the insulating layer 14 has been described as enclosing the entirety of the respective outer surfaces (e.g., the respective outer peripheral or circumferential surfaces) of the first semiconductor layer 11, the active layer 12, and the second semiconductor layer 13, the present disclosure is not limited thereto. In one or more embodiments, in case that the light emitting element LD includes the first contact electrode, the insulating layer 14 may enclose the entirety of the respective outer surfaces (e.g., the respective outer peripheral or circumferential surfaces) of the first semiconductor layer 11, the active layer 12, the second semiconductor layer 13, and the first contact electrode. In one or more embodiments, the insulating layer 14 may not enclose the entirety of the outer surface (e.g., the outer peripheral or circumferential surface) of the first contact electrode, or may enclose only a portion of the outer surface (e.g., the outer peripheral or circumferential surface) of the first contact electrode without enclosing the other portion of the outer surface (e.g., the outer peripheral or circumferential surface) of the first semiconductor layer 11. Furthermore, in one or more embodiments, in case that the first contact electrode is disposed on one end (or an upper end) of the light emitting element LD and the second contact electrode is disposed on a remaining end (or a lower end) of the light emitting element LD, the insulating layer 14 may allow at least one area of each of the first and second contact electrodes to be exposed.

The insulating layer 14 may include a transparent insulating material. For example, the insulating layer 14 may include one or more insulating materials selected from the group consisting of silicon oxide (SiO$_x$), silicon nitride (SiN$_x$), silicon oxynitride (SiO$_x$N$_y$), aluminum oxide (AlO$_x$), titanium oxide (TiO$_x$), hafnium oxide (HfO$_x$), titanstrontium oxide (SrTiO$_x$), cobalt oxide (Co$_x$O$_y$), magnesium oxide (MgO), zinc oxide (ZnO$_x$), ruthenium Oxide (RuO$_x$), nickel oxide (NiO), tungsten oxide (WO$_x$), tantalum oxide (TaO$_x$), gadolinium oxide (GdO$_x$), zirconium oxide (ZrO$_x$), gallium oxide (GaO$_x$), vanadium oxide (VxO$_y$), ZnO:Al, ZnO:B, InxOy:H, niobium oxide (Nb$_x$O$_y$), magnesium fluoride (MgF$_x$), aluminum fluoride (AlF$_x$), an alucone polymer film, titanium nitride (TiN), tantalum nitride (TaN), aluminum nitride (AlN$_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the present disclosure is not limited thereto, and various materials having insulation may be used as the material of the insulating layer 14.

The insulating layer 14 may have a single-layer structure or a multi-layer structure including a double-layer structure. For example, in case that the insulating layer 14 is formed of a double layer structure including a first insulating layer and a second insulating layer that are successively stacked, the first insulating layer and the second insulating layer may be made of different materials (or different substances) and may be formed through different processes. In one or more embodiments, the first insulating layer and the second insulating layer may include the same material and be formed through a successive process.

In one or more embodiments, the light emitting element LD may be implemented as a light emitting pattern having a core-shell structure. In this case, the first semiconductor layer 11 may be disposed in a core of the light emitting element LD, i.e., a central portion of the light emitting element LD. The active layer 12 may be provided and/or formed to enclose the outer surface (e.g., the outer peripheral or circumferential surface) of the first semiconductor layer 11. The second semiconductor layer 13 may be provided and/or formed to enclose the active layer 12. Furthermore, the light emitting element LD may further include a contact electrode formed to enclose at least one side of the second semiconductor layer 13. In one or more embodiments, the light emitting element LD may further include an insulating layer 14 that is provided on the outer surface (e.g., the outer peripheral or circumferential surface) of the light emitting pattern having a core-shell structure and has a transparent insulating material. The light emitting element LD implemented as the light emitting pattern having the core-shell structure may be manufactured in a growth manner.

The light emitting element LD may be employed as a light emitting source (or a light source) for various display devices. The light emitting element LD may be fabricated through a surface treatment process. For example, the light emitting element LD may be surface-treated so that, when a plurality of light emitting elements LD are mixed with a fluidic solution (or solvent) and then supplied to each pixel area (e.g., an emission area of each pixel or an emission area of each sub-pixel), the light emitting elements LD can be evenly distributed rather than unevenly aggregating in the solution.

A light emitting unit (or a light emitting device) including the light emitting element LD described above may be used not only in a display device but also in various types of electronic devices each of which requires a light source. For instance, in case that a plurality of light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 3:
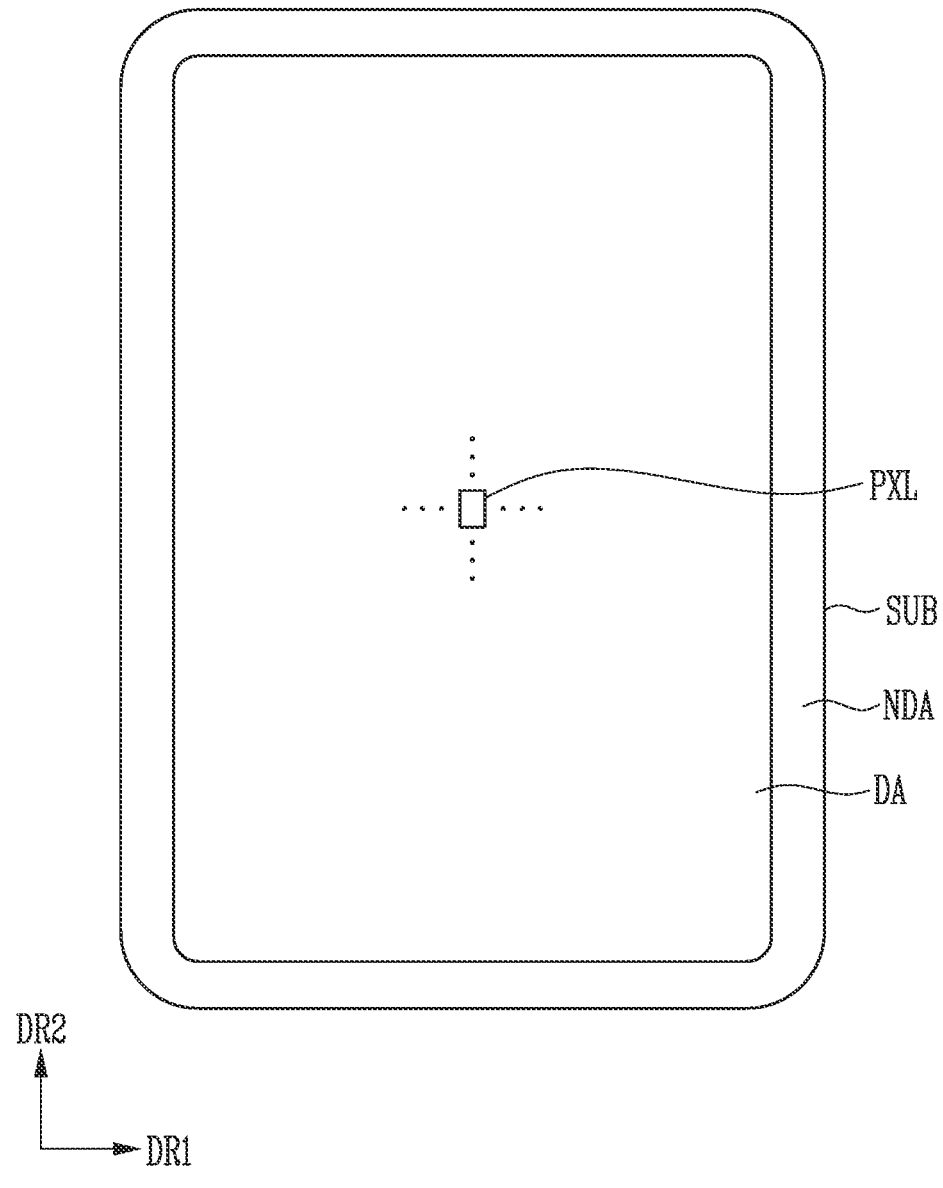
FIG. 3 is a plan view schematically illustrating a display device in accordance with one or more embodiments of the present disclosure.

FIG. 3 is a plan view schematically illustrating a display device in accordance with one or more embodiments of the present disclosure.

For convenience of description, FIG. 3 schematically illustrates the structure of the display device, focused on a display area DA on which an image is displayed.

Referring to FIGS. 1 to 3, the display device may include a substrate SUB, a plurality of pixels PXL provided on the substrate SUB and each including at least one light emitting element LD, a driver provided on the substrate SUB and configured to drive the pixels PXL, and a line component provided to connect the pixels PXL with the driver.

The display device may be classified into a passive matrix type display device and an active matrix type display device according to a method of driving the light emitting element LD. For example, in case that the display device is implemented as an active matrix type, each of the pixels PXL may include a driving transistor configured to control the amount of current to be supplied to the light emitting element LD, and a switching transistor configured to transmit a data signal to the driving transistor.

The display device may be provided in various forms, for example, in the form of a rectangular plate having two pairs of parallel sides, but the present disclosure is not limited thereto. In case that the display device is provided in the form of a rectangular plate, one pair of sides of the two pairs of sides may be longer than the other. For convenience of description, there is illustrated the case where the display device has a rectangular shape with a pair of long sides and a pair of short sides. A direction in which the long sides extend is indicated as a second direction DR2, and a direction in which the short sides extend is indicated as a first direction DR1. In the display device provided in a rectangular planar shape, each corner on which one long side and one short side contact (or meet) each other may have a round shape. However, the present disclosure is not limited thereto.

The substrate SUB may include a display area DA and a non-display area NDA along an edge or periphery of the display area DA.

The display area DA may be an area in which the pixels PXL for displaying an image are provided. The non-display area NDA may be an area in which the driver configured to drive the pixels PXL and a portion of the line component for connecting the pixels PXL to the driver are provided. For the sake of explanation, FIG. 3 illustrates only one pixel PXL, but a plurality of pixels PXL may be substantially provided in the display area DA of the substrate SUB.

The non-display area NDA may be disposed adjacent to the display area DA. The non-display area NDA may be provided on at least one side of the display area DA. For example, the non-display area NDA may enclose the perimeter (or edges) of the display area DA. The line component connected to the pixels PXL, and the driver connected to the line component and configured to drive the pixels PXL may be provided in the non-display area NDA.

The line component may electrically connect the driver with the pixels PXL. The line component may include a fanout line connected with signal lines, e.g., a scan line, a data line, and an emission control line, which are connected to each pixel PXL to provide signals to the pixel PXL. Furthermore, in one or more embodiments, the line component may include a fanout line connected to signal lines, e.g., a control line, and a sensing line, which are connected to each pixel PXL to compensate in real time for variation in electrical characteristics of the pixel PXL. In addition, the line component may include a fanout line connected with power lines which are configured to provide suitable voltages (e.g., predetermined voltages) to the respective pixels PXL and connected to the respective pixels PXL.

The substrate SUB may include a transparent insulating material to allow light transmission. The substrate SUB may be a rigid substrate or a flexible substrate.

One area on the substrate SUB may be provided as the display area DA in which the pixels PXL are disposed, and the other area thereof may be provided as the non-display area NDA. For example, the substrate SUB may include a display area DA including a plurality of pixel areas in which the respective pixels PXL are disposed, and a non-display area NDA disposed around the perimeter of the display area DA (or adjacent to the display area DA).

The pixels PXL may be provided in the display area DA on the substrate SUB. In one or more embodiments, the pixels PXL may be arranged in the display area DA in a stripe or PENTILE® arrangement manner, but the present disclosure is not limited thereto. The PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each of the pixels PXL may include at least one light emitting element LD configured to be driven in response to a corresponding scan signal and a corresponding data signal. The light emitting element LD may have a small size ranging from the nano scale (or the nanometer scale) to the micro scale (the micrometer scale) and may be connected in parallel to light emitting elements LD disposed adjacent thereto, but the present disclosure is not limited thereto. The light emitting element LD may form a light source of each pixel PXL.

Each of the pixels PXL may include at least one light source, e.g., the light emitting element LD illustrated in FIGS. 1 and 2, which is driven by a suitable signal (e.g., a predetermined signal, e.g., a scan signal and a data signal) and/or a suitable power supply (e.g., a predetermined power supply, e.g., a first driving power supply and a second driving power supply). However, in one or more embodiments, the type of the light emitting element LD that may be used as a light source of each pixel PXL is not limited thereto.

The driver may supply a suitable signal (e.g., a predetermined signal) and a suitable power voltage (e.g., a predetermined power voltage) to each of the pixels PXL through the line component and thus control the operation of the pixel PXL.

Figure 4:
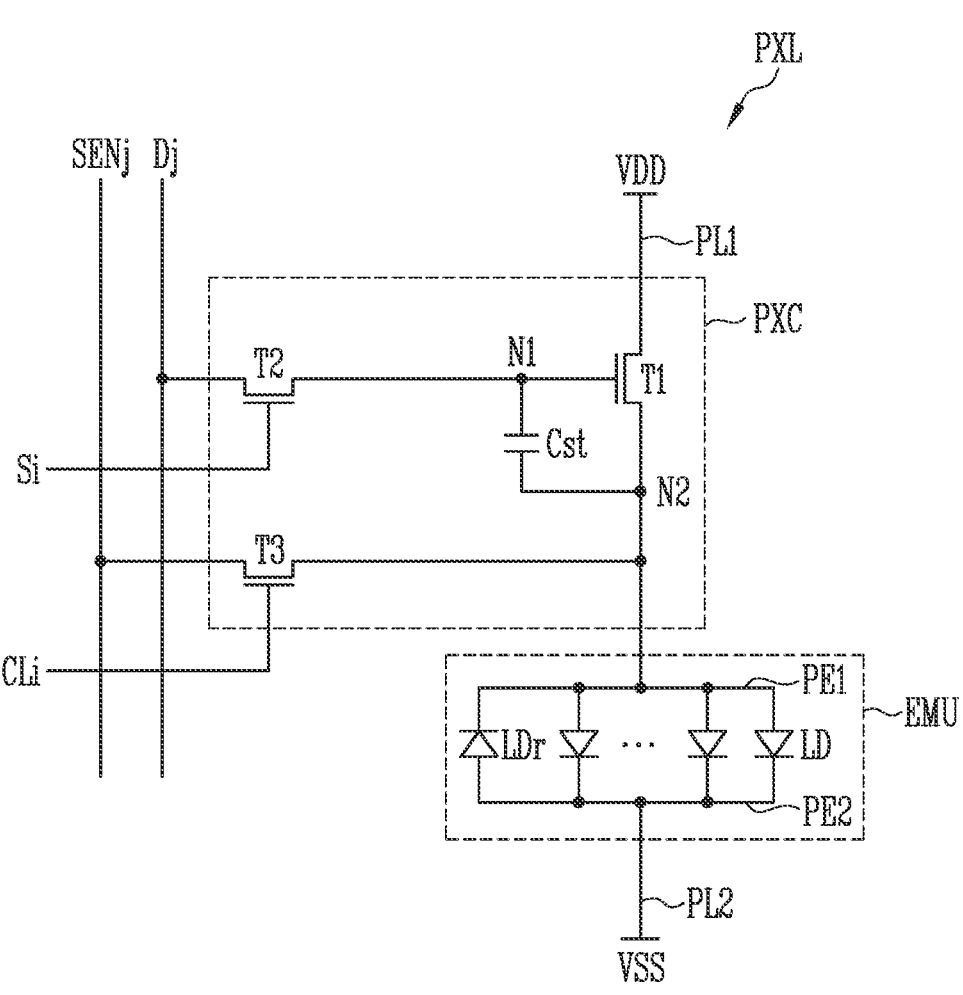
FIG. 4 is a circuit diagram illustrating an electrical connection relationship of components included in a pixel illustrated in FIG. 3.

FIG. 4 is a circuit diagram illustrating an electrical connection relationship of components included in the pixel PXL illustrated in FIG. 3.

For example, FIG. 4 illustrates the electrical connection relationship of components included in the pixel PXL that may be employed in an active matrix type display device. However, the electrical connection relationship between the components included in the pixel PXL that can be applied to embodiments is not limited thereto.

Referring to FIGS. 1 to 4, the pixel PXL may include an emission unit EMU (or an emission layer) configured to generate light having a luminance corresponding to a data signal. Furthermore, the pixel PXL may selectively further include a pixel circuit PXC configured to drive the emission unit EMU.

In one or more embodiments, the emission unit EMU may include a plurality of light emitting elements LD connected in parallel between a first power line PL1 which is connected to a first driving power supply VDD and to which a voltage of the first driving power supply VDD is applied, and a second power line PL2 which is connected to a second driving power supply VSS and to which a voltage of the second driving power supply VSS is applied. For example, the emission unit EMU may include a first pixel electrode PE1 connected to the first driving power supply VDD via the pixel circuit PXC and the first power line PL1, a second pixel electrode PE2 connected to the second driving power supply VSS through the second power line PL2, and a plurality of light emitting elements LD connected in parallel to each other in the same direction between the first and second pixel electrodes PE1 and PE2. In one or more embodiments, the first pixel electrode PE1 may be an anode, and the second pixel electrode PE2 may be a cathode.

Each of the light emitting elements LD included in the emission unit EMU may include one end connected to the first driving power supply VDD by the first pixel electrode PE1, and a remaining end connected to the second driving power supply VSS by the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are connected in parallel to each other in the same direction (e.g., in a forward direction) between the first pixel electrode PE1 and the second pixel electrode PE2 to which the voltages of the different power supplies are supplied may form respective valid light sources.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided into parts which flow into the respective light emitting elements LD. Hence, each of the light emitting elements LD may emit light having a luminance corresponding to current applied thereto, so that the emission unit EMU may emit light having a luminance corresponding to the driving current.

Although there has been described the embodiment in which the opposite ends of the light emitting elements LD are connected in the same direction between the first and second driving power supplies VDD and VSS, the present disclosure is not limited thereto. In one or more embodiments, the emission unit EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be connected in parallel to each other between the first and second pixel electrodes PE1 and PE1. Here, the reverse light emitting element LDr may be connected between the first and second pixel electrodes PE1 and PE2 in a direction opposite to that of the light emitting elements LD. Even if a certain driving voltage (e.g., a forward driving voltage) is applied between the first and second pixel electrodes PE1 and PE2, the reverse light emitting element LDr remains disabled. Hence, current substantially does not flow through the reverse light emitting element LDr.

The pixel circuit PXC may be connected to a scan line Si and a data line Dj of the pixel PXL. The pixel circuit PXC may be connected to a control line CLi and a sensing line SENj of the pixel PXL. For example, in case that the pixel PXL is disposed on an i-th row and a j-th column of the display area DA, the pixel circuit PXC of the pixel PXL may be connected to an i-th scan line Si, a j-th data line Dj, an i-th control line CLi, and a j-th sensing line SENj of the display area DA.

The pixel circuit PXC may include first to third transistors T1 to T3, and a storage capacitor Cst.

The first transistor T1 may be a driving transistor configured to control driving current to be applied to the emission unit EMU and may be connected between the first driving power supply VDD and the emission unit EMU. In detail, a first terminal of the first transistor T1 may be connected (or coupled) to the first driving power supply VDD through the first power line PL1. A second terminal of the first transistor T1 may be connected to a second node N2. A gate electrode of the first transistor T1 may be connected to a first node N1. The first transistor T1 may control, in response to a voltage applied to the first node N1, the amount of driving current to be applied from the first driving power supply VDD to the emission unit EMU through the second node N2. In one or more embodiments, the first terminal of the first transistor T1 may be a drain electrode, and the second terminal of the first transistor T1 may be a source electrode, and the present disclosure is not limited thereto. In one or more embodiments, the first terminal may be a source electrode, and the second terminal may be a drain electrode.

The second transistor T2 may be a switching transistor that selects a pixel PXL in response to a scan signal and activates the pixel PXL, and may be connected between the data line Dj and the first node N1. A first terminal of the second transistor T2 may be connected to the data line Dj. A second terminal of the second transistor T2 may be connected to the first node N1. A gate electrode of the second transistor T2 may be connected to the scan line Si. The first terminal and the second terminal of the second transistor T2 are different terminals, and, for example, if the first terminal is a drain electrode, and the second terminal may be a source electrode.

When a scan signal having a gate-on voltage (e.g., a high level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are connected to each other. The second transistor T2 may transmit a data signal to the gate electrode of the first transistor T1.

The third transistor T3 may obtain a sensing signal through the sensing line SENj by connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL can be compensated for. A second terminal of the third transistor T3 may be connected to the second terminal of the first transistor T1. A first terminal of the third transistor T3 may be connected to the sensing line SENj. A gate electrode of the third transistor T3 may be connected to the control line CLi. Furthermore, in one or more embodiments, the first terminal of the third transistor T3 may be connected to an initialization power supply. In one or more embodiments, the third transistor T3 may be an initialization transistor configured to initialize the second node N2, and may be turned on when a sensing control signal is supplied thereto from the control line CLi, so that the voltage of the initialization power supply can be transmitted to the second node N2. Hence, a second storage electrode of the storage capacitor Cst connected to the second node N2 may be initialized.

A first storage electrode of the storage capacitor Cst may be connected to the first node N1. The second storage electrode of the storage capacitor Cst may be connected to the second node N2. The storage capacitor Cst may be charged with a data voltage corresponding to a data signal to be supplied to the first node N1 during one frame period. Hence, the storage capacitor Cst may store a voltage corresponding to a difference between a voltage of the gate electrode of the first transistor T1 and a voltage of the second node N2.

Although FIG. 4 illustrates an embodiment in which all of the light emitting elements LD that form the emission unit EMU are connected in parallel to each other, the present disclosure is not limited thereto. In one or more embodiments, the emission unit EMU may include at least one serial set (or stage) including a plurality of light emitting elements LD connected in parallel to each other. In other words, the emission unit EMU may be formed of a series/parallel combination structure.

Figure 5:
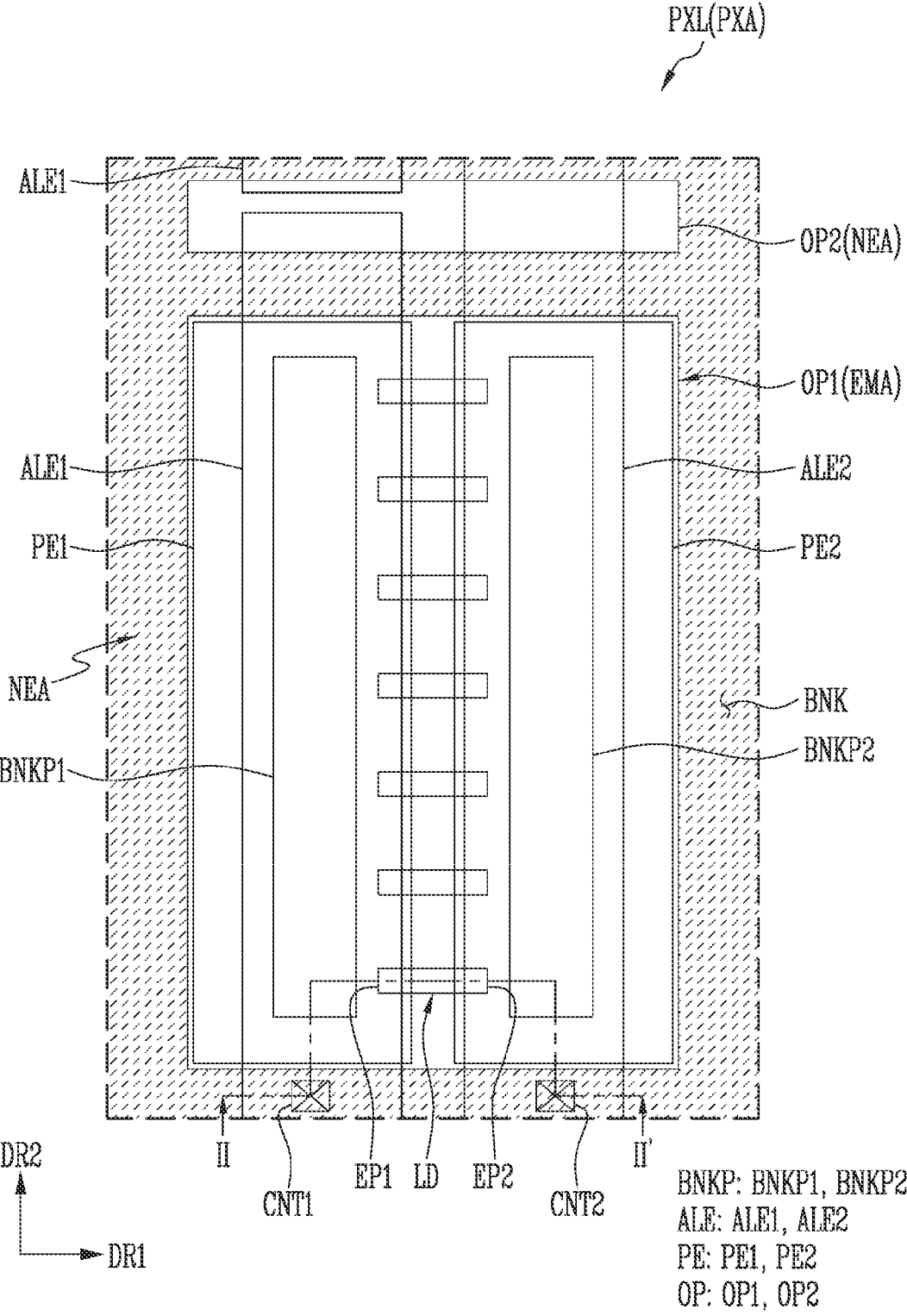
FIG. 5 is a plan view schematically illustrating each pixel illustrated in FIG. 3.

FIG. 5 is a plan view schematically illustrating each pixel PXL illustrated in FIG. 3.

In FIG. 5, for convenience of description, illustration of the transistors electrically connected to the light emitting elements LD and the signal lines electrically connected to the transistors T is omitted.

In FIG. 5, for the sake of explanation, a transverse direction (or a horizontal direction) in a plan view is indicated as the first direction DR1, and a longitudinal direction (or a vertical direction) in a plan view is indicated as the second direction DR2.

Referring to FIGS. 1 to 5, the pixel PXL may be disposed in a pixel area PXA provided (or defined) on the substrate SUB. The pixel area PXA may include an emission area EMA and a non-emission area NEA.

In one or more embodiments, the pixel PXL may include a bank BNK disposed in the non-emission area NEA, and light emitting elements LD disposed in the emission area EMA.

In one or more embodiments, the bank BNK may be a structure for defining (or partitioning) the respective pixel areas PXA (or the respective emission areas EMA) of the pixel PXL and pixels PXL adjacent thereto and, for example, may be a pixel defining layer.

In one or more embodiments, the bank BNK may be a pixel defining layer or a dam structure for defining each emission area EMA to which the light emitting elements LD are to be supplied, during a process of supplying (or inputting) the light emitting elements LD to the pixel PXL. In one or more embodiments, because the emission area EMA of the pixel PXL is defined by the bank BNK, a mixed solution (e.g., ink) including a target amount and/or type of light emitting elements LD may be supplied (or inputted) to the emission area EMA. Furthermore, during a process of supplying a color conversion layer, the bank BNK may be a pixel defining layer that may ultimately define each emission area EMA to which the color conversion layer is to be supplied.

In one or more embodiments, the bank BNK may include at least one light blocking material and/or reflective material (or scattering material), thus preventing or reducing a light leakage defect in which light (or rays) leaks between the pixel PXL and the pixels PXL adjacent thereto. In one or more embodiments, the bank BNK may include a transparent material (or a transparent substance). The transparent material may include, for example, polyamide resin, polyimide resin, and the like, but the present disclosure is not limited thereto. In one or more embodiments, in order to enhance the efficiency of light emitted from the pixel PXL, a separate reflective material layer may be provided and/or formed on the bank BNK.

In one or more embodiments, the bank BNK may be surface-treated so that at least one surface thereof has hydrophobicity. For example, the bank BNK may be surface-treated to have hydrophobicity by plasma before the light emitting elements LD are aligned, but the present disclosure is not limited thereto.

In one or more embodiments, the bank BNK may include, in the pixel area PXA, at least one opening OP that exposes components disposed thereunder. For example, the bank BNK may include a first opening OP1 and a second opening OP2 which expose components disposed under the bank BNK in the pixel area PXA. In one or more embodiments, the emission area EMA of the pixel PXL and the first opening OP1 of the bank BNK may correspond to each other.

In one or more embodiments, in the pixel area PXA, the second opening OP2 may be disposed at a position spaced from the first opening OP1, and disposed adjacent to one side of the pixel area PXA, e.g., an upper side of the pixel area PXA. In one or more embodiments, the second opening OP2 may be an electrode separation area where at least one alignment electrode ALE is separated from at least one alignment electrode ALE provided in pixels PXL adjacent thereto in the second direction DR2.

In one or more embodiments, the pixel PXL may include pixel electrodes PE provided in at least the emission area EMA, light emitting elements LD electrically connected to the pixel electrodes PE, and bank patterns BNKP and alignment electrodes ALE that are provided at positions corresponding to the pixel electrodes PE. For example, the pixel PXL may include first and second pixel electrodes PE1 and PE2, light emitting elements LD, first and second alignment electrodes ALE1 and ALE2, and first and second bank patterns BNKP1 and BNKP2, which are provided in at least the emission area EMA. The pixel electrodes PE and/or the alignment electrodes ALE each may be changed in number, shape, size, arrangement structure, etc. in various ways depending on the structure of the pixel PXL (e.g., particularly, the emission unit EMU).

In one or more embodiments, based on one surface of the substrate SUB on which the pixel PXL is provided, the bank patterns BNKP, the alignment electrodes ALE, the light emitting elements LD, and the pixel electrodes PE may be provided in the order listed, but the present disclosure is not limited thereto. In one or more embodiments, the positions and formation sequence of electrode patterns that form the pixel PXL (or the emission unit EMU or the emission layer) may be changed in various ways. Description of a stacked structure of the pixel PXL will be described below with reference to FIGS. 9 to 19.

In one or more embodiments, the bank patterns BNKP may be provided in at least the emission area EMA, and may be spaced from each other with respect to the first direction DR1 in the emission area EMA, and each may extend in the second direction DR2.

In one or more embodiments, each bank pattern BNKP (e.g., referred also to as "wall pattern", "protrusion pattern", or "support pattern") may have a uniform width in the emission area EMA. For example, each of the first and second bank patterns BNKP1 and BNKP2 may have a bar-like shape having a uniform width with respect to an extension direction thereof in the emission area EMA, in a plan view, but the present disclosure is not limited thereto. Each of the first and second bank patterns BNKP1 and BNKP2 may have an irregular width in the extension direction, and may have at least two or more different widths in the extension direction.

In one or more embodiments, the bank patterns BNKP may have the same width or different widths. For example, the first and second bank patterns BNKP1 and BNKP2 may have the same width or different widths with respect to the first direction DR1 in at least the emission area EMA.

In one or more embodiments, each of the first and second bank patterns BNKP1 and BNKP2 may partially overlap at least one alignment electrode ALE in at least the emission area EMA. For example, the first bank pattern BNKP1 may be disposed under the first alignment electrode ALE1 to overlap one area of the first alignment electrode ALE1. The second bank pattern BNKP2 may be disposed under the second alignment electrode ALE2 to overlap one area of the second alignment electrode ALE2. Alternatively, the first bank pattern BNKP1 may be disposed over the first alignment electrode ALE1 to overlap one area of the first alignment electrode ALE1. The second bank pattern BNKP2 may be disposed over the second alignment electrode ALE2 to overlap one area of the second alignment electrode ALE2.

In one or more embodiments, in case that the bank patterns BNKP and/or the alignment electrodes ALE include a reflective material, a reflective wall structure may be formed around the light emitting elements LD. Hence, light emitted from the light emitting elements LD may be oriented in an upward direction of the pixel PXL (e.g., in an image display direction of the display device), so that the light emission efficiency of the pixel PXL may be further improved.

In one or more embodiments, the alignment electrodes ALE may be disposed in at least the emission area EMA, and may be spaced from each other with respect to the first direction DR1 in the emission area EMA, and each may extend in the second direction DR2. Furthermore, the alignment electrodes ALE may be separated, by removing a portion thereof in the second opening OP2 of the bank BNK, from the alignment electrodes ALE of the pixels PXL that are adjacent to each other in the second direction DR2.

In one or more embodiments, the alignment electrodes ALE may include a first alignment electrode ALE1 (or a first alignment line) and a second alignment electrode ALE2 (or a second alignment line) that are arranged at positions spaced from each other with respect to the first direction DR1.

In one or more embodiments, at least one of the first and second alignment electrodes ALE1 and ALE2 may be separated from other electrodes (e.g., an alignment electrode ALE provided in each of pixels PXL adjacent thereto in the second direction DR2) in the second opening OP2 (or the electrode separation area) of the bank BNK after the light emitting elements LD are supplied to and aligned in the pixel area PXA (or the emission area EMA) during a process of fabricating the display device. For example, one end of the first alignment electrode ALE1 may be separated, in the second opening OP2 of the bank BNK, from the first alignment electrode ALE1 of the pixel PXL that is disposed on an upper side of the corresponding pixel PXL in the second direction DR2.

In one or more embodiments, the first alignment electrode ALE1 may be electrically connected with the first transistor T1 described with reference to FIG. 4 through a first contactor CNT1. The second alignment electrode ALE2 may be electrically connected with the second power line PL2 described with reference to FIG. 4 through a second contactor CNT2.

In one or more embodiments, the first contactor CNT1 may be formed by removing a portion of at least one insulating layer disposed between the first alignment electrode ALE1 and the first transistor T1. The second contactor CNT2 may be formed by removing a portion of at least one insulating layer disposed between the second alignment electrode ALE2 and the second power line PL2. The first contactor CNT1 and the second contactor CNT2 may be disposed in the non-emission area NEA and overlap the bank BNK, but the present disclosure is not limited thereto. In one or more embodiments, the first and second contactors CNT1 and CNT2 may be disposed in the second opening OP2 of the bank BNK that is an electrode separation area, and may be disposed in the emission area EMA.

Each of the first alignment electrode ALE1 and the second alignment electrode ALE2 may be supplied with a signal (or an alignment signal) from an alignment pad disposed in the non-display area NDA at the step of aligning the light emitting elements LD. For example, the first alignment electrode ALE1 may be supplied with a first alignment signal (or a first alignment voltage) from a first alignment pad. The second alignment electrode ALE2 may be supplied with a second alignment signal (or a second alignment voltage) from a second alignment pad. The above-mentioned first and second alignment signals may be signals each having a voltage difference and/or a phase difference enabling the light emitting elements LD to be aligned between the first and second alignment electrodes ALE1 and ALE2. At least one of the first and second alignment signals may be an AC signal, but the present disclosure is not limited thereto.

In one or more embodiments, each alignment electrode ALE may have a bar-like shape having a uniform width with respect to the second direction DR2, but the present disclosure is not limited thereto. In one or more embodiments, each alignment electrode ALE may or may not have a bent portion in the non-emission area NEA and/or the second opening OP2 of the bank BNK that is an electrode separation area, and the shape and/or size thereof in areas other than the emission area EMA may be changed in various ways rather than being particularly limited.

In one or more embodiments, at least two or more light emitting elements LD may be aligned and/or provided in the emission area EMA (or the pixel area PXA). In one or more embodiments, the number of light emitting elements LD aligned and/or provided in the emission area EMA (or the pixel area PXA) may be changed in various ways.

In one or more embodiments, the light emitting elements LD may be disposed between the first alignment electrode ALE1 and the second electrode ALE2. Each of the light emitting elements LD may be the light emitting element LD described with reference to FIGS. 1 and 2. Each of the light emitting elements LD may include a first end EP1 (or one end) and a second end EP2 (or a remaining end) that are opposite each other in the extension direction. In one or more embodiments, the second semiconductor layer 13 including a p-type semiconductor layer may be disposed on the first end EP1, and the first semiconductor layer 11 including an n-type semiconductor layer may be disposed on the second end EP2. The light emitting elements LD may be connected in parallel to each other between the first alignment electrode ALE1 and the second electrode ALE2.

In one or more embodiments, the light emitting elements LD may be disposed at positions spaced from each other and aligned in substantially parallel to each other. A distance by which the light emitting elements LD are spaced from each other is not particularly limited. In one or more embodiments, a plurality of light emitting elements LD may be disposed adjacent to each other to form a group, and another plurality of light emitting elements LD may be spaced from each other at regular intervals to form a group. The light emitting elements LD may be aligned in one direction with an uneven density.

In one or more embodiments, each of the light emitting elements LD may emit any one light of color light and/or white light. Each of the light emitting elements LD may be aligned between the first alignment electrode ALE1 and the second alignment electrode ALE2 such that the longitudinal direction thereof is parallel to the first direction DR1. In one or more embodiments, the light emitting elements LD may be aligned between the first alignment electrode ALE1 and the second alignment electrode ALE2 such that at least some of the light emitting elements LD are not completely parallel to the first direction DR1. For example, some light emitting elements LD may be aligned to be inclined with respect to the first direction DR1 between the first alignment electrode ALE1 and the second alignment electrode ALE2. The light emitting elements LD may be provided in a sprayed (or diffused) form in a solution and then supplied (or inputted) to the pixel area PXA (or the emission area EMA).

In one or more embodiments, the light emitting elements LD may be inputted (or supplied) to the pixel area PXA (or the emission area EMA) by an inkjet printing scheme, a slit coating scheme, or other various schemes. For example, the light emitting elements LD may be mixed with a volatile solvent and then inputted (or supplied) to the pixel area PXA by an inkjet printing scheme or a slit coating scheme. Here, if the first alignment electrode ALE1 and the second alignment electrode ALE2 are respectively supplied with corresponding alignment signals, an electric field may be formed between the first alignment electrode ALE1 and the second alignment electrode ALE2. Consequently, the light emitting elements LD may be aligned between the first alignment electrode ALE1 and the second alignment electrode ALE2. After the light emitting elements LD are aligned, the solvent may be removed by a volatilization scheme or other schemes. In this way, the light emitting elements LD may be reliably aligned between the first alignment electrode ALE1 and the second alignment electrode ALE2.

In one or more embodiments, each of the light emitting elements LD may be a light emitting diode that is made of a material having an inorganic crystal structure and has a subminiature size, e.g., ranging from the nanoscale (or the nanometer scale) to the microscale (or the micrometer scale). For example, each of the light emitting elements LD may be the light emitting element LD described with reference to FIGS. 1 and 2.

In one or more embodiments, the pixel electrodes PE (or the electrodes) may be provided in at least the emission area EMA, and each may be provided at a position corresponding to at least one alignment electrode ALE and the light emitting elements LD. For example, each of the pixel electrode PE may be formed on the corresponding alignment electrode ALE and the corresponding light emitting elements LD to overlap the corresponding alignment electrode ALE and the corresponding light emitting elements LD, and thus electrically connected to at least the light emitting elements LD.

In one or more embodiments, the first pixel electrode PE1 (referred also to as "first electrode" or "anode") may be formed on the first alignment electrode ALE1 and the respective first ends EP1 of the light emitting elements LD, and thus electrically connected to the respective first ends EP1 of the light emitting elements LD. Furthermore, the first pixel electrode PE1 may directly contact, in at least the emission area EMA, the first alignment electrode ALE1 that is exposed by removing a portion of at least one insulating layer disposed between the first pixel electrode PE1 and the first alignment electrode ALE1, and may be electrically and/or physically connected with the first alignment electrode ALE1. Although a connection point (or a contact point) between the first pixel electrode PE1 and the first alignment electrode ALE1 is located in the emission area EMA, the present disclosure is not limited thereto. In one or more embodiments, the connection point (or the contact point) between the first pixel electrode PE1 and the first alignment electrode ALE1 may be located in the non-emission area NEA, e.g., the second opening OP2 of the bank BNK that is an electrode separation area.

The first pixel electrode PE1 may have a bar-like shape extending in the second direction DR2, but the present disclosure is not limited thereto. In one or more embodiments, the shape of the first pixel electrode PE1 may be changed in various ways so long as the first pixel electrode PE1 can be electrically and/or physically reliably connected with the first ends EP1 of the light emitting elements LD. Furthermore, the shape of the first pixel electrode PE1 may be changed in various ways, taking into account the connection relationship with the first alignment electrode AEL1 disposed thereunder.

In one or more embodiments, the second pixel electrode PE2 (referred also to as "second electrode" or "cathode") may be formed on the second alignment electrode ALE2 and the respective second ends EP2 of the light emitting elements LD, and thus electrically connected to the respective second ends EP2 of the light emitting elements LD. Furthermore, the second pixel electrode PE2 may directly contact, in the emission area EMA, the second alignment electrode ALE2 that is exposed by removing a portion of at least one insulating layer disposed between the second pixel electrode PE2 and the second alignment electrode ALE2, and may be electrically and/or physically connected with the second alignment electrode ALE2. A connection point (or a contact point) between the second pixel electrode PE2 and the second alignment electrode ALE2 may be located in the emission area EMA or the non-emission area NEA.

In one or more embodiments, the second pixel electrode PE2 may have a bar-like shape extending in the second direction DR2, but the present disclosure is not limited thereto. In one or more embodiments, the shape of the second pixel electrode PE2 may be changed in various ways so long as the second pixel electrode PE2 can be electrically and physically reliably connected with the second ends EP2 of the light emitting elements LD. Furthermore, the shape of the second pixel electrode PE2 may be changed in various ways, taking into account the connection relationship with the second alignment electrode ALE2 disposed thereunder.

In FIGS. 6A to 25, a height direction (referred also to as "vertical direction" or "thickness direction of the substrate SUB") in a cross-sectional view is represented as a third direction DR3.

Figure 6A:
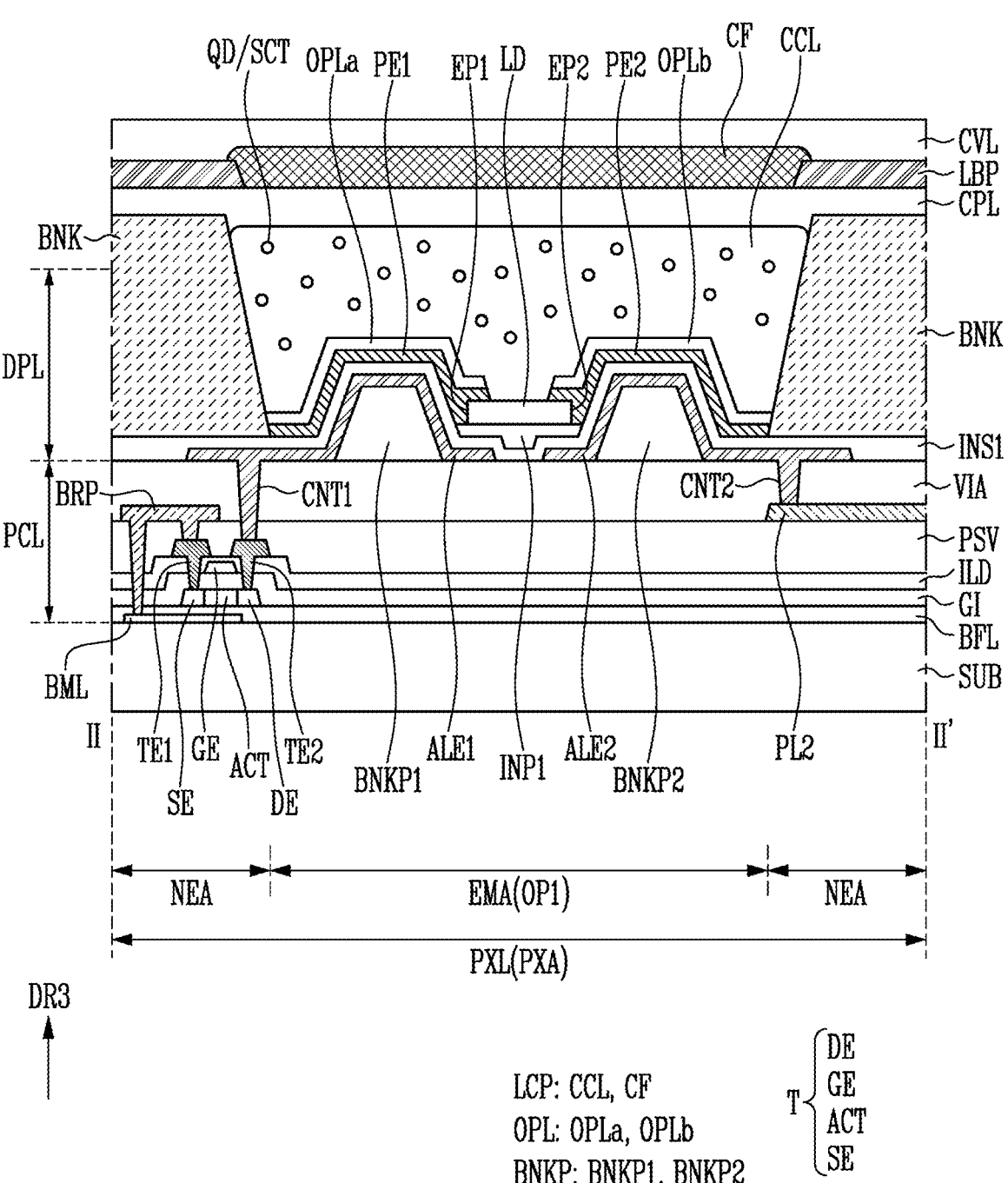
FIG. 6A is a sectional view taken along the line II-II' of FIG. 5 in accordance with one or more embodiments.

FIG. 6A is a sectional view taken along the line II-II' of FIG. 5 in accordance with one or more embodiments. FIGS. 6A to 6D are sectional views taken along the line II-II' of FIG. 5 in accordance with one or more embodiments.

Referring to FIGS. 6A to 6D, the pixel circuit layer PCL and the display element layer DPL may be disposed on one surface of the substrate SUB and overlap each other. For example, the display area DA of the substrate SUB may include the pixel circuit layer PCL disposed on the one surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are separated from each other as separate layers and overlap each other, layout space sufficient to form each of the pixel circuit PXC and the emission unit EMU may be secured.

In one or more embodiments, the substrate SUB may include a transparent insulating material to allow light transmission. The substrate SUB may be a rigid substrate or a flexible substrate. For example, the rigid substrate SUB may be one of a glass substrate, a quartz substrate, a glass ceramic substrate, and a crystalline glass substrate. The flexible substrate SUB may be either a film substrate or a plastic substrate that includes a polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In one or more embodiments, in each pixel area PXA of the pixel circuit layer PCL, circuit elements (e.g., transistors T) for forming the pixel circuit PXC of the corresponding pixel PXL and signal lines electrically connected to the circuit elements may be disposed. Furthermore, in each pixel area PXA of the display element layer DPL, the alignment electrodes ALE, the light emitting elements LD, and/or the pixel electrodes PE that form the emission unit EMU of the corresponding pixel PXL may be disposed.

In one or more embodiments, the pixel circuit layer PCL may include at least one insulating layer as well as including the circuit elements and the signal lines. For example, the pixel circuit layer PCL may include a buffer layer BFL, a gate insulating layer GI, an interlayer insulating layer ILD, a passivation layer PSV, and a via layer VIA that are successively stacked on the substrate SUB in the third direction DR3.

In one or more embodiments, the buffer layer BFL may prevent impurities from diffusing into a transistor T included in the pixel circuit PXC. The buffer layer BFL may be an inorganic layer including an inorganic material. The buffer layer BFL may include at least one of silicon nitride ($SiN_x$), silicon oxide ($SiO_x$), silicon oxynitride ($SiO_xN_y$), or a metal oxide such as aluminum oxide ($AlO_x$). The buffer layer BFL may be provided in the form of a single layer structure, or provided in the form of a multilayer structure having at least two or more layers. In case that the buffer layer BFL is provided in the form of a multilayer structure, the respective layers may be formed of the same material or different materials. The buffer layer BFL may be omitted depending on the material of the substrate SUB or processing conditions.

In one or more embodiments, the pixel circuit PXC may include a transistor T. For the convenience sake, FIG. 6A illustrates one transistor T configured to control driving current of the light emitting element LD. The transistor T may be the first transistor T1 described with reference to FIG. 4.

In one or more embodiments, the transistor T may include a semiconductor pattern and a gate electrode GE that overlaps at least a portion (or one area) of the semiconductor pattern. Here, the semiconductor pattern may include an active pattern ACT, a first contact area SE, and a second contact area DE. The first contact area SE may be a source area, and the second contact area DE may be a drain area.

In one or more embodiments, the gate electrode GE may have a single layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double layer or multilayer structure formed of molybdenum (Mo), titanium (Ti), copper (Cu), aluminum (Al), or silver (Ag) to reduce line resistance.

In one or more embodiments, a gate insulating layer GI may be provided and/or formed on the overall surfaces of the semiconductor pattern and the buffer layer BFL. The gate electrode GE may be disposed on the gate insulating layer GI overlapping the active pattern ACT in the third direction DR3. The gate insulating layer GI may be formed of an inorganic layer including an inorganic material. For example, the gate insulating layer GI may include at least one of silicon nitride ($SiN_x$), silicon oxide ($SiO_x$), silicon oxynitride ($SiO_xN_y$), or a metal oxide such as aluminum oxide ($AlO_x$). However, the material of the gate insulating layer GI is not limited to that of the foregoing embodiments. In one or more embodiments, the gate insulating layer GI may be formed of an organic layer (e.g., an organic insulating layer) including an organic material. The gate insulating layer GI may be provided in the form of a single layer structure, or provided in the form of a multilayer structure having at least two layers.

In one or more embodiments, the active pattern ACT, the first contact area SE, and the second contact area DE each may be a semiconductor pattern formed of poly silicon, amorphous silicon, an oxide semiconductor, etc. The active pattern ACT, the first contact area SE, and the second contact area DE each may be formed of an undoped semiconductor layer or a semiconductor layer doped with an impurity. For example, each of the first contact area SE and the second contact area DE may be formed of a semiconductor layer doped with an impurity. The active pattern ACT may be formed of an undoped semiconductor layer. For example, an n-type impurity may be used as the impurity, but the present disclosure is not limited thereto.

In one or more embodiments, the active pattern ACT may be an area that overlaps the gate electrode GE of the corresponding transistor T in the third direction DR3, and may be a channel area of the transistor T. For example, the active pattern ACT of the transistor T may overlap the gate electrode GE of the transistor T and thus form a channel area of the transistor T.

The first contact area SE of the transistor T may be connected to (or brought into contact with) one end of the active pattern ACT. Furthermore, the first contact area SE of the transistor T may be connected to the bridge pattern BRP by a first connector TE1.

In one or more embodiments, the first connector TE1 may be provided and/or formed on the interlayer insulating layer ILD. One end of the first connector TE1 may be electrically and/or physically connected to the first contact area SE of the first transistor T1 through a contact hole successively passing through the interlayer insulating layer ILD and the gate insulating layer GI. Furthermore, a remaining end of the first connector TE1 may be electrically and/or physically connected to the bridge pattern BRP through a contact hole passing through the passivation layer PSV disposed on the interlayer insulating layer ILD. The first connector TE1 may include the same material as that of the gate electrode GE, or include one or more materials selected from among materials that are provided as example for the constituent material of the gate electrode GE.

In one or more embodiments, the interlayer insulating layer ILD may be provided and/or formed on the overall surfaces of the gate electrode GE and the gate insulating layer GI. The interlayer insulating layer ILD may include the same material as that of the gate insulating layer GI, or may include one or more materials selected from among materials that are provided as example for the constituent material of the gate insulating layer GI.

In one or more embodiments, the bridge pattern BRP may be provided and/or formed on the passivation layer PSV. One end of the bridge pattern BRP may be connected to the first contact area SE of the transistor T by the first connector TE1. Furthermore, a remaining end of the bridge pattern BRP may be electrically and/or physically connected with a bottom conductive layer BML through a contact hole that successively passes through the passivation layer PSV, the interlayer insulating layer ILD, the gate insulating layer GI, and the buffer layer BFL. The bottom conductive pattern BML and the first contact area SE of the transistor T may be electrically connected to each other by the bridge pattern BRP and the first connector TE1.

In one or more embodiments, the bottom conductive layer BML may be a first conductive layer of the conductive layers provided on the substrate SUB. For example, the bottom conductive layer BML may be a first conductive layer disposed between the substrate SUB and the buffer layer BFL. The bottom conductive layer BML may be electrically connected to the transistor T and thus increase a driving range of a certain voltage to be supplied to the gate electrode GE of the transistor T. For example, the bottom conductive layer BML may be electrically connected to the first contact area SE of the transistor T and stabilize the channel area of the transistor T. Furthermore, the bottom conductive layer BML may be electrically connected to the first contact area SE of the transistor T, thus preventing the bottom conductive layer BML from floating.

In one or more embodiments, the second contact area DE of the transistor T may be connected to (or brought into contact with) a remaining end of the active pattern ACT. Furthermore, the second contact area DE of the transistor T may be connected to (or brought into contact with) a second connector TE2.

In one or more embodiments, the second connector TE2 may be provided and/or formed on the interlayer insulating layer ILD. One end of the second connector TE2 may be electrically and/or physically connected to the second contact area DE of the transistor T through a contact hole passing through the interlayer insulating layer ILD and the gate insulating layer GI. A remaining end of the second connector TE2 may be electrically and/or physically connected with the first alignment electrode ALE1 of the display element layer DPL through the first contactor CNT1 that successively passes through a via layer VIA and the passivation layer PSV. In one or more embodiments, the second connector TE2 may be a medium for connecting the transistor T of the pixel circuit layer PCL with the first alignment electrode ALE1 of the display element layer DPL.

The interlayer insulating layer ILD may be provided and/or formed on the transistor T described above.

Although in the foregoing embodiment there has been illustrated the case where the transistor T is a thin-film transistor having a top gate structure, the present disclosure is not limited thereto. The structure of the transistor T may be changed in various ways.

The passivation layer PSV may be provided and/or formed on the transistor T and the first and second connectors TE1 and TE2.

In one or more embodiments, the passivation layer PSV (or referred to as "protective layer") may be provided and/or formed on the overall surfaces of the first and second connectors TE1 and TE2 and the interlayer insulating layer ILD. The passivation layer PSV may be formed of an inorganic layer (or an inorganic insulating layer) including an inorganic material, or an organic layer (or an organic insulating layer) including an organic material.

For example, the inorganic layer may include at least one of silicon oxide ($SiO_x$), silicon nitride ($SiN_x$), silicon oxynitride ($SiO_xN_y$), or a metal oxide such as aluminum oxide ($AlO_x$). The organic layer may include, for example, at least one of polyacrylate resin, epoxy resin, phenolic resin, polyamide resin, polyimide rein, unsaturated polyester resin, poly-phenylen ether resin, poly-phenylene sulfide resin, or benzocyclobutene resin.

In one or more embodiments, the passivation layer PSV may be partially open to include the first contactor CNT1 that exposes one area of the second connector TE2. Furthermore, the passivation layer PSV may be partially open to expose one area of the first connector TE1 and one area of the bottom conductive layer BML.

In one or more embodiments, the pixel circuit layer PCL may include a power line provided and/or formed on the passivation layer PSV. For example, the power line may include the second power line PL2. The second power line PL2 may be provided at the same layer as that of the bridge pattern BRP. A voltage of the second driving power supply VSS may be applied to the second power line PL2. In one or more embodiments, the pixel circuit layer PCL may further include the first power line PL1 described with reference to FIG. 4. The first power line PL1 may be provided at the same layer as that of the second power line PL2 or may be provided at a layer different from that of the second power line PL2. Although in the foregoing embodiment the second power line PL2 has been described as being provided and/or formed on the passivation layer PSV, the present disclosure is not limited thereto. In one or more embodiments, the second power line PL2 may be provided on an insulating layer on which any one conductive layer of the conductive layers provided on the pixel circuit layer PCL is disposed. In other words, the location of the second power line PL2 in the pixel circuit layer PCL may be changed in various ways.

In one or more embodiments, the second power line PL2 may include a conductive material (or conductive substance). For example, the second power line PL2 may have a single layer (or single film) structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double layer (or a double film) structure or a multi-layer (or a multi-film) structure formed of molybdenum (Mo), titanium (Ti), copper (Cu), aluminum (Al), or silver (Ag) which is low resistance material to reduce line resistance. For instance, the second power line PL2 may be formed of a double layer structure (or a double film) structure formed by stacking layers in a sequence of titanium (Ti) and copper (Cu).

In one or more embodiments, the via layer VIA may be provided and/or formed on the bridge pattern BRP and the second power line PL2.

In one or more embodiments, the via layer VIA may be provided and/or formed on the overall surfaces of the bridge pattern BRP, the second power line PL2, and the passivation layer PSV. The via layer VIA may be formed of a single layer including an organic layer, or multiple layers having double or more layers. In one or more embodiments, the via layer VIA may include an inorganic layer and an organic layer disposed on the inorganic layer. In case that the via layer VIA has a multi-layer structure, the organic layer that forms the via layer VIA may be located on the uppermost layer of the via layer VIA. The via layer VIA may include at least one of polyacrylate resin, epoxy resin, phenolic resin, polyamide resin, polyimide rein, unsaturated polyester resin, poly-phenylen ether resin, poly-phenylene sulfide resin, or benzocyclobutene resin.

In one or more embodiments, the via layer VIA may include a first contactor CNT1 that corresponds to the first contactor CNT1 of the passivation layer PSV that exposes the second connector TE2 electrically connected with the transistor T, and a second contactor CNT2 that exposes the second power line PL2. In one or more embodiments, the via layer VIA may be used as a planarization layer that mitigates a step difference caused by the components (e.g., the transistors T, the power lines, the bridge pattern BRP, etc.) disposed under the via layer VIA in the pixel circuit layer PCL.

In one or more embodiments, the display element layer DPL may be provided and/or formed on the via layer VIA.

In one or more embodiments, the display element layer DPL may include the bank patterns BNKP, the alignment electrodes ALE, the bank BNK, the light emitting elements LD, and the pixel electrodes PE. Furthermore, the display element layer DPL may include at least an insulating layer disposed between the foregoing components.

In one or more embodiments, the bank patterns BNKP may protrude in the third direction DR3 on the one surface of the via layer VIA. Hence, one area of each of the alignment electrodes ALE disposed on the bank patterns BNKP may protrude in the third direction DR3 (or the thickness direction of the substrate SUB).

In one or more embodiments, the bank patterns BNKP each may be an inorganic insulating layer including an inorganic material or an organic insulating layer including organic material. In one or more embodiments, each of the bank patterns BNKP may include an organic layer having a single layer structure and/or an inorganic layer having a single layer structure, but the present disclosure is not limited thereto. In one or more embodiments, the bank patterns BNKP may be provided in a multi-layer structure formed by stacking at least one organic insulating layer and at least one inorganic insulating layer. However, the material of the bank patterns BNKP is not limited to the foregoing embodiment. In one or more embodiments, the bank patterns BNKP may include a conductive material (or a conductive substance).

In one or more embodiments, each of the bank patterns BNKP may be used as a reflector. For example, the bank patterns BNKP, along with the alignment electrodes ALE disposed thereover, may be used as reflectors to guide light emitted from each light emitting element LD in a desired direction, so that the light output efficiency of the pixel PXL can be enhanced.

Figure 6B:
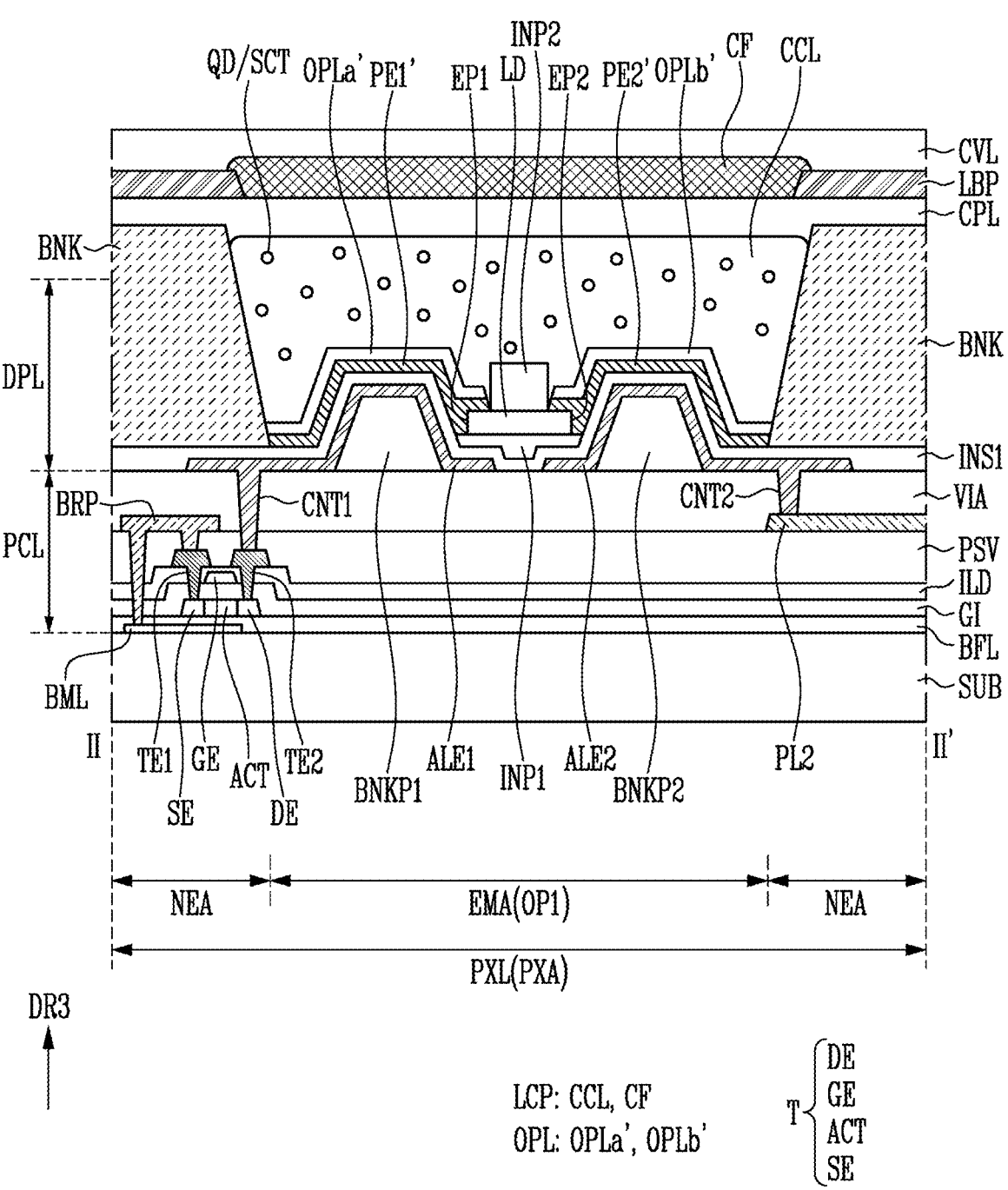
FIGS. 6B to 6D are sectional views taken along the line II-II' of FIG. 5 in accordance with one or more embodiments.
Figure 6C:
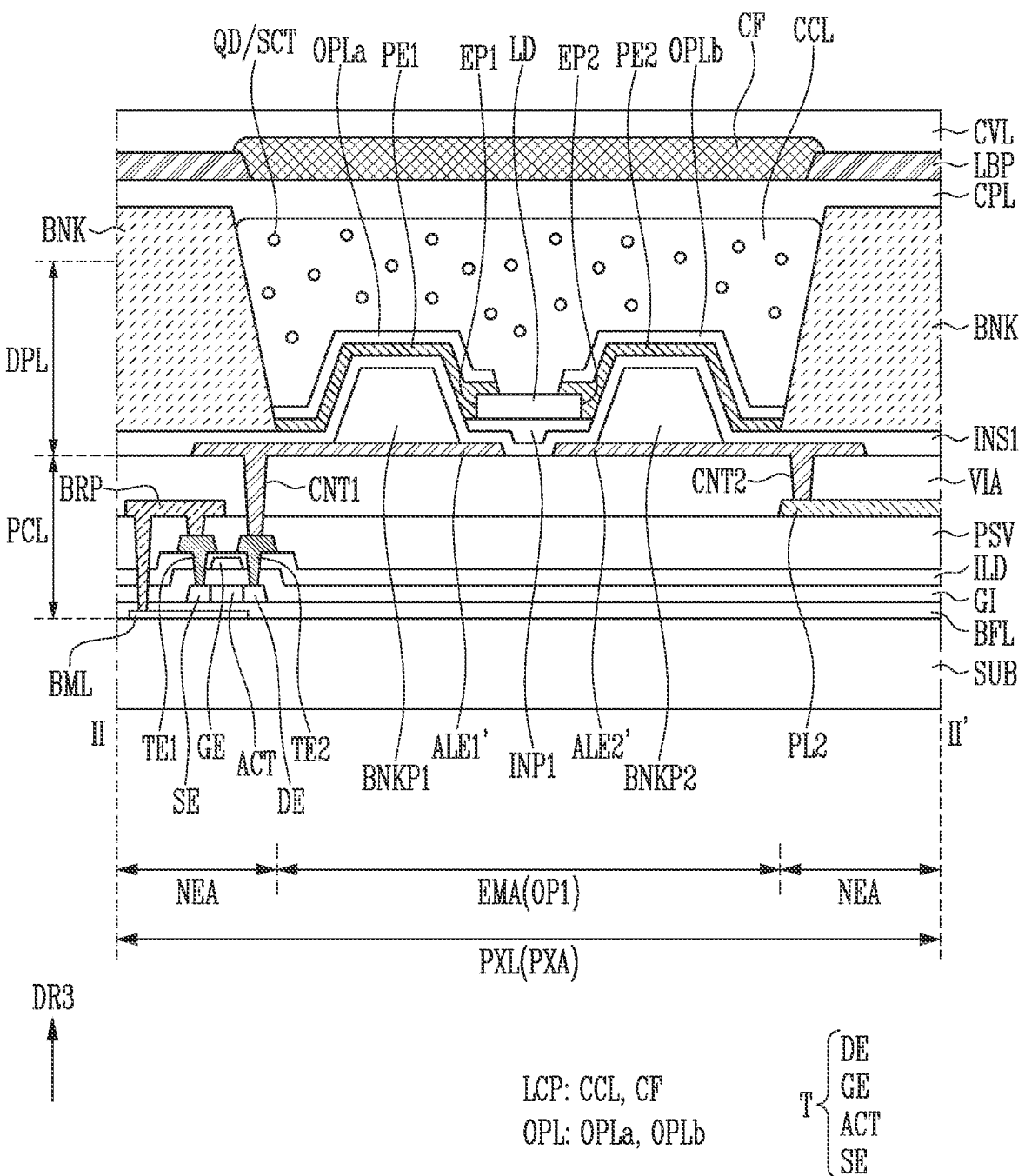
Figure 6D:
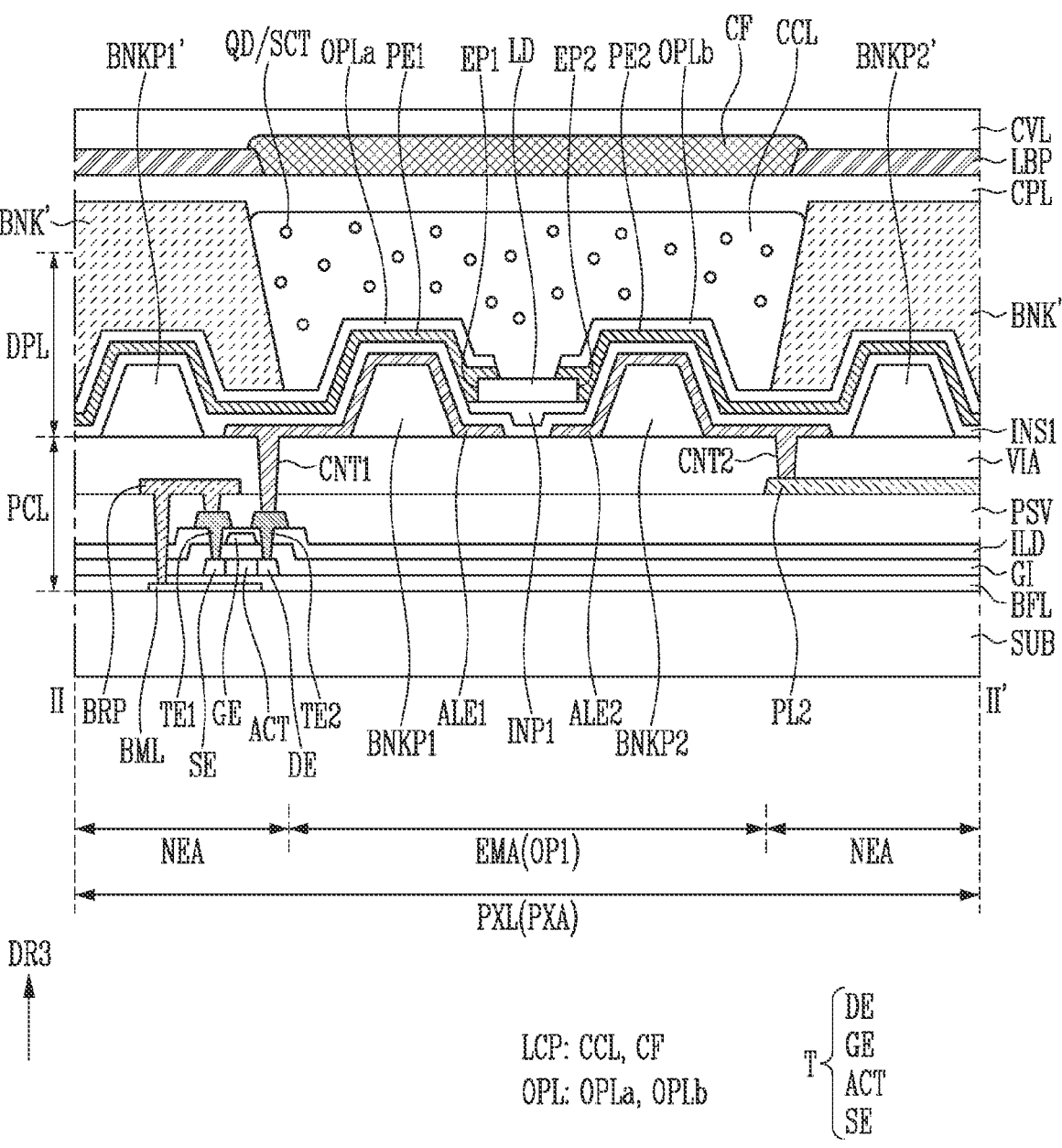

Referring to FIGS. 6A, 6B, and 6D, the first and second alignment electrodes ALE1 and ALE2 may be provided and/or formed on the bank patterns BNKP. In one or more embodiments, the first and second alignment electrodes ALE1 and ALE2 may be disposed on the same plane, and have the same thickness in the third direction DR3. For example, the first alignment electrode ALE1 and the second alignment electrode ALE2 may be provided on the via layer VIA and the corresponding bank patterns BNKP and have the same thickness with respect to the third direction DR3. The first alignment electrode ALE1 and the second alignment electrode ALE2 may be concurrently (e.g., simultaneously) formed through the same process.

In one or more embodiments, the first alignment electrode ALE1 may have a shape corresponding to an inclination of the first bank pattern BNKP1 disposed thereunder. The second alignment electrode ALE2 may have a shape corresponding to an inclination of the second bank pattern BNKP2 disposed thereunder.

In one or more embodiments, the first and second alignment electrodes ALE1 and ALE2 each may be formed of a material having a certain (e.g., substantially uniform or uniform) reflectivity to allow light emitted from the light emitting elements LD to travel in an image display direction of the display device (e.g., the third direction DR3). For example, the first and second alignment electrodes ALE1 and ALE2 each may be formed of a conductive material (or a conductive substance). The conductive material may include an opaque metal which is suitable for reflecting, in the image display direction of the display device (e.g., the third direction DR3), light emitted from the light emitting elements LD. For example, the opaque metal may include a metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. The material of the first and second alignment electrodes ALE1 and ALE2 is not limited to the above-mentioned materials. In one or more embodiments, the first and second alignment electrodes ALE1 and ALE2 may be formed of a transparent conductive material (or a transparent substance). The transparent conductive material (or the transparent conductive substance) may include transparent conductive oxides such as indium tin oxide (ITO), indium zinc oxide (IZO), zinc oxide ($ZnO_x$), indium gallium zinc oxide (IGZO), and indium tin zinc oxide (ITZO), and a conductive polymer such as PEDOT (poly(3,4-ethylenedioxythiophene)). In case that the alignment electrodes ALE include the transparent conductive material (or the transparent conductive substance), a separate conductive layer formed of an opaque metal for reflecting light emitted from the light emitting elements LD in the image display direction of the display device (e.g., the third direction DR3) may be added. However, the material of the alignment electrodes ALE is not limited to the foregoing materials.

In one or more embodiments, the first alignment electrode ALE1 may be electrically connected with the transistor T of the pixel circuit layer PCL through the first contactor CNT1. The second alignment electrode ALE2 may be electrically connected with the second power line PL2 of the pixel circuit layer PCL through the second contactor CNT2.

In one or more embodiments, the first insulating layer INS1 may be provided and/or formed on the first and second alignment electrodes ALE1 and ALE2.

In one or more embodiments, the first insulating layer INS1 may be formed of an inorganic layer formed of an inorganic material, or an organic layer formed of an organic material. The first insulating layer INS1 may be formed of an inorganic layer that is suitable for protecting the light emitting elements LD from the pixel circuit layer PCL. For example, the first insulating layer INS1 may include at least one of silicon nitride ($SiN_x$), silicon oxide ($SiO_x$), silicon oxynitride ($SiO_xN_y$), or a metal oxide such as aluminum oxide ($AlO_x$), but the present disclosure is not limited thereto.

In one or more embodiments, the first insulating layer INS1 may be provided in the form of a single layer or multi-layer structure. In case that the first insulating layer INS1 is provided in the form of a multilayer structure, the first insulating layer INS1 may have a distributed Bragg reflector (DBR) structure formed by alternately stacking first layers and second layers that are formed of inorganic layers and have different refractive indexes.

In one or more embodiments, the bank BNK may be formed on the first insulating layer INS1. In one or more embodiments, the bank BNK may be formed, to enclose the emission area EMA of the pixel PXL, between adjacent pixels PXL, thus forming a pixel defining layer for defining the emission area EMA of the corresponding pixel PXL.

In one or more embodiments, the light emitting elements LD may be supplied to and aligned in the emission area EMA of the pixel PXL in which the first insulating layer INS1 and the bank BNK are formed. For example, the light emitting elements LD may be supplied (or inputted) to the emission area EMA through an inkjet printing scheme or the like. The light emitting elements LD may be aligned between the alignment electrodes ALE by an electric field formed by a certain signal (or an alignment signal) applied to each of the alignment electrodes ALE. For example, the light emitting elements LD may be aligned on the first insulating layer INS1 between the first alignment electrode ALE1 on the first bank pattern BNKP1 and the second alignment electrode ALE2 on the second bank pattern BNKP2.

In one or more embodiments, each of the light emitting elements LD may include an emission stack (or an emission stacked-pattern) including a first semiconductor layer (e.g., the first semiconductor layer 11 of FIG. 1), an active layer (e.g., the active layer 12 of FIG. 1), and a second semiconductor layer (e.g., the second semiconductor layer 13 of FIG. 1) that are successively stacked along one direction perpendicular to the third direction DR3. In one or more embodiments, the second semiconductor layer 13 may be located at the first end EP1 of each light emitting element LD. The first semiconductor layer 11 may be located at the second end EP2 of the corresponding light emitting element LD.

In one or more embodiments, the first and second pixel electrodes PE1 and PE2 may be disposed on opposite sides of the light emitting elements LD in the emission area EMA. The first pixel electrode PE1 may be disposed on the first end EP1 of each of the light emitting elements LD. The first pixel electrode PE1 may be brought into direct contact with and may be electrically connected to the first alignment electrode ALE1 through an opening in the first insulating layer INS1. The second pixel electrode PE2 may be disposed on the second end EP2 of each of the light emitting elements LD. The second pixel electrode PE2 may be brought into direct contact with and may be electrically connected to the second alignment electrode ALE2 through an opening in the first insulating layer INS1.

In one or more embodiments, a first insulating pattern INP1 may be provided and/or formed under the light emitting elements LD. The first insulating pattern INP1 may be disposed on the first insulating layer INS1, and fix the light emitting elements LD disposed between the first and second alignment electrodes ALE1 and ALE2.

In one or more embodiments, the first pixel electrode PE1 and the second pixel electrode PE2 may be disposed on the light emitting elements LD and may be spaced from each other.

In one or more embodiments, the first pixel electrode PE1 and the second pixel electrode PE2 may be formed of various transparent conductive materials to allow light emitted from each of the light emitting elements LD to travel in the image display direction (e.g., in the third direction DR3) of the display device without significant optical loss. For example, the first pixel electrode PE1 and the second pixel electrode PE2 may include at least one of various transparent conductive materials including indium tin oxide (ITO), indium zinc oxide (IZO), zinc oxide ($ZnO_x$), indium gallium zinc oxide (IGZO), or indium tin zinc oxide (ITZO), and may be substantially transparent or translucent to satisfy a desired transmittance (e.g., predetermined transmittance or transmittance). The materials of the first pixel electrode PE1 and the second pixel electrode PE2 are not limited to those of the foregoing embodiments. In one or more embodiments, the first pixel electrode PE1 and the second pixel electrode PE2 may also be formed of various opaque conductive materials (e.g., various opaque conductive substances). The first pixel electrode PE1 and the second pixel electrode PE2 each may be formed of a single layer or multiple layers.

In one or more embodiments, the first pixel electrode PE1 and the second pixel electrode PE2 may be provided and/or formed at the same layer. In one or more embodiments, the first pixel electrode PE1 and the second pixel electrode PE2 may be provided on the same plane, and may be spaced from each other by a certain distance and electrically separated from each other.

In one or more embodiments, an organic transmission layer OPL may be provided and/or formed on the first pixel electrode PE1 and the second pixel electrode PE2.

In one or more embodiments, the organic transmission layer OPL may include a first organic transmission layer OPLa disposed to overlap the first pixel electrode PE1, and a second organic transmission layer OPLb disposed to overlap the second pixel electrode PE2.

In one or more embodiments, the organic transmission layer OPL may be disposed on the first pixel electrode PE1 and the second pixel electrode PE2 and cover the opposite ends of the light emitting elements LD. In one or more embodiments, the first organic transmission layer OPLa may be disposed to cover the first end EP1 of each of the light emitting elements LD. The second organic transmission layer OPLb may be disposed to cover the second end EP2 of each of the light emitting elements LD.

In one or more embodiments, the first and second ends EP1 and EP2 of the light emitting element LD may not be brought into direct contact with a color conversion layer CCL to be described below by the organic transmission layer OPL.

In one or more embodiments, the organic transmission layer OPL may be disposed to cover the first and second ends EP1 and EP2 of each of the light emitting elements LD so that a degradation phenomenon that may be caused in the case in which the color conversion layer CCL including color conversion particles QD directly contacts the first and second ends EP1 and EP2 of each of the light emitting elements LD can be prevented from occurring on the first and second ends EP1 and EP2 of the light emitting element LD.

In one or more embodiments, the organic transmission layer OPL may include nanoscale light scatterers that have dispersibility in an organic solvent. For example, the light scatterers may include at least one of titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$).

In one or more embodiments, the organic transmission layer OPL includes light scatterers so that light emitted from the light emitting elements LD can diffuse at a relatively large angle.

In one or more embodiments, the thickness of the organic transmission layer OPL may be changed depending on the wavelength of light that is emitted from the light emitting elements LD. For example, in the case where blue-based light is emitted from the light emitting elements LD, the thickness of the organic transmission layer OPL may be less than that of the organic transmission layer OPL in the case where green-based light is emitted from the light emitting elements LD.

In one or more embodiments, in the case where the light emitting element LD emits blue-based light, the thickness of the organic transmission layer OPL may be approximately 1.5 μm or more and may be less than approximately 2.5 μm.

In one or more embodiments, the color conversion layer CCL may be provided and/or formed on the organic transmission layer OPL.

In one or more embodiments, the color conversion layer CCL may be disposed on the organic transmission layer OPL in the emission area EMA of the pixel PXL that is enclosed by the bank BNK. In one or more embodiments, the color conversion layer CCL may be directly located on the organic transmission layer OPL, and may directly contact an area of the light emitting element LD other than the first and second ends EP1 and EP2 of the light emitting element LD.

In one or more embodiments, the color conversion layer CCL may include color conversion particles QD corresponding to a specific color. For example, the color conversion layer CCL may include color conversion particles QD that convert a first color of light emitted from the light emitting elements LD to a second color (or a specific color) of light. In case that the pixel PXL is a red pixel, the color conversion layer CCL of the corresponding pixel PXL may include color conversion particles QD formed of red quantum dots that convert a first color of light emitted from the light emitting elements LD to a second color of light, e.g., red light. In case that the pixel PXL is a green pixel (or a green sub-pixel), the color conversion layer CCL of the corresponding pixel PXL may include color conversion particles QD formed of green quantum dots that convert a first color of light emitted from the light emitting elements LD to a second color of light, e.g., green light. In case that the pixel PXL is a blue pixel (or a blue sub-pixel), the color conversion layer CCL of the corresponding pixel PXL may include color conversion particles QD formed of blue quantum dots that convert a first color of light emitted from the light emitting elements LD to a second color of light, e.g., blue light. In one or more embodiments, in case that the pixel PXL is a blue pixel (or a blue sub-pixel), there may be provided a light scattering layer having light scattering particles SCT, in place of the color conversion layer CCL having the color conversion particles QD. For example, in case that the pixel PXL is a blue pixel (or a blue sub-pixel) and the light emitting elements LD emit blue-based light, the pixel PXL may include a light scattering layer including light scattering particles SCT. The light scattering layer may be omitted depending on embodiments. In one or more embodiments, in case that the pixel PXL is a blue pixel (or a blue sub-pixel), there may be provided a transparent polymer, in place of the color conversion layer CCL.

In one or more embodiments, a capping layer CPL may be disposed on the color conversion layer CCL and the bank BNK.

In one or more embodiments, the capping layer CPL may be provided on the overall surface (or the entirety) in the pixel area PXA, and may be directly disposed on the color conversion layer CCL. The capping layer CPL may be an inorganic layer (or an inorganic insulating layer) including an inorganic material. The capping layer CPL may include at least one of silicon nitride ($SiN_x$), silicon oxide ($SiO_x$), silicon oxynitride ($SiO_xN_y$), or a metal oxide such as aluminum oxide ($AlO_x$). The capping layer CPL may be disposed on the color conversion layer CCL and cover the color conversion layer CCL, thus protecting the color conversion layer CCL.

In one or more embodiments, the capping layer CPL may mitigate a step difference formed by components disposed thereunder and have a planar surface. For example, the capping layer CPL may include an organic layer including an organic material. The capping layer CPL may be a common layer provided in common in the display area DA including the pixel area PXA, but the present disclosure is not limited thereto.

In one or more embodiments, a color filter CF and a light blocking pattern LBP may be provided and/or formed on the capping layer CPL. The color filter CF may allow a specific color of light to selectively pass therethrough. The color filter CF along with the color conversion layer CCL may form the light conversion pattern LCP, and may include a color filter material that allows a specific color of light converted by the color conversion layer CCL to selectively pass therethrough. The color filter CF may include a red color filter, a green color filter, and a blue color filter. The color filter CF may be provided on one surface of the capping layer CPL and correspond to the color conversion layer CCL. The light conversion pattern LCP including the color conversion layer CCL and the color filter CF may correspond to the emission area EMA of the pixel PXL.

In one or more embodiments, the light blocking pattern LBP may be disposed on one surface of the capping layer CPL at a position adjacent to the color filter CF. For example, the light blocking pattern LBP may be disposed on one surface of the capping layer CPL and correspond to the non-emission area NEA. The light blocking pattern LBP may correspond to the bank BNK. In one or more embodiments, the light blocking pattern LBP may include a light blocking material for preventing a light leakage defect in which light (or rays) leaks between the pixel PXL and pixels PXL adjacent thereto. For example, the light blocking pattern LBP may include a black matrix. The light blocking pattern LBP may prevent different colors of light emitted from respective adjacent pixels PXL from being mixed.

In one or more embodiments, a cover layer CVL may be provided and/or formed on the light blocking pattern LBP and the color filter CF.

In one or more embodiments, the cover layer CVL may be formed of an inorganic layer (or an inorganic insulating layer) including an inorganic material, or an organic layer (or an organic insulating layer) including an organic material. The cover layer CVL may cover the entirety of components disposed thereunder and prevent water, moisture, or the like from being drawn into the light emitting elements LD and the light conversion pattern LCP from the outside. In one or more embodiments, the cover layer CVL may be an organic layer provided, by an inkjet printing method, on the overall surface in the display area DA including the pixel area PXA.

In the display device in accordance with the foregoing embodiment, the light conversion pattern LCP may be disposed on the light emitting element LD so that light having excellent color reproducibility can be emitted through the light conversion pattern LCP, whereby the light output efficiency of the display device can be enhanced.

FIG. 6B is a sectional view taken along the line II-II' of FIG. 5 in accordance with one or more embodiments.

Referring to FIG. 6B, configurations other than a second insulating pattern INP2 are the same as the configurations illustrated in FIG. 6A; therefore, the same reference numerals will be used to designate identical or corresponding components, and redundant explanation thereof will be omitted.

Referring to FIG. 6B, the second insulating pattern INP2 may be disposed on the light emitting elements LD. The second insulating pattern INP2 may be disposed over the light emitting elements LD that are aligned between first and second pixel electrodes PE1' and PE2', and may be partially disposed over only one area of each of the light emitting elements LD including a central area thereof. The second insulating pattern INP2 may be integrally formed with the first insulating pattern INP1. In one or more embodiments, the second insulating pattern INP2 may be formed as an independent pattern separately from the first insulating pattern INP1.

In one or more embodiments, the first and second pixel electrodes PE1' and PE2' may be disposed at positions that are spaced from each other, based on the second insulating pattern INP2.

In one or more embodiments, first and second organic transmission layers OPLa' and OPLb' may overlap the first and second pixel electrodes PE1' and PE2', and may be disposed at positions that are spaced from each other based on the second insulating pattern INP2 to cover the opposite ends of the light emitting element LD. In one or more embodiments, the first organic transmission layer OPLa' may be formed to cover the first end EP1 of the light emitting element LD. The second organic transmission layer OPLb' may be formed to cover the second end EP2 of the light emitting element LD.

In one or more embodiments, after the alignment of the light emitting elements LD in the pixel PXL has been completed, the second insulating pattern INP2 may be formed on each of the light emitting elements LD, so that the light emitting element LD can be prevented from being removed from the aligned position thereof.

FIG. 6C is a sectional view taken along the line II-II' of FIG. 5 in accordance with one or more embodiments.

Referring to FIG. 6C, configurations other than first and second alignment electrodes ALE1' and ALE2' are the same as the configurations illustrated in FIG. 6A; therefore, the same reference numerals will be used to designate identical or corresponding components, and redundant explanation thereof will be omitted.

Referring to FIG. 6C, the first and second alignment electrodes ALE1' and ALE2' may be disposed on the via layer VIA at positions that are spaced from each other. The first bank pattern BNKP1 may be disposed on the first alignment electrode ALE1'. The second bank pattern BNKP2 may be disposed on the second alignment electrode ALE2'.

In one or more embodiments, the first insulating layer INS1 may be formed along the profiles (or the shapes) of the first and second bank patterns BNKP1 and BNKP2.

FIG. 6D is a sectional view taken along the line II-II' of FIG. 5 in accordance with one or more embodiments.

Referring to FIG. 6D, configurations other than a first bank pattern BNKP1', a second bank pattern BNKP2', and a bank BNK' are the same as the configurations illustrated in FIG. 6A; therefore, the same reference numerals will be used to designate identical or corresponding components, and redundant explanation thereof will be omitted.

Referring to FIG. 6D, the first bank pattern BNKP1', the first bank pattern BNKP1, the second bank pattern BNKP2, and the second bank pattern BNKP2' may be successively arranged along one direction and protrude in the third direction DR3. Hence, one area of the first insulating layer INS1, one area of the first pixel electrode PE1, and one area of the first organic transmission layer OPLa that are disposed on the first bank pattern BNKP1' may protrude in the third direction DR3. One area of the first insulating layer INS1, one area of the second pixel electrode PE2, and one area of the second organic transmission layer OPLb that are disposed on the second bank pattern BNKP2' may protrude in the third direction DR3.

Although FIG. 6D illustrates that the first insulating layer INS1, the first pixel electrode PE1, and the first organic transmission layer OPLa are successively disposed on the first bank pattern BNKP1', the first pixel electrode PE1 may not be disposed over the first bank pattern BNKP1'.

In one or more embodiments, the bank BNK' may be disposed to cover the first bank pattern BNKP1' and the second bank pattern BNKP2'. In one or more embodiments, the bank BNK' may be disposed to overlap the first bank pattern BNKP1' and the second bank pattern BNKP2'.

Figure 7A:
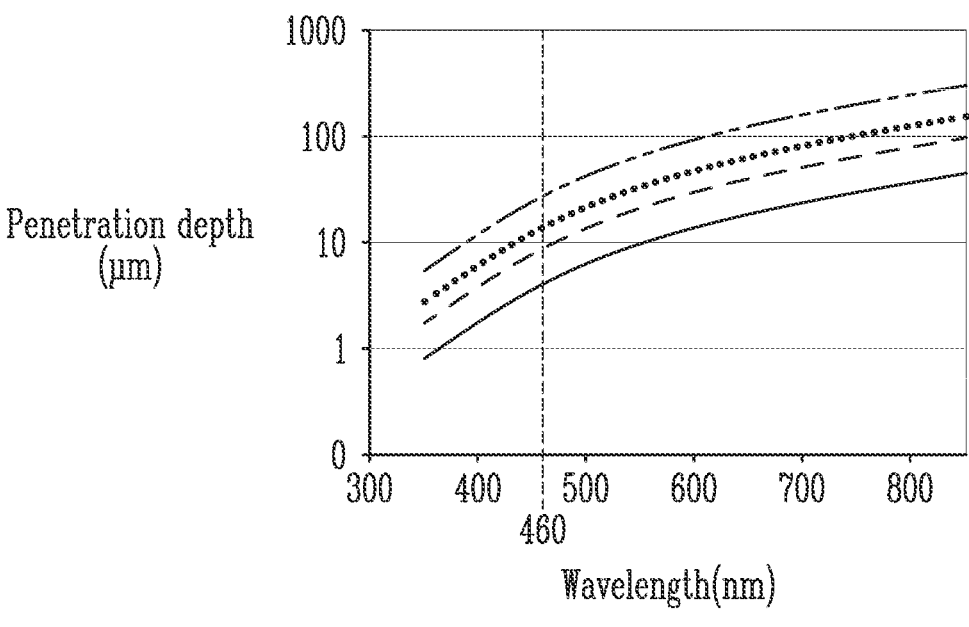
FIG. 7A illustrates a graphical representation of a penetration depth of light that passes through an organic layer.
Figure 7A:
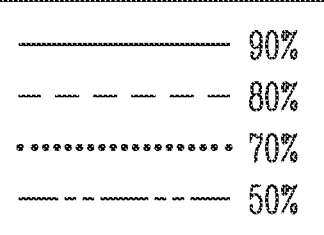
Figure 7B:
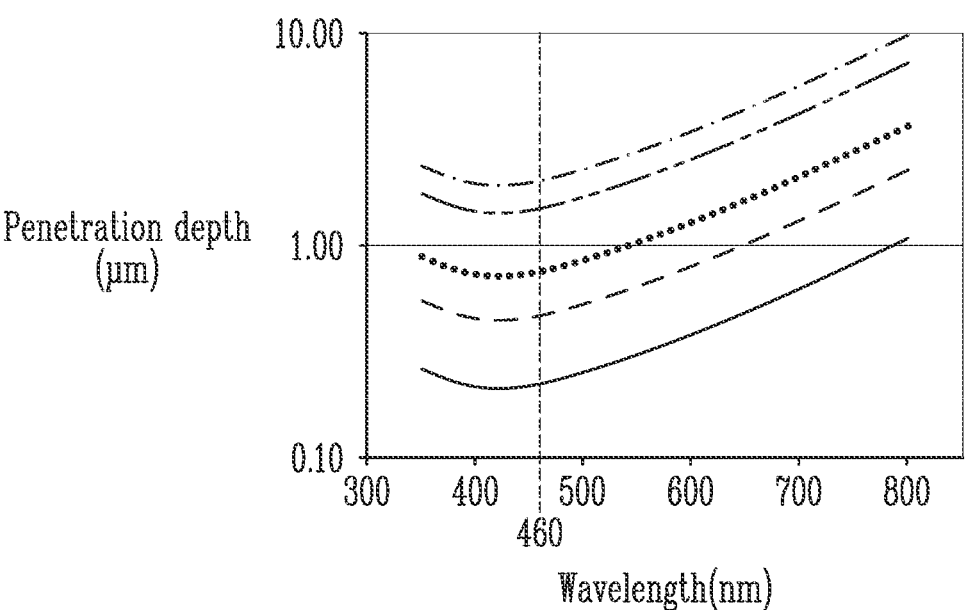
FIG. 7B illustrates a graphical representation of a penetration depth of light that passes through an organic transmission layer illustrated in FIG. 5.
Figure 7B:
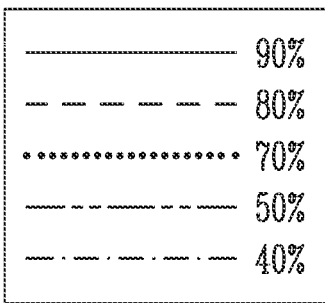

FIG. 7A illustrates a graphical representation of a penetration depth of light that passes through an organic layer. FIG. 7B illustrates a graphical representation of a penetration depth of light that passes through the organic transmission layer OPL illustrated in FIG. 5.

Figure 8A:
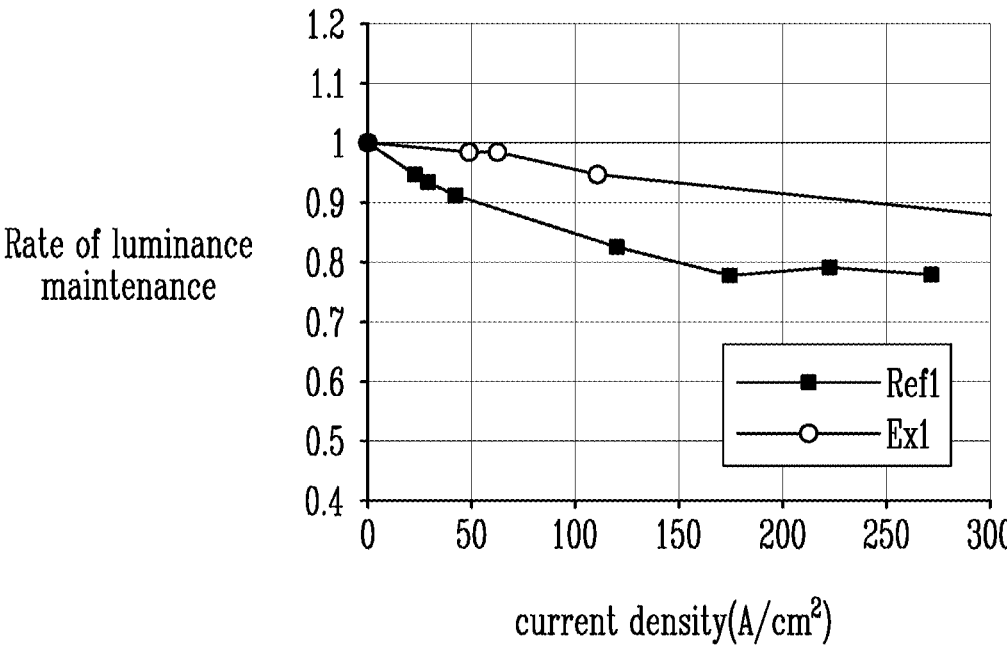
FIG. 8A illustrates a graphical representation of a rate of luminance maintenance according to disposition of the organic transmission layer illustrated in FIG. 5.
Figure 8B:
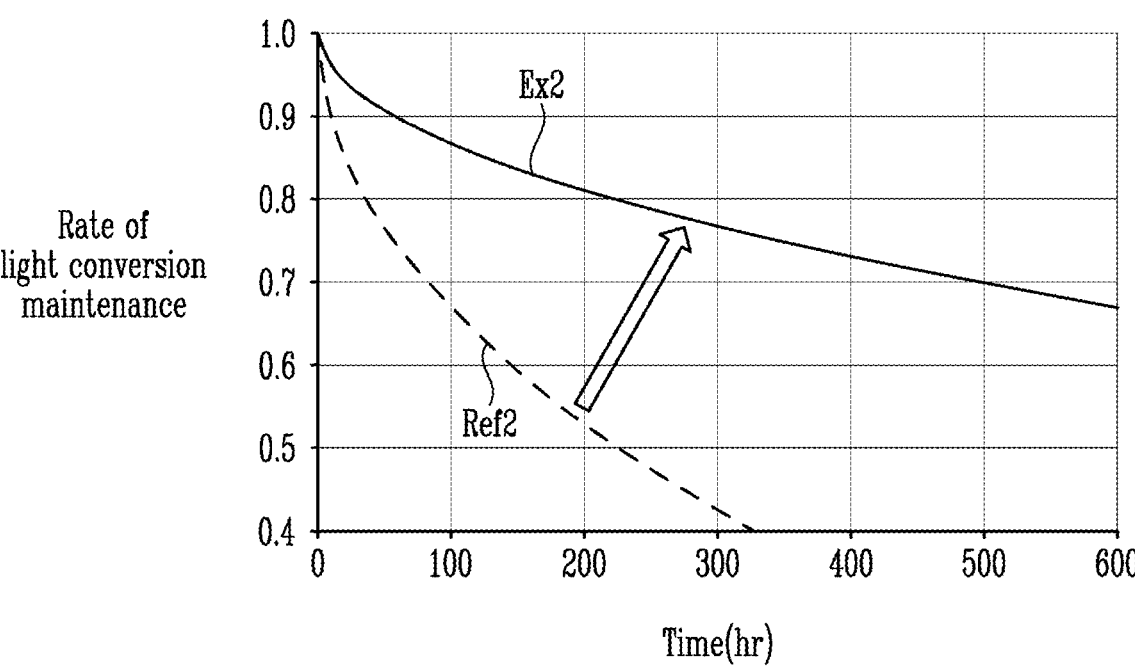
FIG. 8B illustrates a graphical representation of a rate of color conversion maintenance in a color conversion layer according to disposition of the organic transmission layer illustrated in FIG. 5

FIG. 8A illustrates a graphical representation of a rate of luminance maintenance according to disposition of the organic transmission layer OPL illustrated in FIG. 5. FIG. 8B illustrates a graphical representation of a rate of color conversion maintenance in the color conversion layer CCL according to disposition of the organic transmission layer OPL illustrated in FIG. 5.

FIG. 7A illustrates the penetration depth of light emitted from the light emitting element in the case an organic layer having a thickness of approximately 1.5 µm is disposed between the light emitting element LD and the color conversion layer CCL. In one or more embodiments, although the organic layer may include polyacrylate, the present disclosure is not limited thereto. For example, the organic layer may include at least one material from among acrylic resin, epoxy resin, epoxy resin, phenol resin, polyamide resin, polyimide rein, unsaturated polyester resin, polyphenylene resin, polyphenylene sulfide resin, and benzocyclobutene (BCB).

FIG. 7B illustrates the penetration depth of light emitted from the light emitting element (e.g., the light emitting element LD of FIG. 5) in the case the organic transmission layer (e.g., the organic transmission layer OPL of FIG. 5) having a thickness of approximately 1.5 µm is disposed between the light emitting element LD and the color conversion layer (e.g., the color conversion layer CCL of FIG. 5).

Referring to FIGS. 7A and 7B, the light transmissivity of the light emitting element LD in the case where the organic transmission layer OPL is disposed on the light emitting element LD may be less than that in the case where a polyacrylic layer is disposed.

In one or more embodiments, because the organic transmission layer OPL is disposed between the light emitting element LD and the color conversion layer CCL, heat generated by light emitted from the opposite ends of the light emitting element LD can be mitigated or prevented from being transmitted to the color conversion layer CCL.

That is, a degradation phenomenon that may be caused on the opposite ends of the light emitting element LD can be improved (e.g., reduced) in proportion to a reduction in light transmissivity.

FIG. 8A illustrates a rate of luminance maintenance according to disposition of the organic transmission layer OPL illustrated in FIG. 5.

"Ref1" of FIG. 8A indicates a deterioration in luminance of a green pixel in the case in which the color conversion layer directly contacts the light emitting element.

"Ex1" of FIG. 8A indicates a deterioration in luminance of the green pixel in the case where the organic transmission layer OPL having a thickness of approximately 4 µm is disposed on the light emitting element LD.

Referring to FIG. 8A, a luminance reduction rate in the case where the organic transmission layer OPL including light diffusion particles is disposed on the light emitting element LD may be less than that in the case where the color conversion layer directly contact with the light emitting element LD.

In one or more embodiments, because light emitted from the light emitting element LD is diffused by the light diffusion particles included in the organic transmission layer OPL, a reduction in luminance can be substantially mitigated.

FIG. 8B illustrates a rate of color conversion maintenance in the color conversion layer CCL according to disposition of the organic transmission layer OPL illustrated in FIG. 5.

"Ref2" of FIG. 8B indicates a rate of color conversion maintenance in the color conversion layer CCL of the green pixel in the case where the color conversion layer CCL directly contacts the light emitting element LD.

"Ex2" of FIG. 8B indicates a rate of color conversion maintenance in the color conversion layer CCL of the green pixel in the case where the organic transmission layer OPL including light diffusion particles is disposed on the light emitting element LD.

Referring to FIG. 8B, the rate of color conversion maintenance in the color conversion layer CCL in the case where the organic transmission layer OPL including light diffusion particles is disposed on the light emitting element LD may be higher than the rate of color conversion maintenance in the color conversion layer CCL in the case where the color conversion layer CCL directly contacts the light emitting element LD.

In one or more embodiments, because the light emitting element LD and the color conversion layer CCL are spaced from each other by the organic transmission layer OPL, degradation on the opposite ends of the light emitting element LD may be mitigated, so that the rate of light conversion maintenance in the color conversion layer CCL can be comparatively increased.

FIGS. 9 to 19 are sectional views for schematically describing a method of fabricating the display element layer DPL of the pixel PXL in accordance with an embodiment.

Hereinafter, the method of fabricating the display element layer DPL of the pixel PXL according to FIG. 6A will be described with reference to FIGS. 9 to 19.

Herein, there is illustrated the case where the steps of fabricating the pixel PXL are sequentially performed according to the sectional views, but without changing the spirit and scope of the present disclosure, some steps illustrated as being successively performed may be concurrently (e.g., simultaneously) performed, the sequence of the steps may be changed, some steps may be skipped, or another step may be further included between the steps.

The description with reference to FIGS. 9 to 19 will be focused on differences from the above-mentioned embodiments so as to avoid redundant description.

Figure 9:
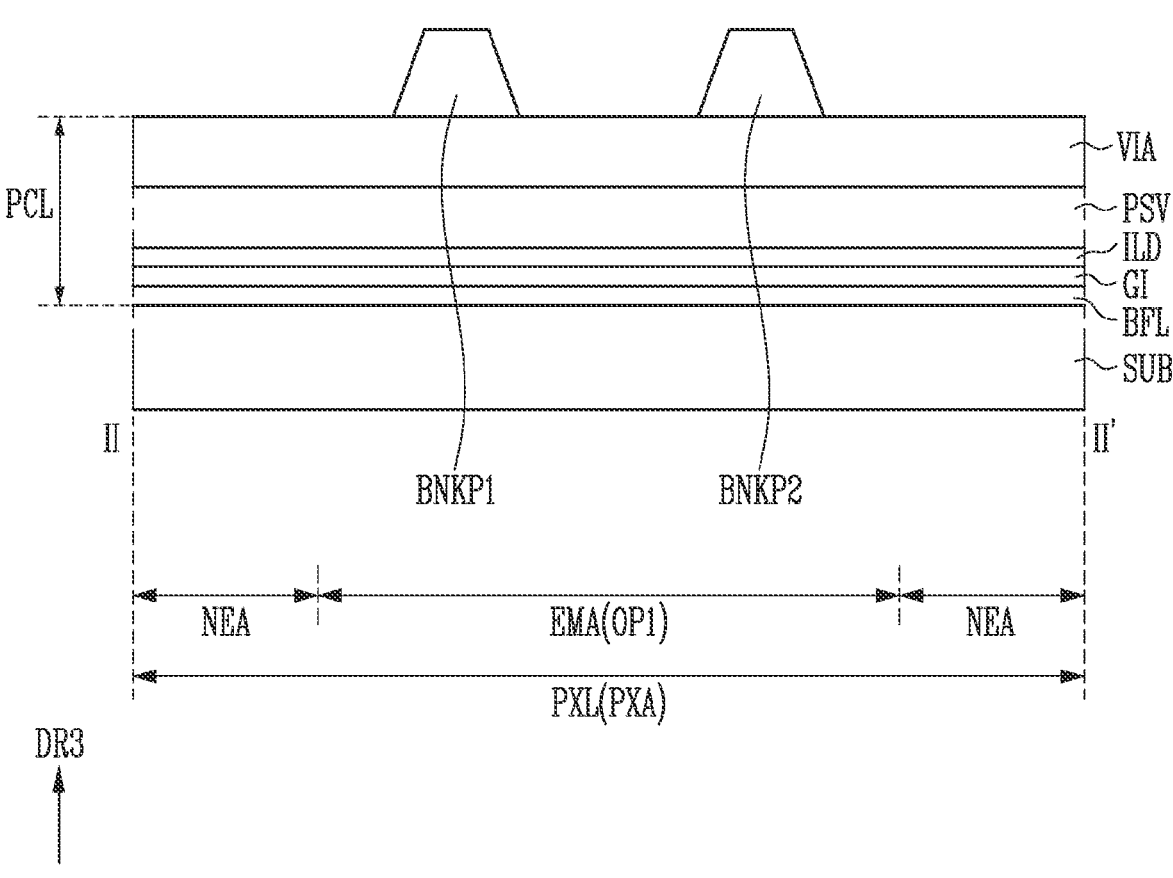
FIGS. 9 to 19 are sectional views for schematically describing a method of fabricating a display element layer of a pixel in accordance with one or more embodiments.

Referring to FIG. 9, the pixel circuit layer PCL is formed on the substrate SUB. The first bank pattern BNKP1 and the second bank pattern BNKP2 that are spaced from each other are formed on the via layer VIA of the pixel circuit layer PCL.

Figure 10:
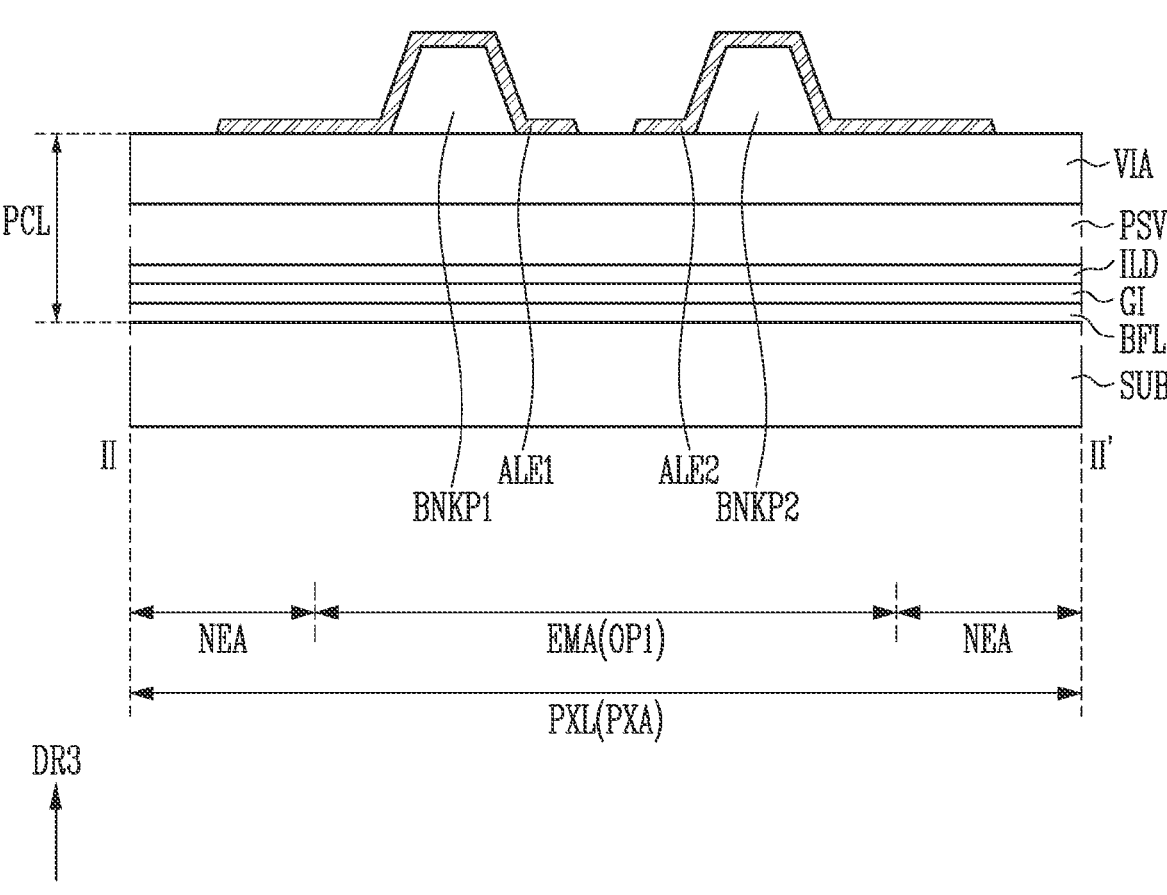

Referring to FIGS. 9 and 10, the first alignment electrode ALE1 is formed on the first bank pattern BNKP1, and the second alignment electrode ALE2 is formed on the second bank pattern BNKP2.

In one or more embodiments, the first alignment electrode ALE1 and the second alignment electrode ALE2 may be formed through the same process and may be provided at the same layer, and may include the same material.

Figure 11:
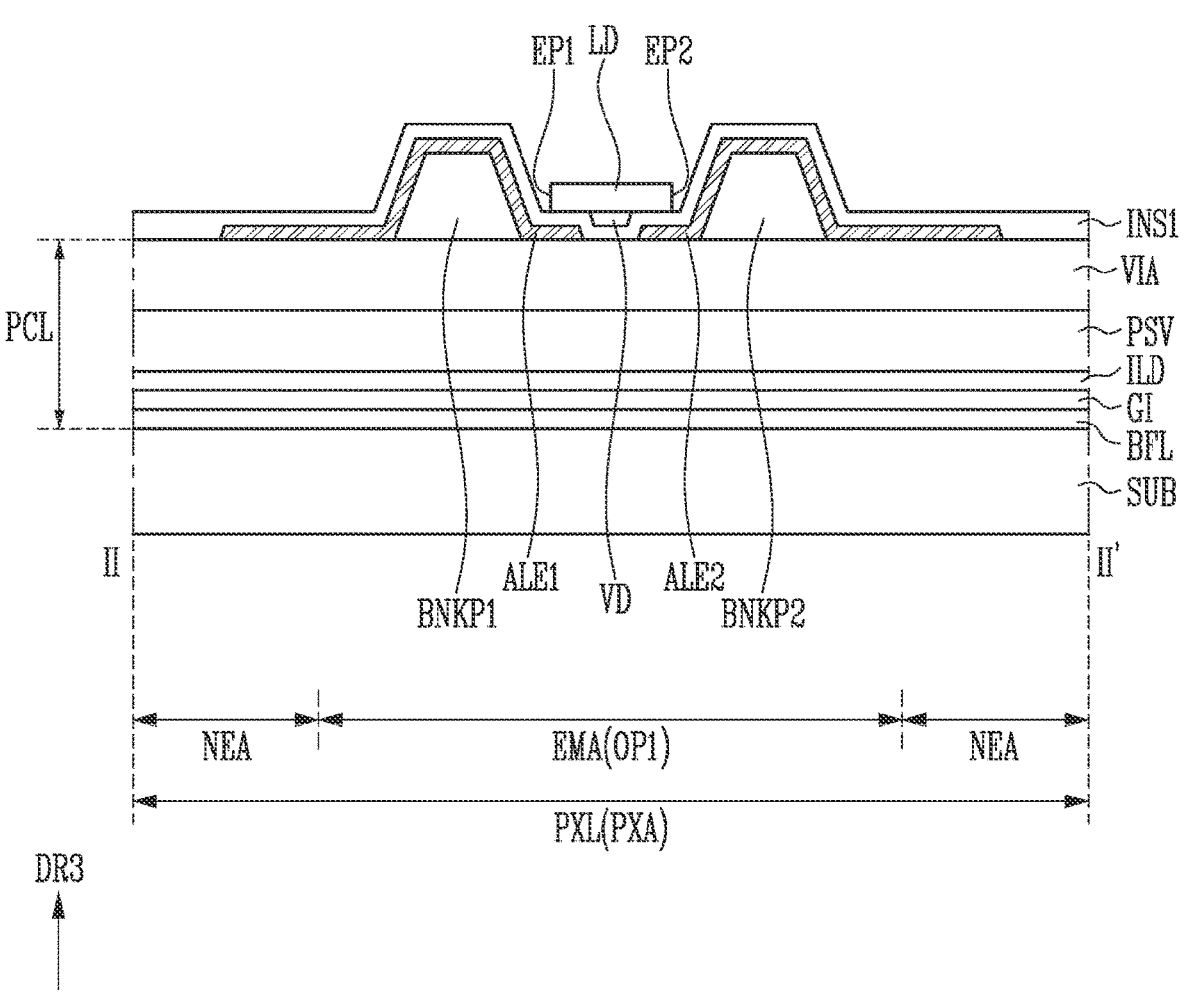

Referring to FIG. 11, the first insulating layer INS1 is formed on the first and second alignment electrodes ALE1 and ALE2 and the via layer VIA.

In one or more embodiments, the first insulating layer INS1 may be partially open to expose one area of the first alignment electrode ALE1 and one area of the second alignment electrode ALE2. The first insulating layer INS1 may be formed of an inorganic layer (or an inorganic insulating layer) including an inorganic material.

In one or more embodiments, in response to an operation of forming the first insulating layer INS1, an electric field is formed between the first alignment electrode ALE1 and the second alignment electrode ALE2 by respectively applying corresponding alignment signals to the first and second alignment electrodes ALE1 and ALE2.

Thereafter, after the electric fields have been formed, ink including light emitting elements LD is inputted to the pixel area PXA of the pixel PXL through an inkjet printing scheme or the like. For example, at least one inkjet nozzle may be disposed on the first insulating layer INS1, and ink mixed with a plurality of light emitting elements LD may be inputted to the pixel area PXA of the pixel PXL through the inkjet nozzle. The scheme of inputting the light emitting elements LD to the pixel area PXA is not limited to that of the foregoing embodiment. The scheme of inputting the light emitting elements LD may be changed in various ways.

In one or more embodiments, in the case in which the light emitting elements LD are inputted to the pixel area PXA, self-alignment of the light emitting elements LD on the first insulating layer INS1 between the first alignment electrode ALE1 and the second alignment electrode ALE2 may be induced.

Figure 12:
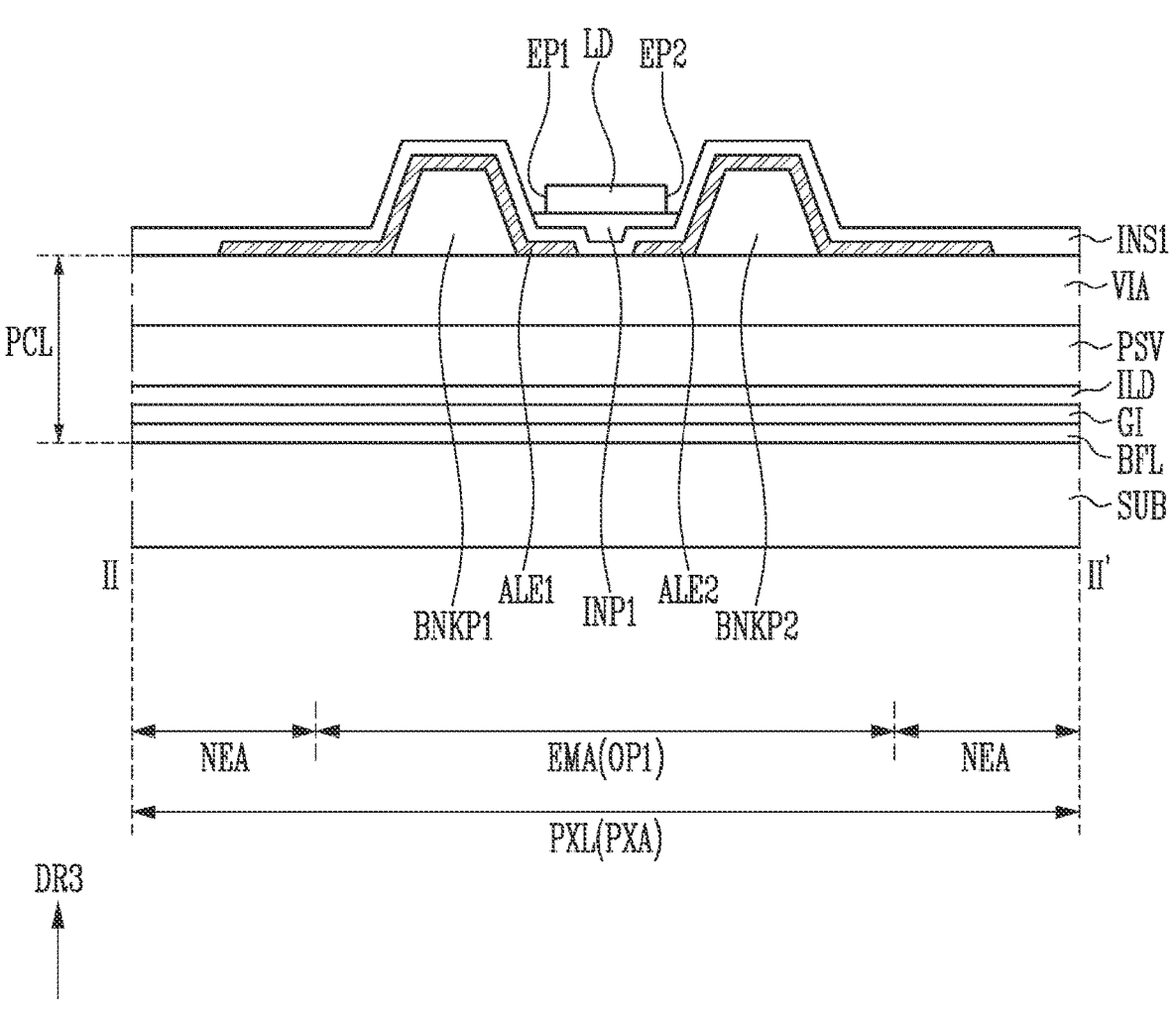

Referring to FIG. 12, an insulating material layer may be formed on the overall surface of the emission area EMA. The insulating material layer may be applied (or formed by coating) on the light emitting elements LD. The insulating material layer may include an insulating material having viscosity (e.g., a suitable viscosity). After the insulating material layer is applied, the first insulating pattern INP1 may be formed through a front-side exposure process. In one or more embodiments, the first insulating pattern INP1 may fix the light emitting elements LD to prevent the light emitting elements LD from being removed during a process of removing the solvent from the first insulating layer INS1 after the light emitting elements LD have been self-aligned.

Referring to FIGS. 11 and 12, before the first insulating pattern INP1 is formed, a void VD may be formed between the first insulating layer INS1 and the light emitting element LD. The void VD may be charged with the first insulating pattern INP1 during the process of forming the first insulating pattern INP1. Consequently, the light emitting element LD may be more stably supported.

Figure 13:
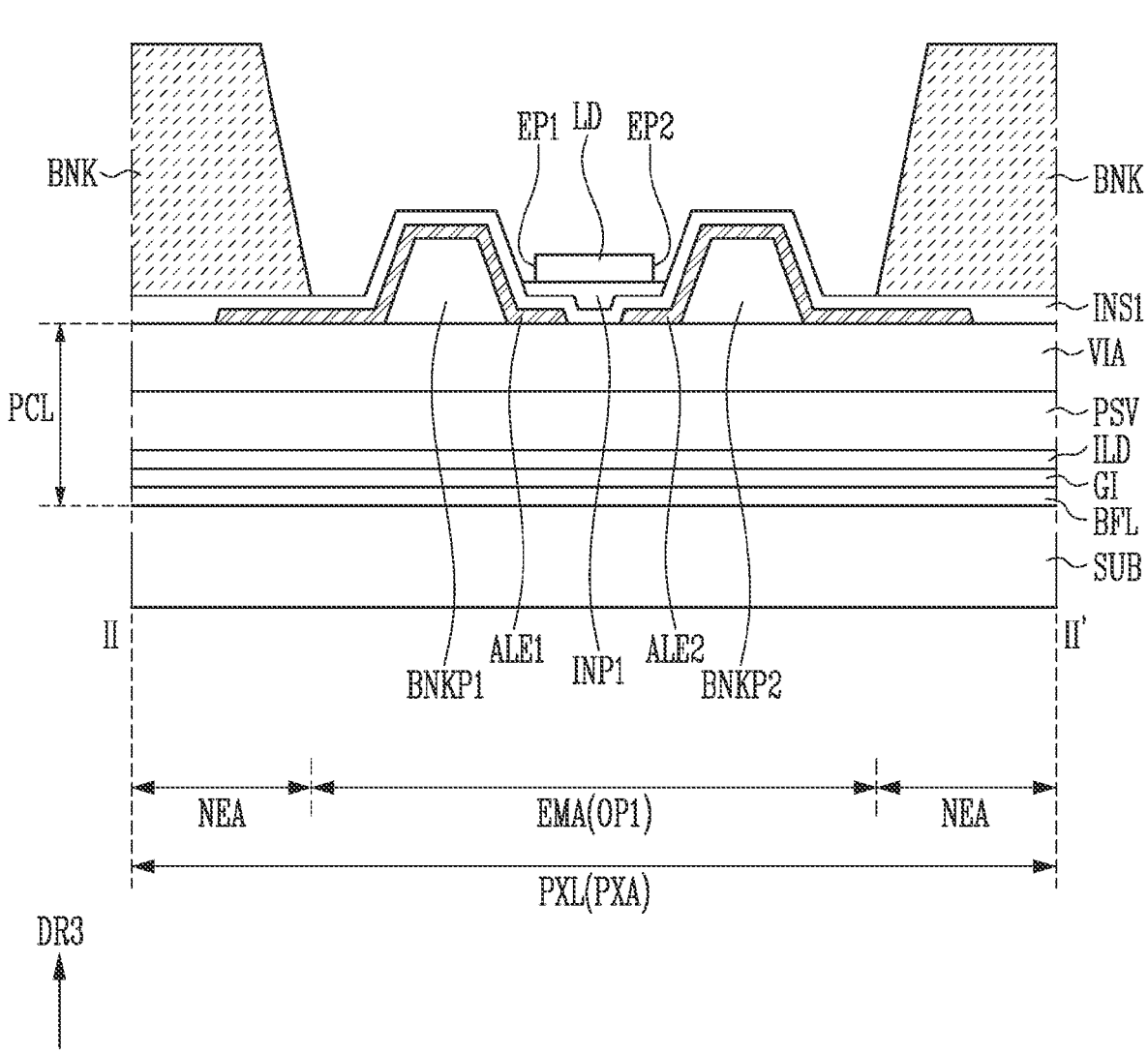

Referring to FIG. 13, the bank BNK is formed on the first insulating layer INS1. The first insulating layer INS1 may be formed on the first insulating layer INS1 in the non-emission area NEA.

In one or more embodiments, the bank BNK may be formed immediately after the first insulating layer INS1 is disposed. In one or more embodiments, the bank BNK may be formed after the light emitting elements LD are sprayed to and aligned in the emission area EMA.

Figure 14:
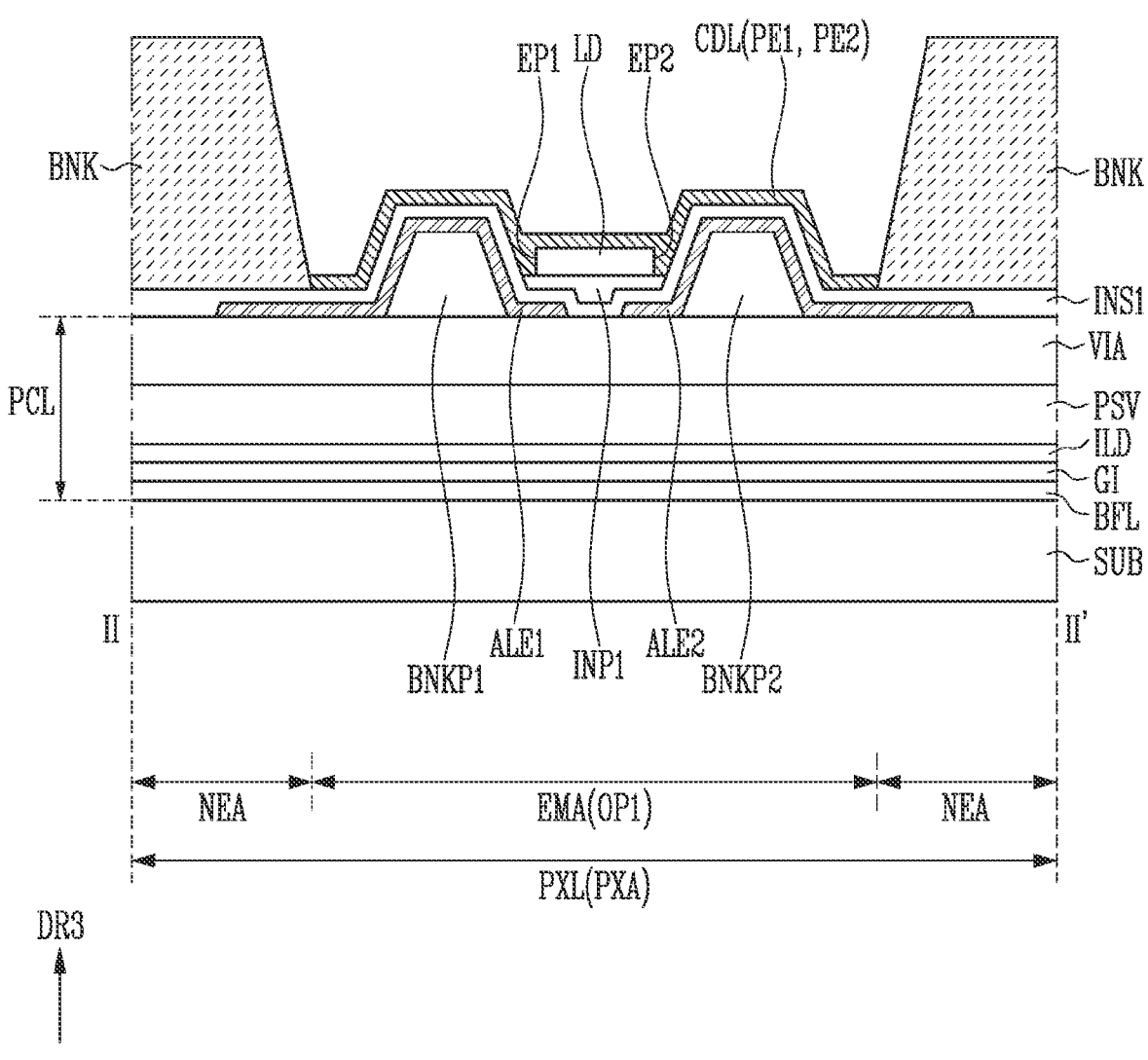

Referring to FIG. 14, a conductive layer CDL may be applied to the overall surfaces of the first insulating layer INS1 and the light emitting element LD in the emission area EMA. In one or more embodiments, the conductive layer CDL may be formed of various transparent conductive materials. For example, the conductive layer CDL may be formed of transparent conductive oxide.

Figure 15:
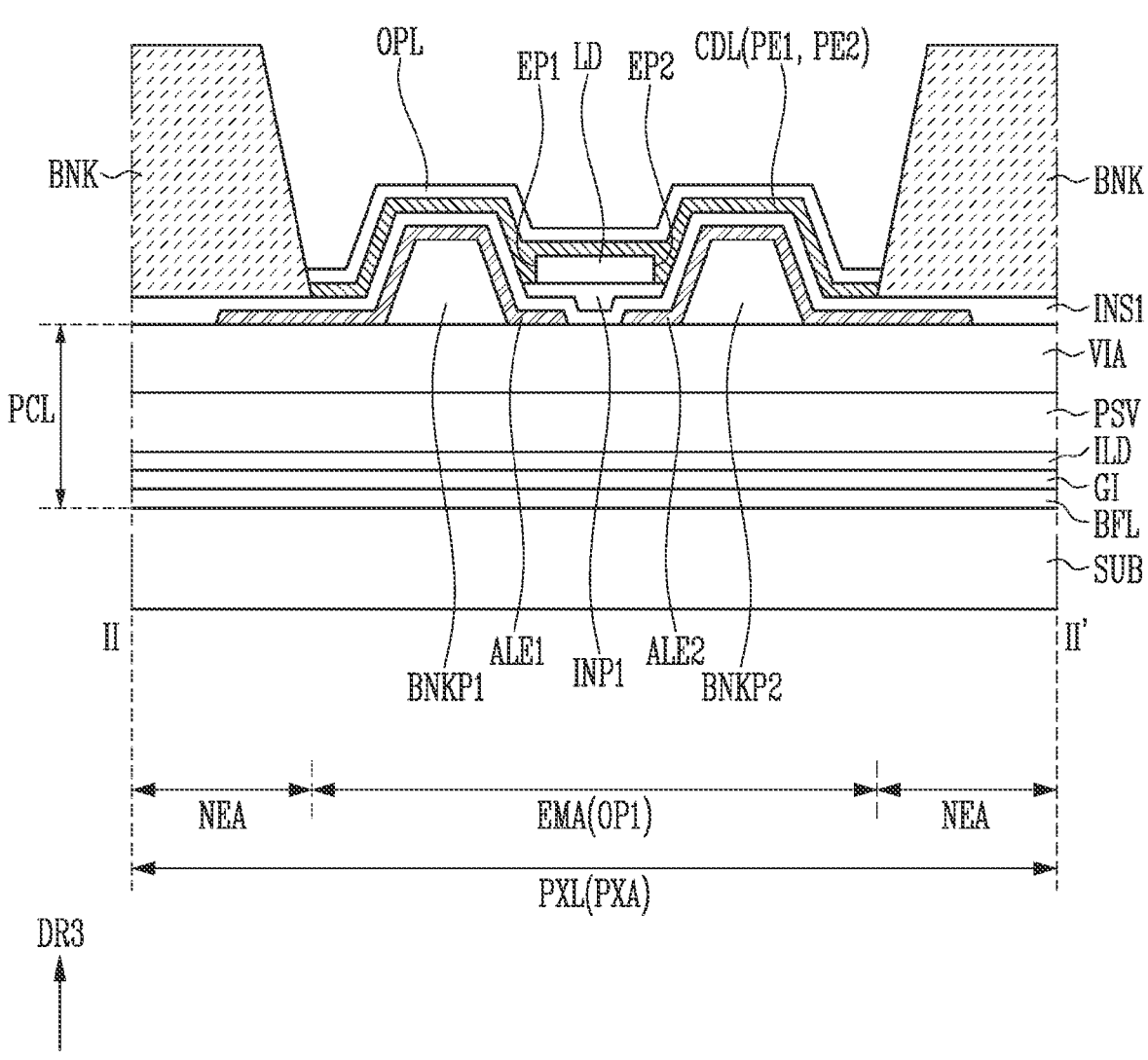

Referring to FIG. 15, the organic transmission layer OPL may be applied to the overall surface of the conductive layer CDL.

In one or more embodiments, a method of applying the organic transmission layer OPL will be described in detail with reference to FIGS. 26A to 28B below.

Figure 16:
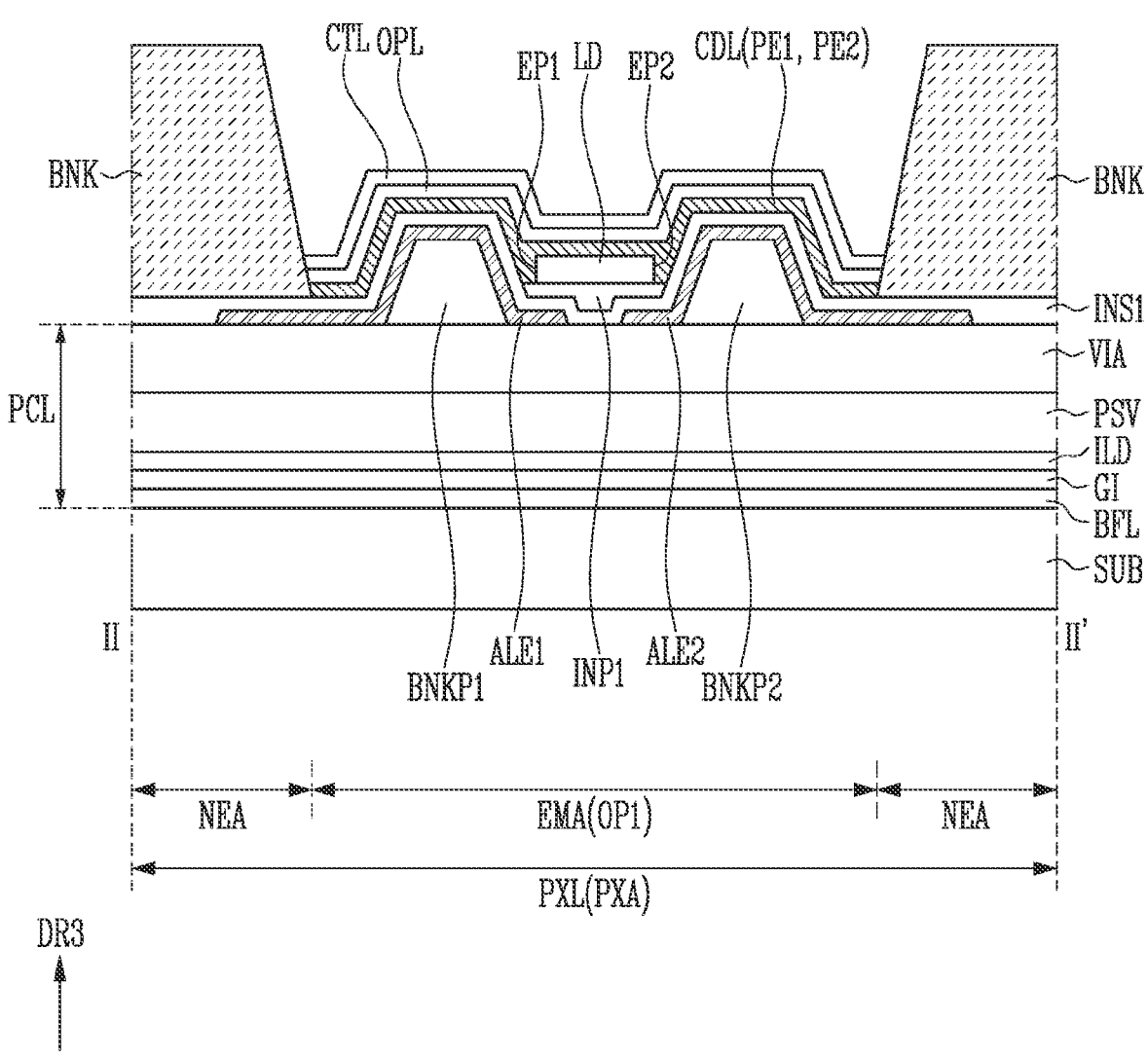
Figure 17:
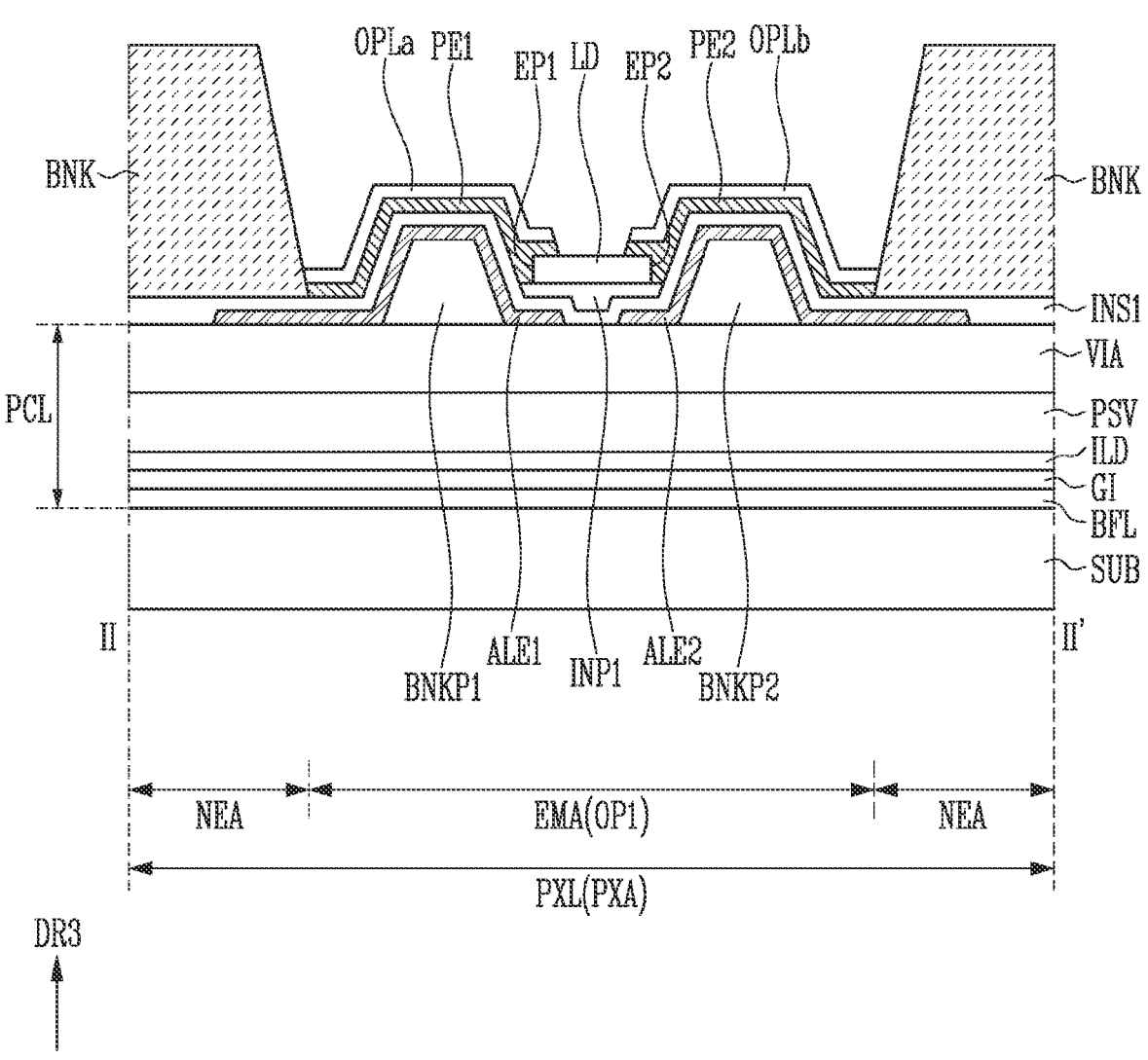

Referring to FIGS. 16 and 17, a coating layer CTL may be applied to the overall surface of the organic transmission layer OPL, and then the coating layer CTL, a portion of the conductive layer CDL, and a portion of the organic transmission layer OPL may be removed through a patterning and etching process.

Referring to FIG. 17, there is illustrated an example in which the entirety of the coating layer CTL is removed, but only a portion of the coating layer CTL may be removed.

In one or more embodiments, as a portion of the conductive layer CDL is removed through the foregoing process, the first pixel electrode PE1 and the second pixel electrode PE2 that are electrically separated from each other may be formed. A method of removing one area of the conductive layer CDL may include a wet etching method.

In one or more embodiments, the first organic transmission layer OPLa and the second organic transmission layer OPLb may be formed by removing a portion of the organic transmission layer OPL through the foregoing process.

Figure 18:
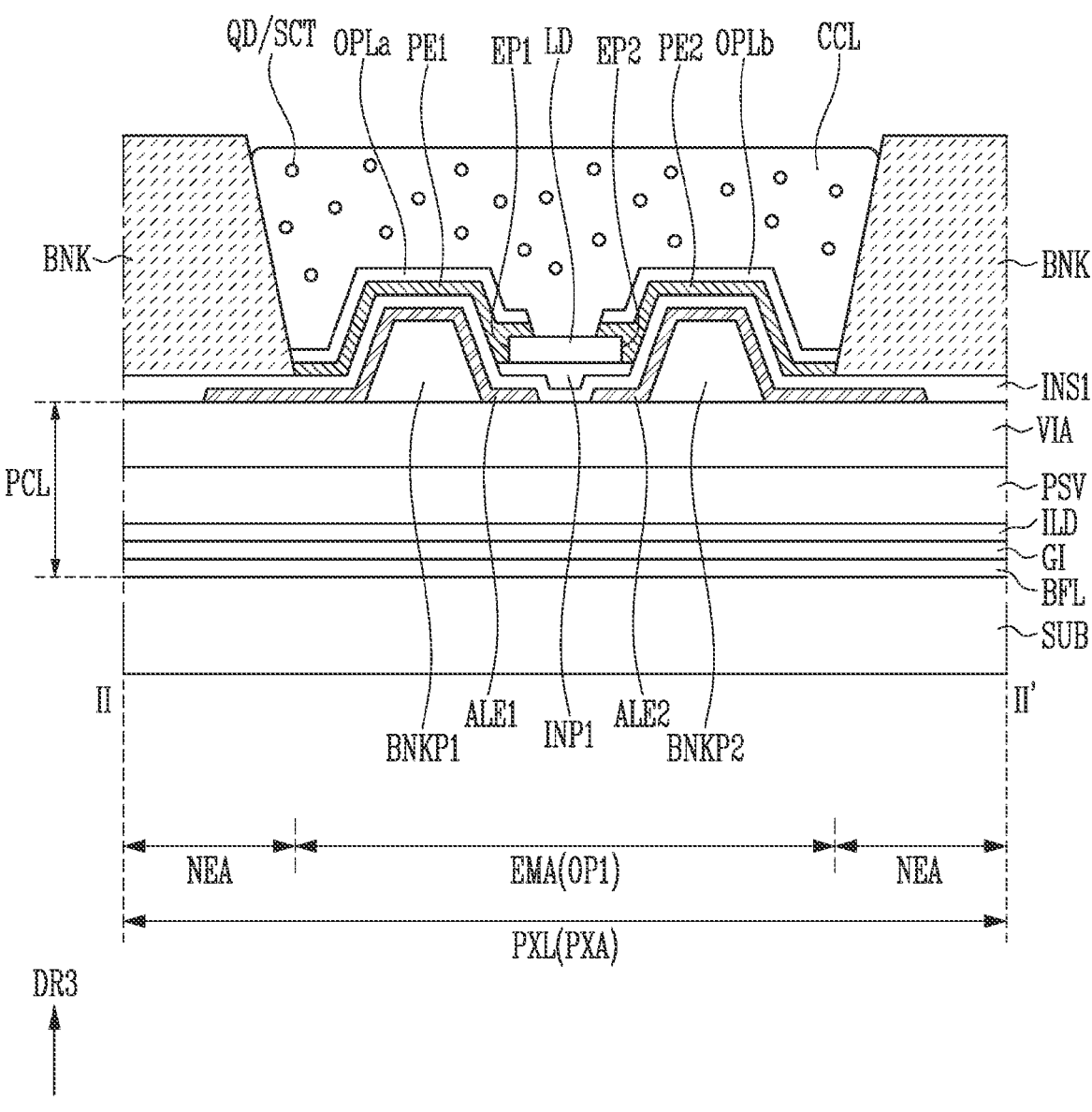

Referring to FIG. 18, the color conversion layer CCL is formed in space enclosed by the bank BNK. In one or more embodiments, the color conversion layer CCL may be formed through a deposition or inkjet scheme, but the present disclosure is not limited thereto.

In one or more embodiments, light emitted from the first and second ends EP1 and EP2 of the light emitting element LD may pass through the organic transmission layer OPL in the third direction DR3 and then may be transmitted to the color conversion layer CCL. Light emitted from the first and second ends EP1 and EP2 of the light emitting element LD may be diffused by light diffusion particles included in the organic transmission layer OPL and then may be transmitted to the color conversion layer CCL.

Figure 19:
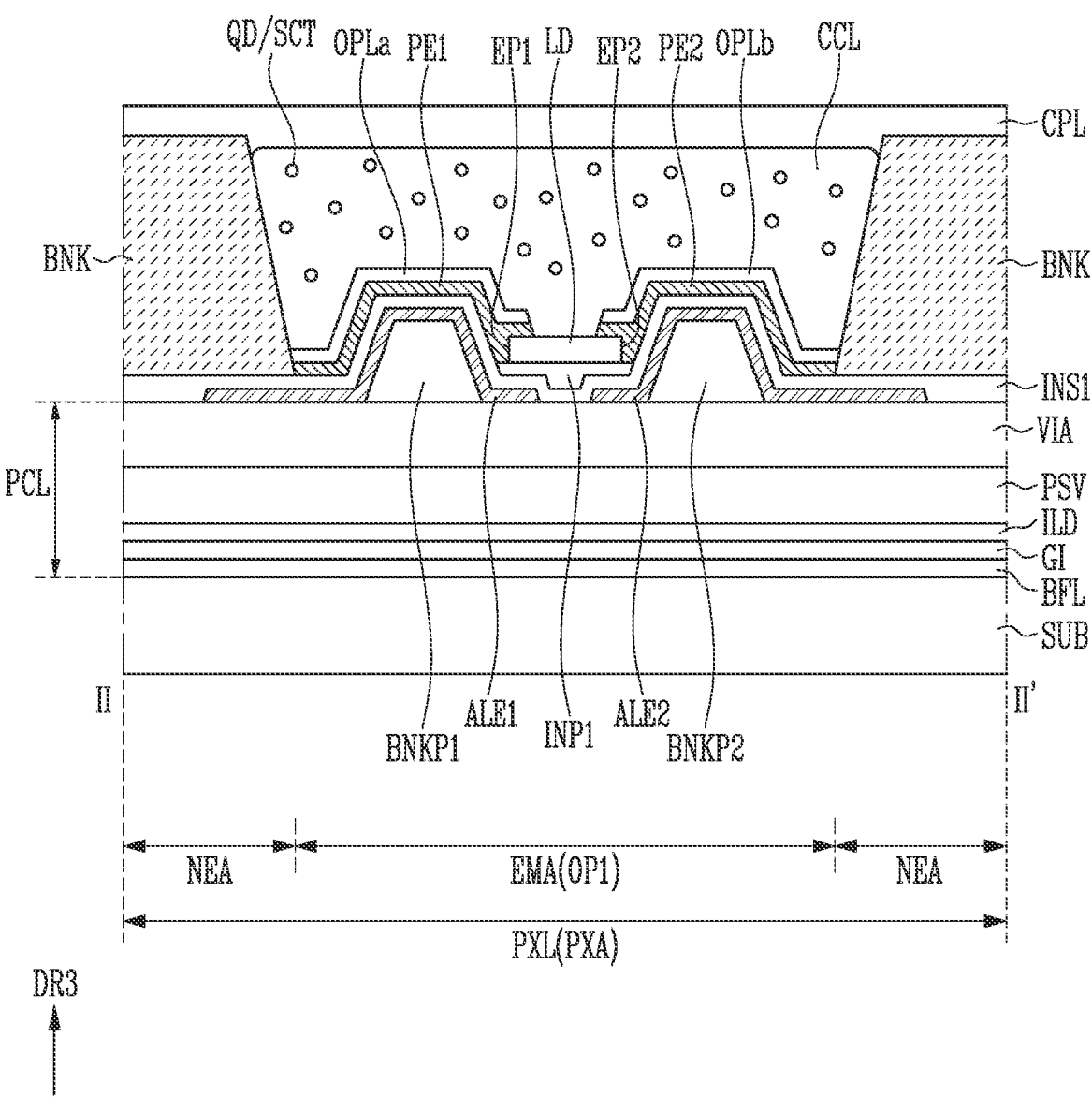

Referring to FIGS. 6A and 19, the capping layer CPL, the light blocking pattern LBP, and the cover layer CVL may be thereafter formed on the color conversion layer CCL.

FIGS. 20 to 25 are sectional views for schematically describing a method of fabricating the display element layer DPL of the pixel PXL in accordance with one or more embodiments.

Hereinafter, the method of fabricating the display element layer DPL of the pixel PXL according to FIG. 6B will be described with reference to FIGS. 20 to 25. Here, operations other than an operation of forming the second insulating pattern INP2 and an operation pertaining thereto will refer to FIGS. 9 to 11 and 18 to 19, and redundant explanation thereof will be omitted.

Figure 20:
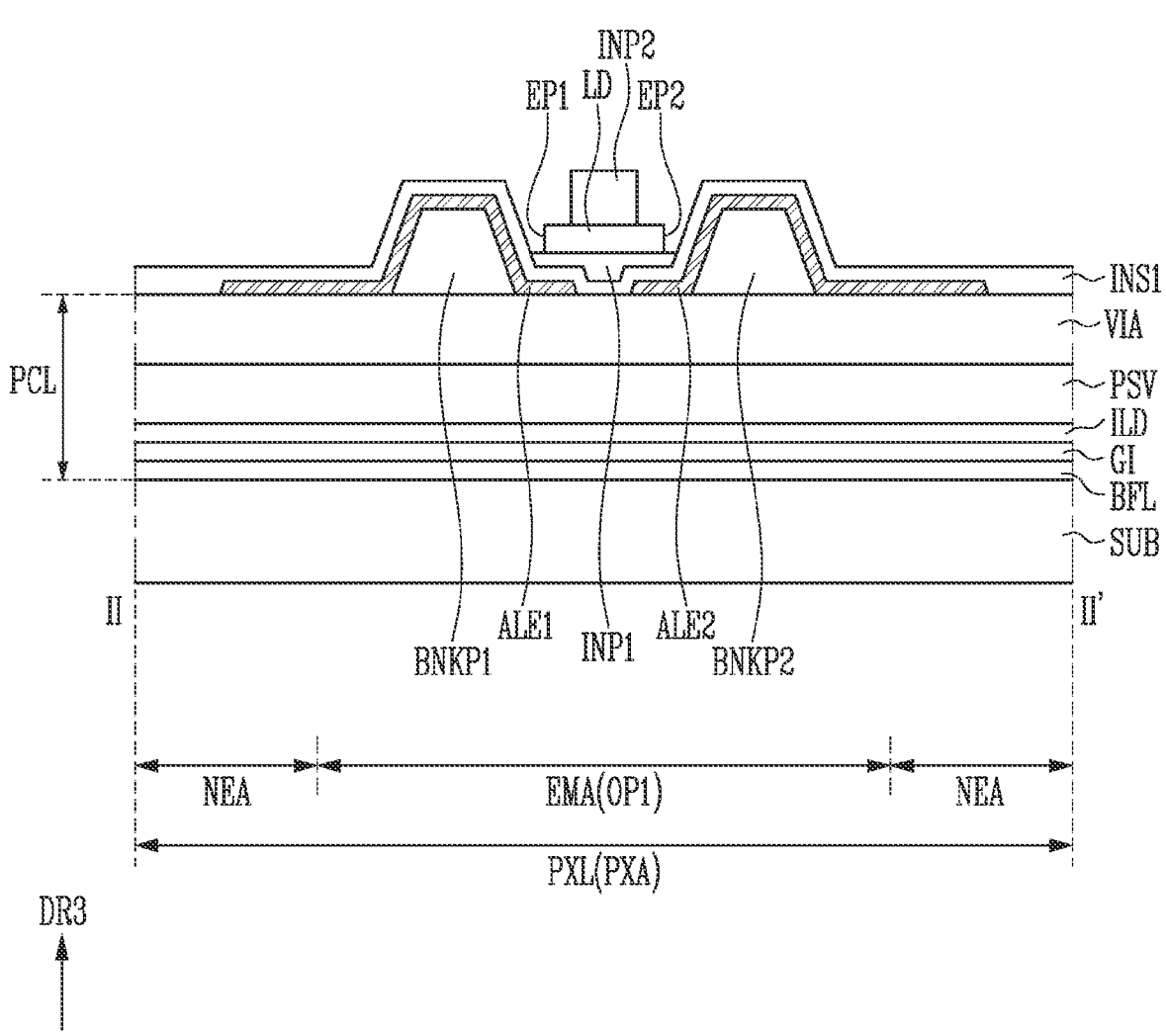
FIGS. 20 to 25 are sectional views for schematically describing a method of fabricating a display element layer of a pixel in accordance with one or more embodiments.

Referring to FIGS. 11 and 20, before the first insulating pattern INP1 and the second insulating pattern INP2 are formed, a void VD may be formed between the first insulating layer INS1 and the light emitting element LD.

Referring to FIG. 20, the first insulating pattern INP1 and the second insulating pattern INP2 may be formed by applying an insulating material to the light emitting element LD and the first insulating layer INS1 and performing a photolithography process using a mask.

Figure 21:
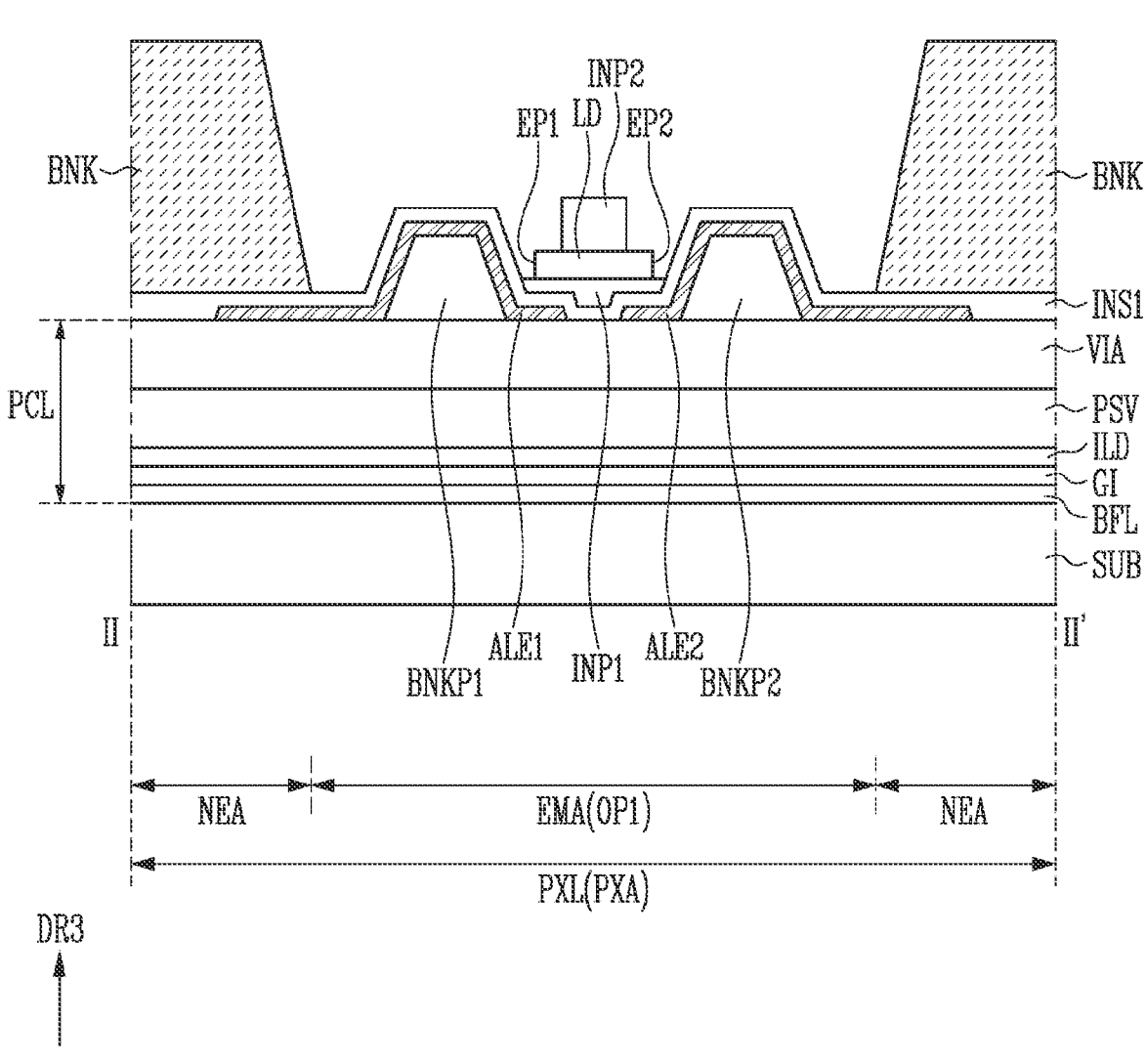

Referring to FIG. 21, the bank BNK is formed on the first insulating layer INS1. The bank BNK may be formed on the first insulating layer INS1 in the non-emission area NEA.

Figure 22:
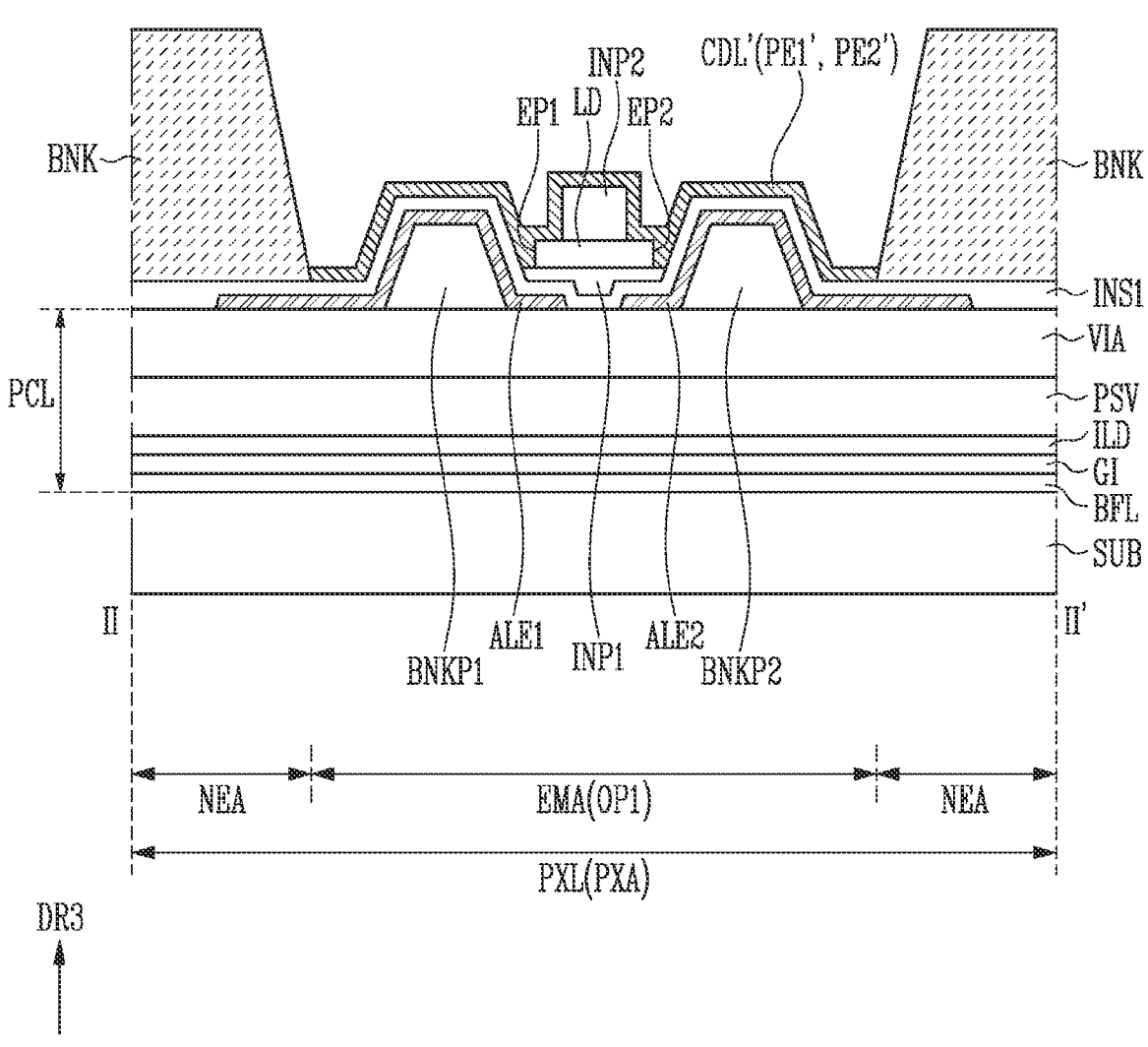

Referring to FIG. 22, a conductive layer CDL' may be applied onto the overall surfaces of the first insulating layer INS1 and the second insulating pattern INP2 in the emission area EMA. The conductive layer CDL' may be disposed along the profile (or the shape) of the first insulating layer INS1 and the second insulating pattern INP2.

Figure 23:
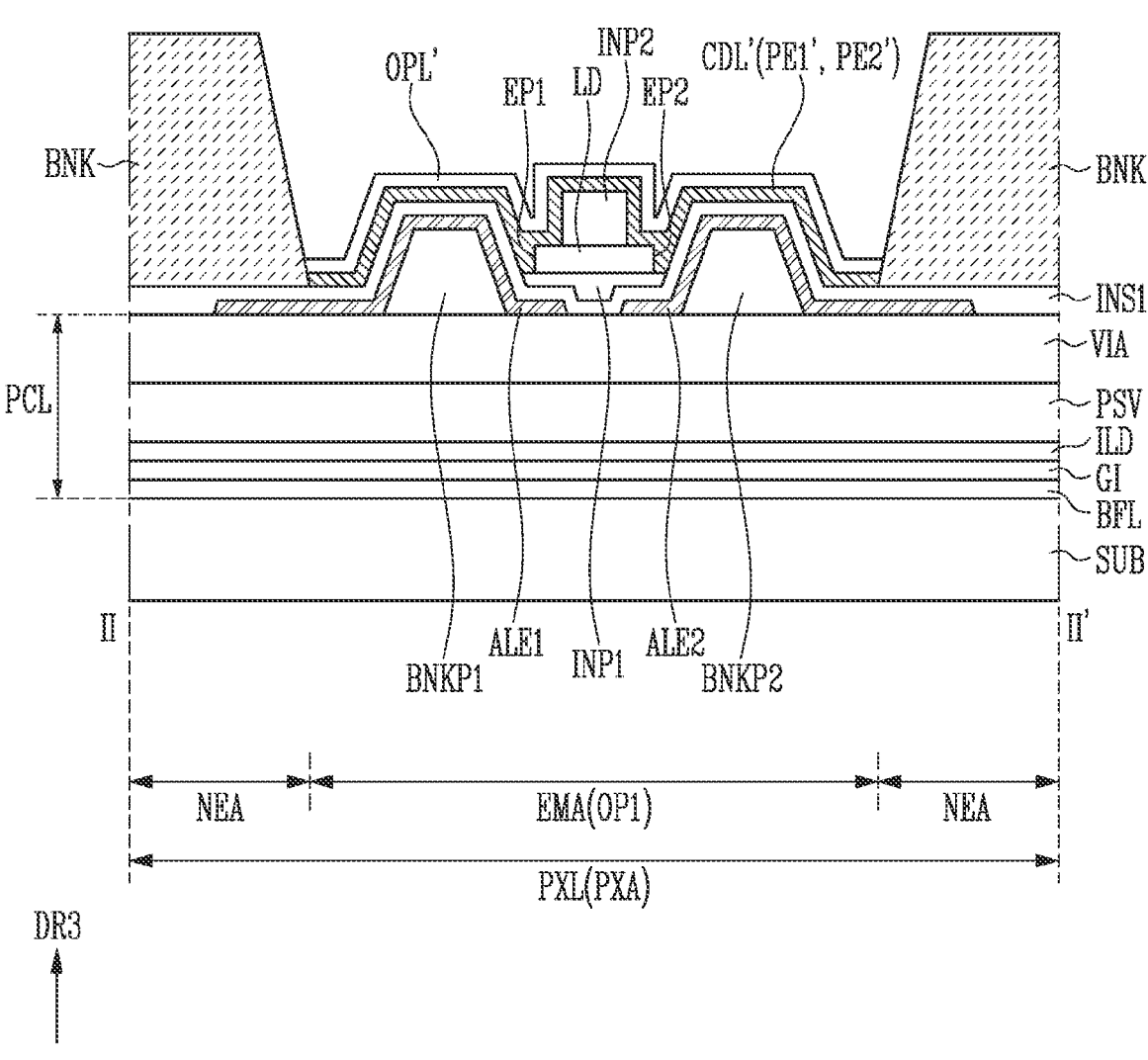

Referring to FIG. 23, an organic transmission layer OPL' may be disposed on the overall surface of the conductive layer CDL'.

Figure 24:
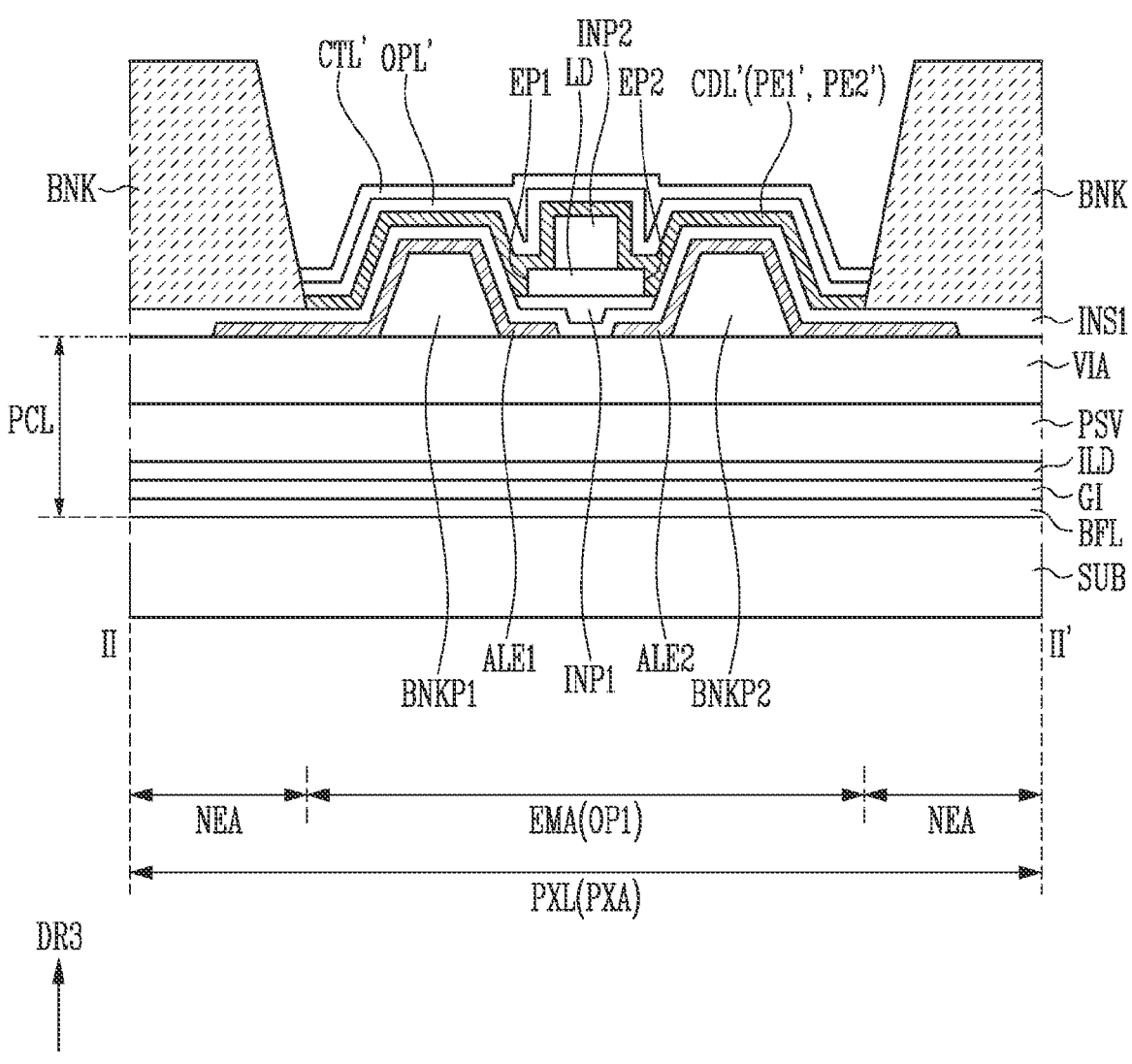
Figure 25:
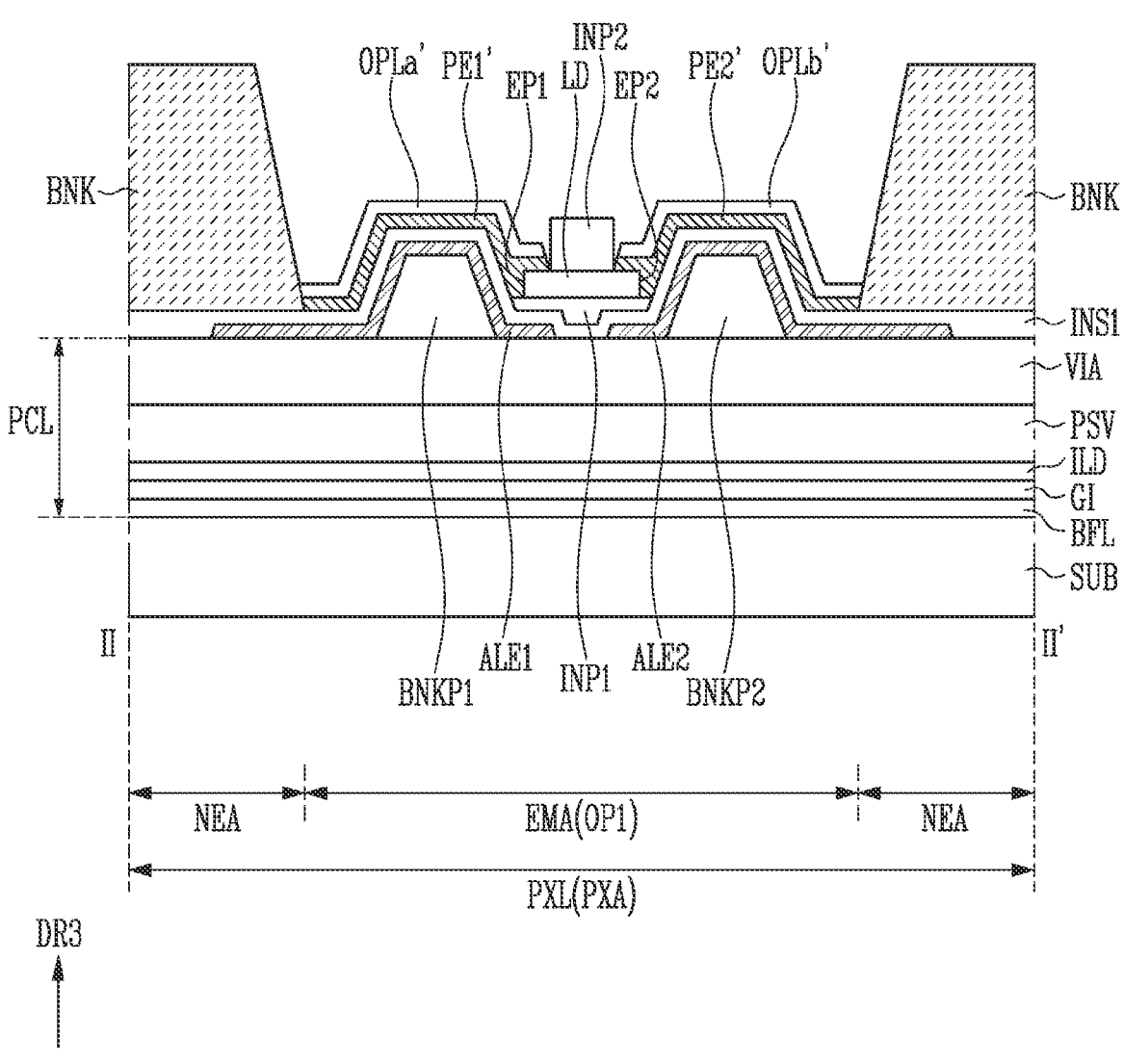

Referring to FIGS. 24 and 25, a coating layer CTL' may be applied to the overall surface of the organic transmission layer OPL', and then the coating layer CTL', a portion of the conductive layer CDL', and a portion of the organic transmission layer OPL' may be removed through a patterning and etching process using a first mask.

In one or more embodiments, as a portion of the conductive layer CDL' is removed through the foregoing process, the first pixel electrode PE1' and the second pixel electrode PE2' that are electrically separated from each other may be formed.

In one or more embodiments, the first organic transmission layer OPLa' and the second organic transmission layer OPLb' may be formed by removing a portion of the organic transmission layer OPL' through the foregoing process.

Thereafter, the following processes may be performed in the same scheme as that of FIGS. 18 and 19.

Hereinafter, methods of forming the organic transmission layer (e.g., the organic transmission layer OPL of FIG. 6A) will be described with reference to FIGS. 26A to 28B.

Referring to FIGS. 26A to 28B, the pixel PXL may include a first pixel PXL1 configured to emit red light, a second pixel PXL2 configured to emit green light, and a third pixel PXL3 configured to emit blue light.

In one or more embodiments, a color conversion layer (e.g., the color conversion layer CCL of FIG. 6A) including color conversion particles (e.g., the color conversion particles QD of FIG. 6A) of red quantum dots that convert light emitted from the first light emitting element LD1 to red light may be disposed in the emission area EMA of the first pixel PXL1. A color conversion layer CCL including color conversion particles QD of green quantum dots that convert light emitted from the second light emitting element LD2 to green light may be disposed in the emission area EMA of the second pixel PXL2.

In one or more embodiments, a color conversion layer CCL including color conversion particles QD of blue quantum dots that convert light emitted from the third light emitting element LD3 to blue light may be disposed in the emission area EMA of the third pixel PXL3. In one or more embodiments, in the case in which the third light emitting element LD3 emits blue-based light, light scattering particles (e.g., the light scattering particles SCT of FIG. 6A) in lieu of the color conversion layer CCL including color conversion particles QD of blue quantum dots may be disposed in the emission area EMA of the third pixel PXL3.

Figure 26A:
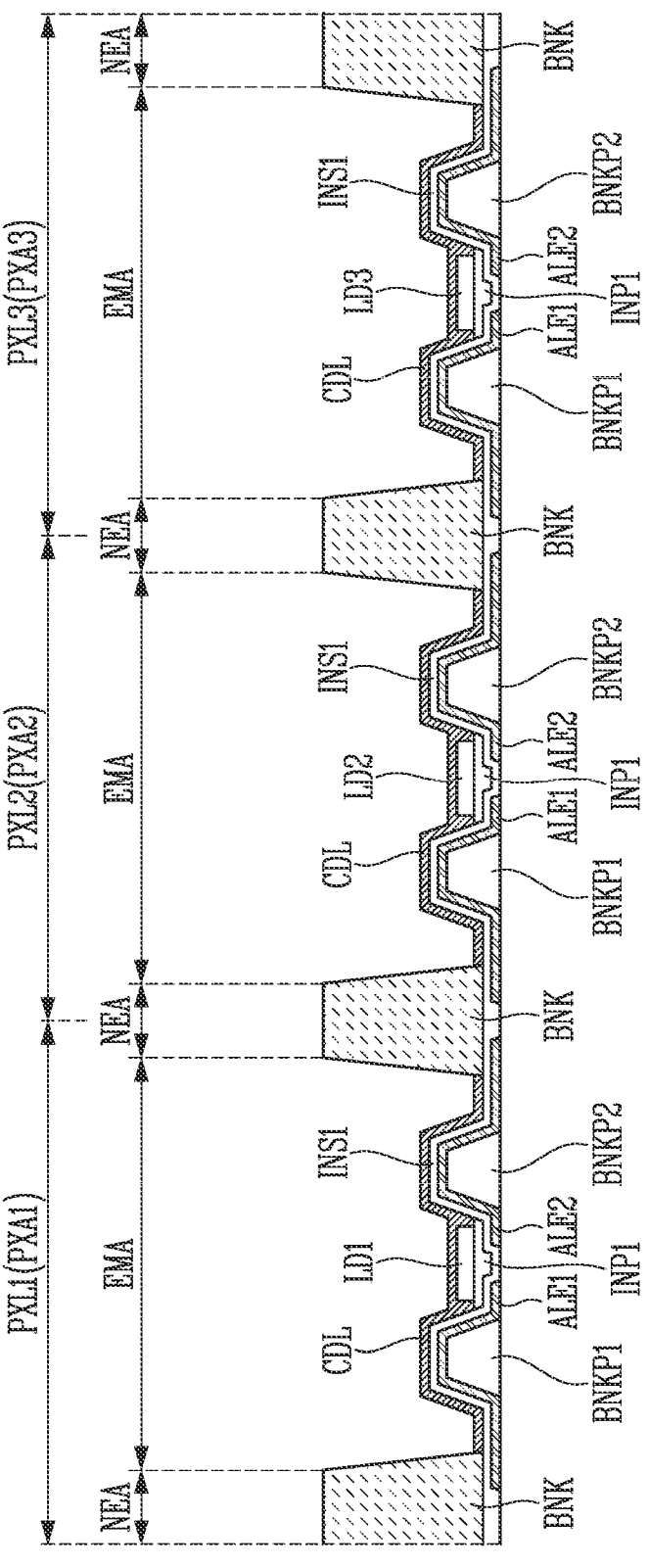
FIGS. 26A and 26B are sectional views illustrating a method of forming the organic transmission layer illustrated in FIG. 6A in accordance with one or more embodiments.
Figure 26B:
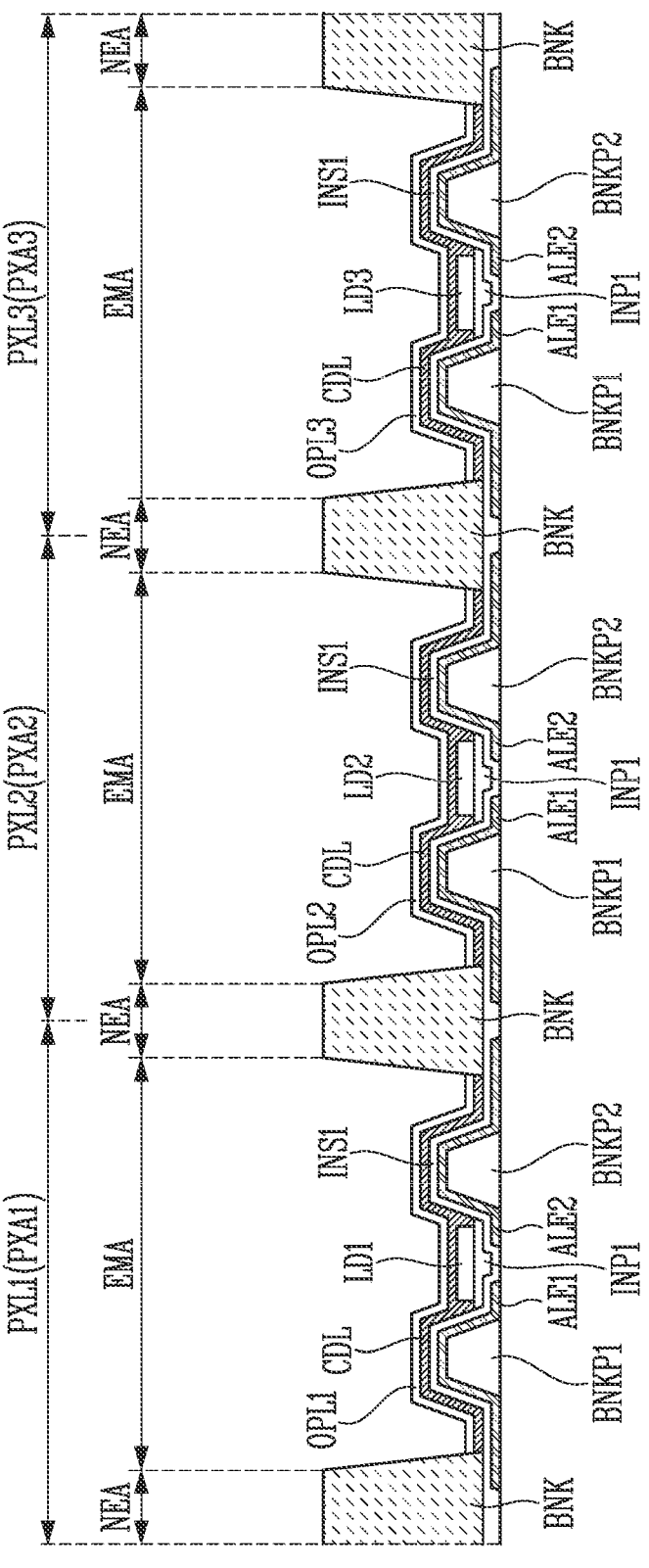

FIGS. 26A and 26B are sectional views illustrating a method of forming the organic transmission layer OPL illustrated in FIG. 6A in accordance with one or more embodiments.

Referring to FIGS. 26A and 26B, after the conductive layer CDL is disposed in each of the first pixel PXL1, the second pixel PXL2, and the third pixel PXL3, the organic transmission layers OPL1, OPL2, and OPL3 may be sprayed through an ink-jet scheme into the respective emission areas EMA of the first pixel PXL1, the second pixel PXL2, and the third pixel PXL3 that are partitioned from each other by the bank BNK.

In one or more embodiments, the organic transmission layers OPL1, OPL2, and OPL3 may be sprayed into the emission areas EMA of the first, second, and third pixels PXL1, PXL2, and PXL3 in the form of an organic solvent including light diffusion particles.

In one or more embodiments, the thicknesses of the organic transmission layers OPL1, OPL2, and OPL3 that are sprayed into the respective emission areas EMA of the first, second, and third pixels PXL1, PXL2, and PXL3 may be the same as each other. In one or more embodiments, the thicknesses of the organic transmission layers OPL1, OPL2, and OPL3 that are sprayed into the emission areas EMA may be different from each other. For example, the thickness of the organic transmission layer OPL1 that is diffused into the emission area EMA of the first pixel PXL1 may be greater than the thickness of the organic transmission layer OPL2 that is diffused into the emission area EMA of the second pixel PXL2.

FIGS. 27A to 27D are sectional views illustrating a method of forming the organic transmission layer OPL illustrated in FIG. 6A in accordance with one or more embodiments.

Figure 27A:
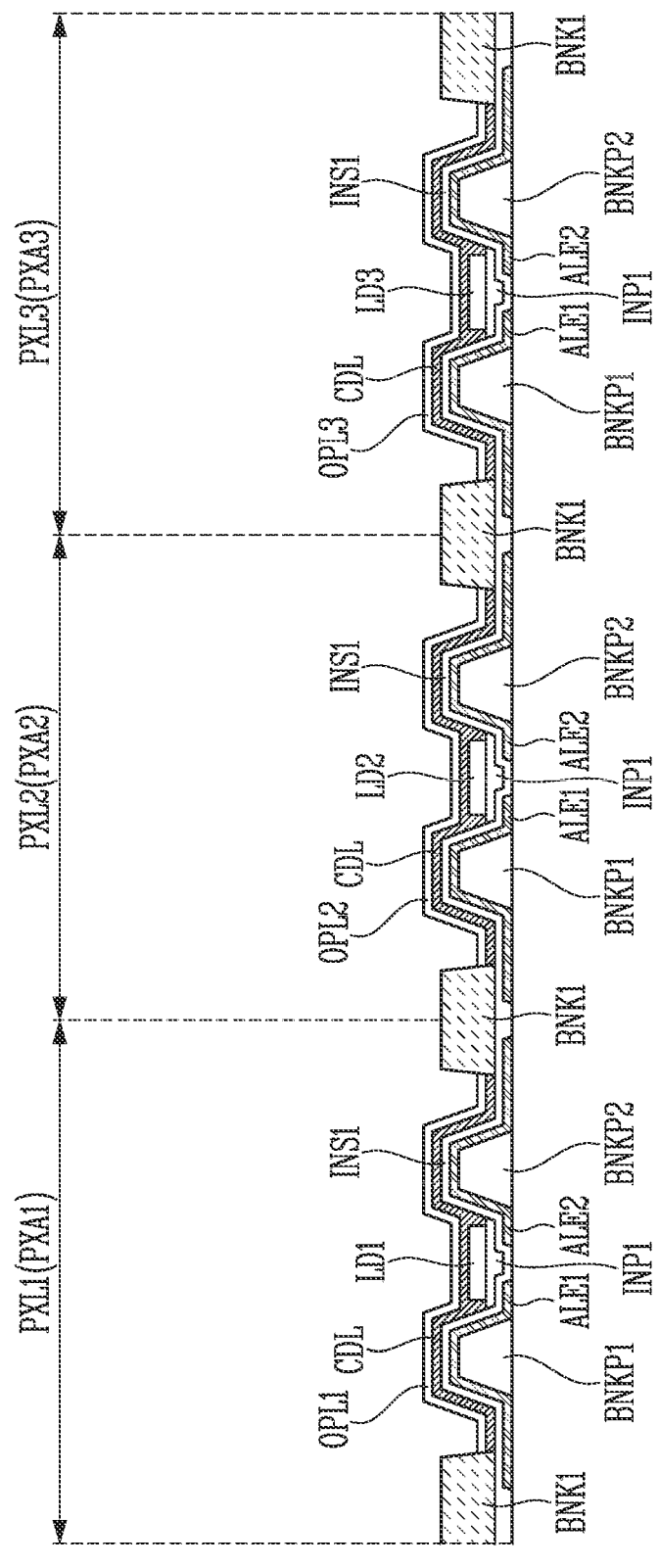

Referring to FIGS. 27A and 27C, in the first pixel PXL1, the second pixel PXL2, and the third pixel PXL3, a first bank BNK1 may be formed after the first and second alignment electrodes ALE1 and ALE2 and the first insulating layer INS1 are formed.

In one or more embodiments, the first bank BNK1 may be a defining layer which partitions the first pixel PXL1, the second pixel PXL2, and the third pixel PXL3 from each other.

In an embodiment, after the first bank BNK1 is formed, the conductive layer CDL may be disposed.

Referring to FIG. 27A, after the conductive layer CDL is disposed, the organic transmission layers OPL1, OPL2, and OPL3 may be patterned to overlap the emission areas EMA of the respective pixels other than the non-emission areas NEA. The organic transmission layers OPL1, OPL2, and OPL3 may be concurrently (e.g., simultaneously) patterned to overlap the emission areas EMA of the first, second, and third pixels PXL1, PXL2, and PXL3.

Referring to FIG. 27C, after the conductive layer CDL is disposed, the organic transmission layers OPL1 and OPL2 may be concurrently (e.g., simultaneously) patterned to overlap the emission area EMA of the first pixel PXL1 and the emission area EMA of the second pixel PXL2, except the emission area EMA of the third pixel PXL3.

In one or more embodiments, the third pixel PXL3 that emits blue light may include, during a following process, a light scattering layer including light scattering particles (e.g., the light scattering particles SCT of FIG. 6A) rather than including a color conversion layer (e.g., the cover conversion layer CCL of FIG. 6A) because the third light emitting element LD3 emits blue-based light. Therefore, due to contact between the light emitting element LD and the color conversion layer CCL, a degradation phenomenon on the opposite ends of the light emitting element LD may be prevented from occurring. Hence, there is no need for the organic transmission layer to be disposed to prevent the degradation phenomenon, so that the organic transmission layers OPL1 and OPL2 can be respectively formed, by patterning, in only the first and second pixels PXL1 and PXL2 other than the third pixel PXL3.

Figure 27B:
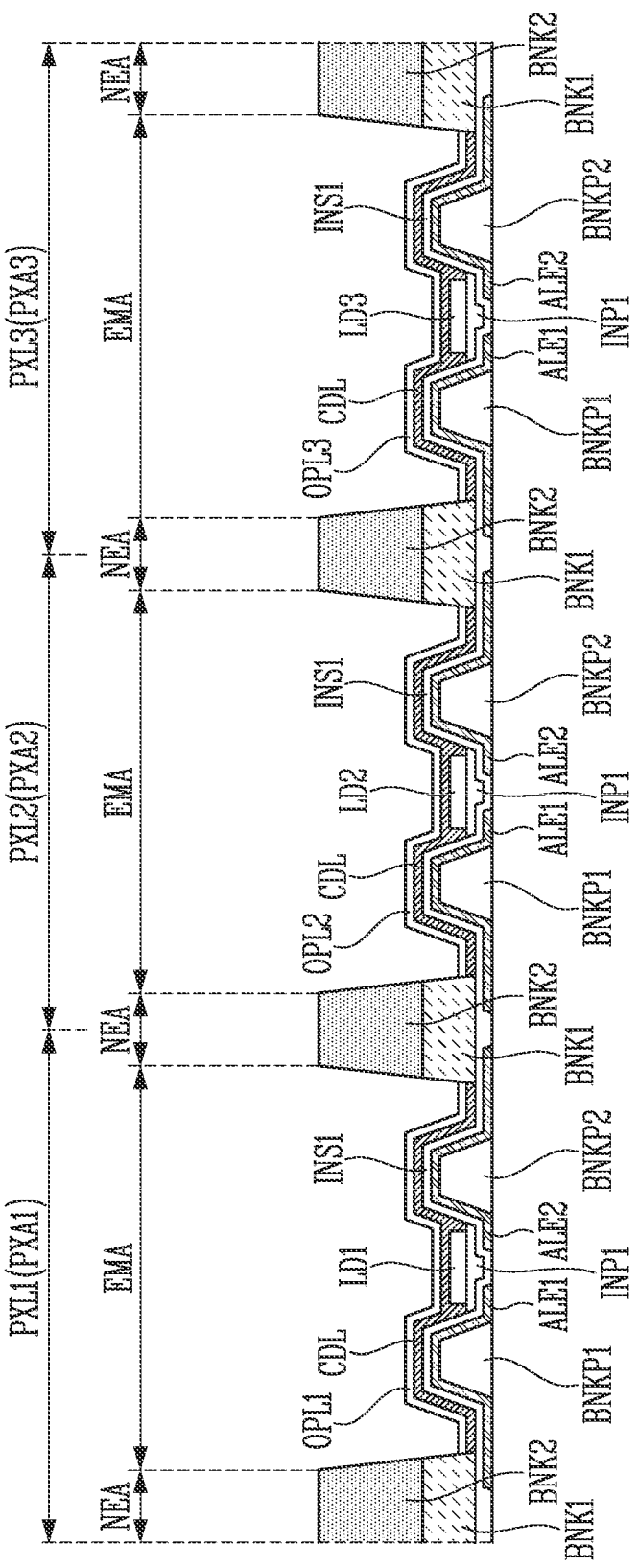
Figure 27C:
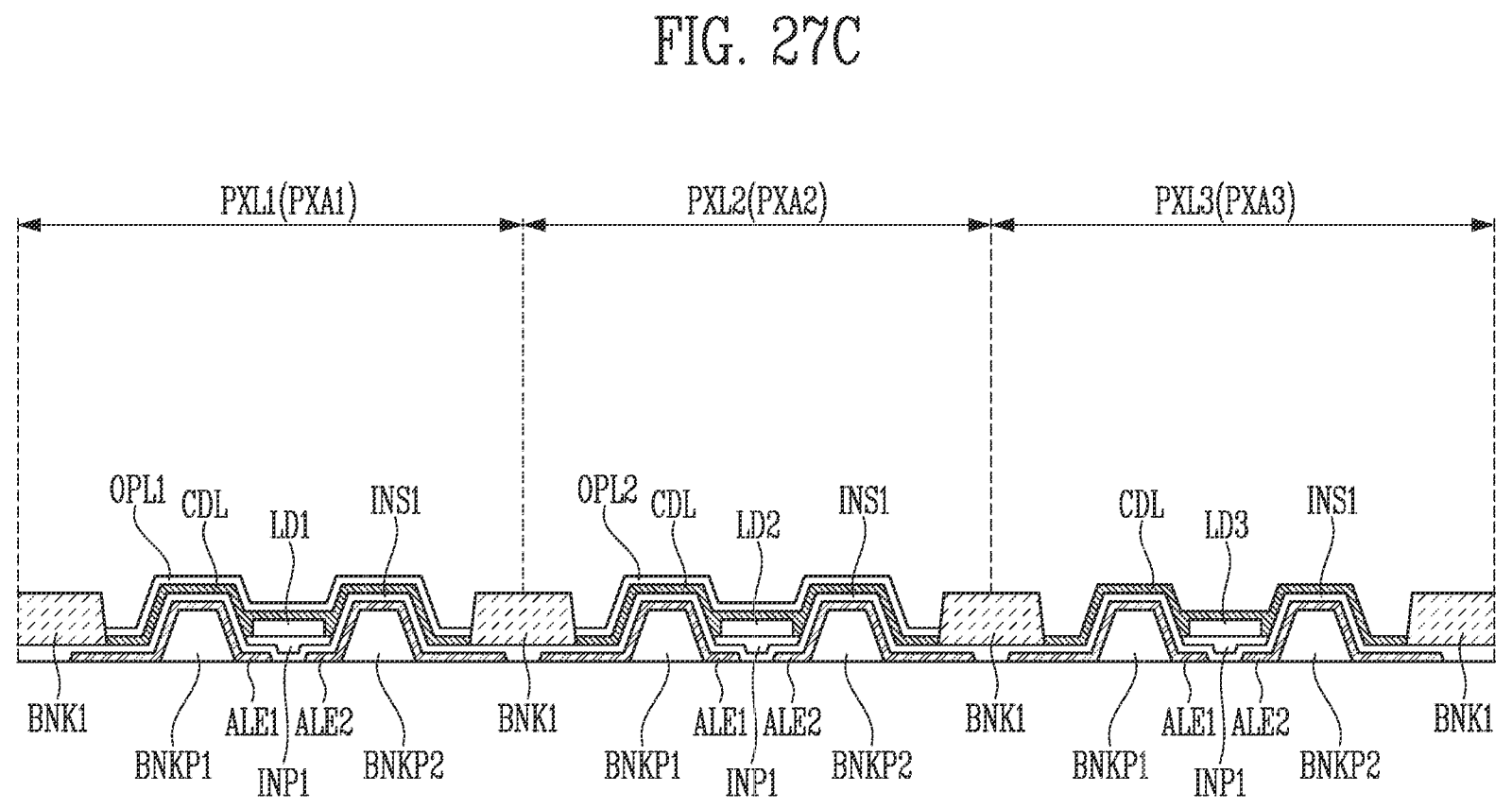
Figure 27D:
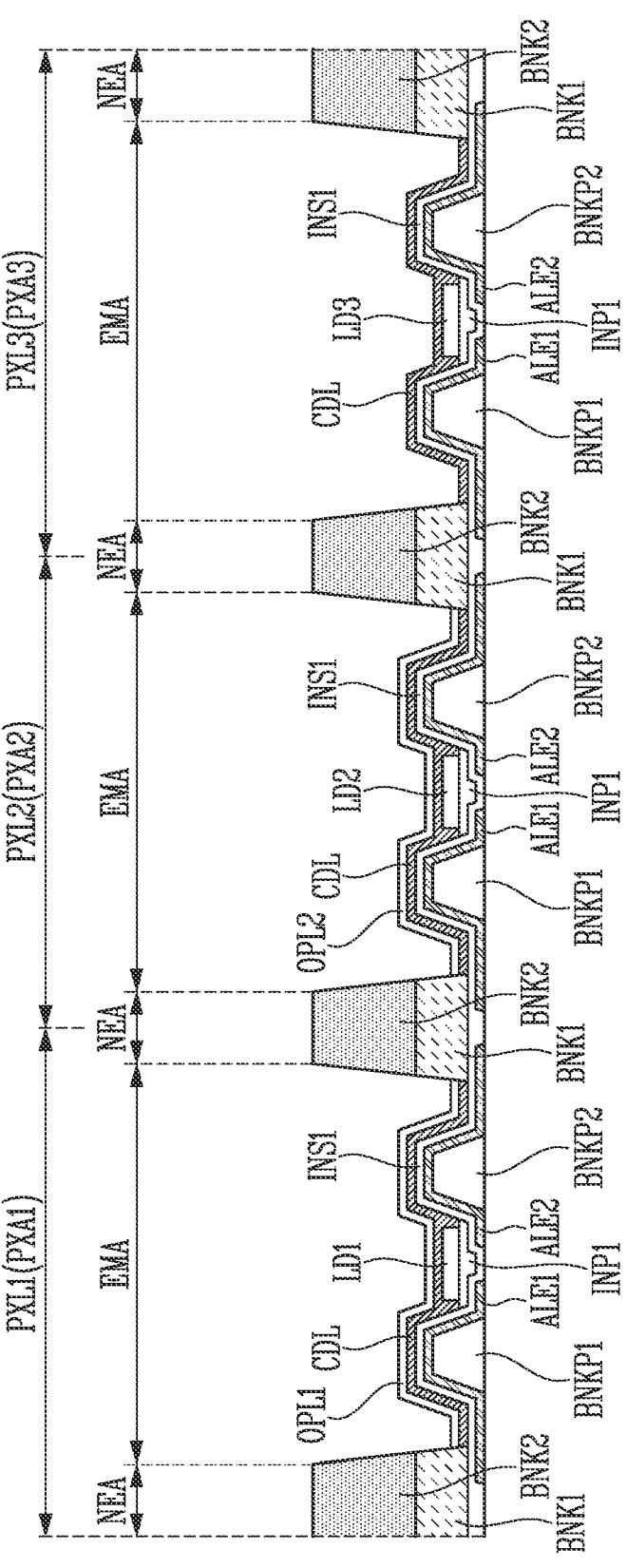

Referring to FIG. 27B, a second bank BNK2 may be disposed on the first bank BNK1 after the organic transmission layers OPL1, OPL2, and OPL3 are patterned.

Referring to FIG. 27B, a second bank BNK2 may be disposed on the first bank BNK1 after the organic transmission layers OPL1 and OPL2 are patterned.

In one or more embodiments, the first bank BNK1 may be formed to a height suitable for patterning the organic transmission layers OPL1, OPL2, and OPL3 to overlap the respective emission areas EMA. In one or more embodiments, the height of the first bank BNK1 may be similar to the heights of the first and second bank patterns BNKP1 and BNKP2.

In one or more embodiments, the second bank BNK2 may be a structure that ultimately defines the emission area EMA. The second bank BNK2 may be a structure that ultimately defines the emission area EMA to which a color conversion layer (e.g., the color conversion layer CCL of FIG. 5) is to be supplied.

In one or more embodiments, the second bank BNK2 may be formed of the same material as that of the first bank BNK1.

In one or more embodiments, the shape of a combination of the first bank BNK1 and the second bank BNK2 may be the same as the shape of the bank BNK illustrated in FIG. 26A.

Figure 28A:
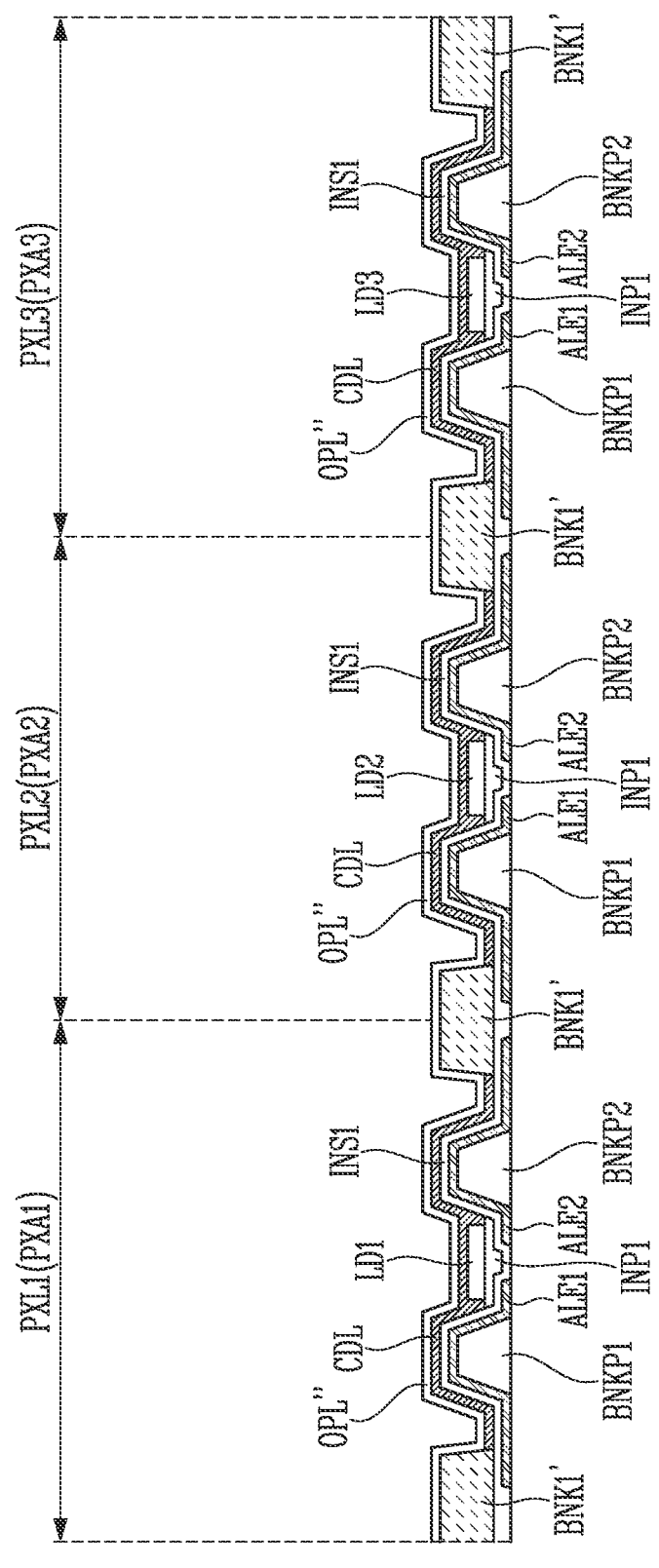
FIGS. 28A and 28B are sectional views illustrating a method of forming the organic transmission layer illustrated in FIG. 6A in accordance with one or more embodiments.
Figure 28B:
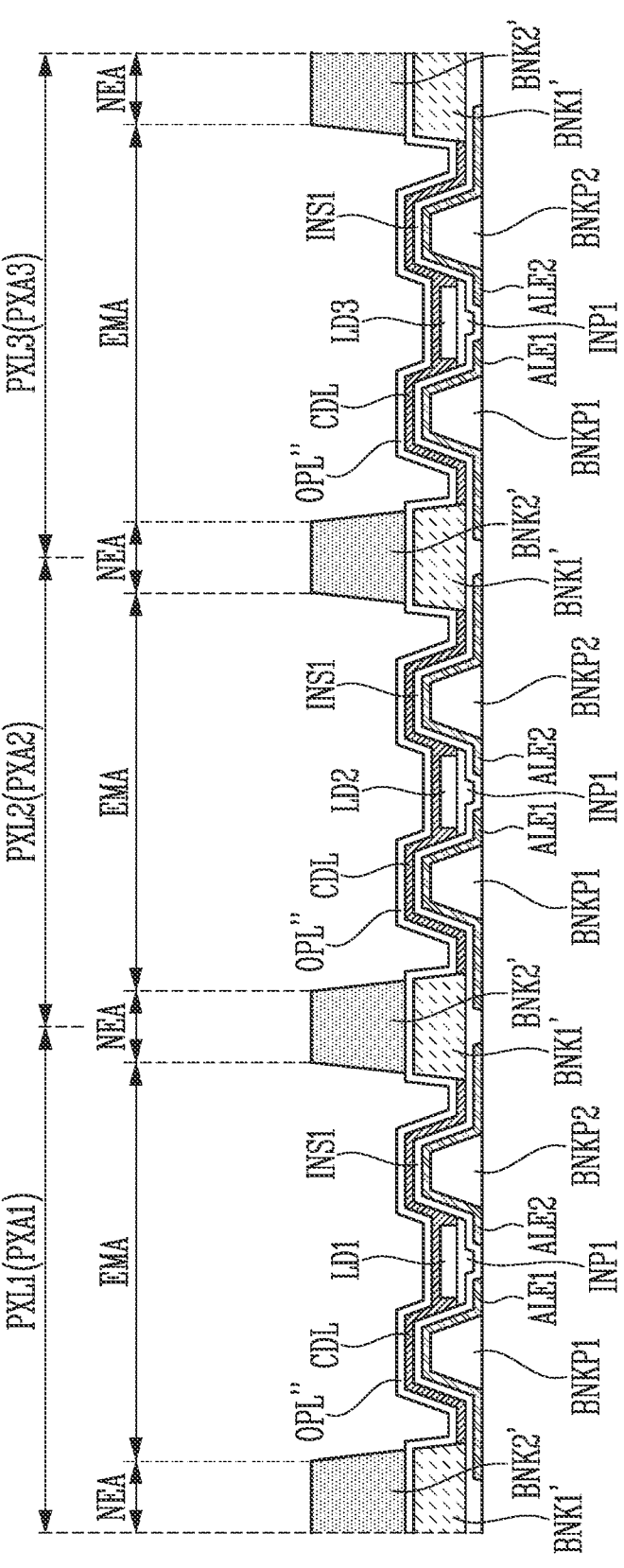

FIGS. 28A and 28B are sectional views illustrating a method of forming the organic transmission layer OPL illustrated in FIG. 6A in accordance with one or more embodiments.

Referring to FIG. 28A, in the first pixel PXL1, the second pixel PXL2, and the third pixel PXL3, a first bank BNK1' may be formed to overlap the non-emission area NEA after the first and second alignment electrodes ALE1 and ALE2 and the first insulating layer INS1 are formed.

In one or more embodiments, after the first bank BNK1' is formed, the conductive layer CDL may be disposed on the first insulating layer INS1 and overlap the respective emission areas EMA of the first pixel PXL1, the second pixel PXL2, and the third pixel PXL3.

In one or more embodiments, the height of the first bank BNK1' may be similar to the heights of the first and second bank patterns BNKP1 and BNKP2.

In one or more embodiments, after the conductive layer CDL is formed to overlap the emission area EMA of each pixel, an organic transmission layer OPL" may be disposed on the overall surface of each pixel to cover the first bank BNK1' and the conductive layer CDL of each pixel.

In one or more embodiments, the organic transmission layer OPL" may be formed by applying an organic solvent including light diffusion particles to the overall surface to cover the conductive layer CDL and the first bank BNK1' that are formed in each of the first pixel PXL1, the second pixel PXL2, and the third pixel PXL3 and by hardening the organic solvent. The organic solvent including the light diffusion particles may correspond to an organic photoresist material.

In one or more embodiments, the organic transmission layer OPL" may be disposed on the first bank BNK1'.

Referring to FIG. 28B, after the organic transmission layer OPL" is formed, a second bank BNK2' may be formed to overlap the first bank BNK1'.

In one or more embodiments, the second bank BNK2' may be a structure that ultimately defines the emission area EMA. The second bank BNK2' may be a structure that ultimately defines the emission area EMA to which a color conversion layer (e.g., the color conversion layer CCL of FIG. 5) is to be supplied.

In one or more embodiments, the second bank BNK2' may be formed of the same material as that of the first bank BNK1'.

While embodiments of the present disclosure have been described above, those skilled in the art will appreciate that various modifications, additions and substitutions are possible, without departing from the scope and spirit of the present disclosure claimed in the appended claims and their equivalents.

What is claimed is:

1. A display device comprising:
  a substrate; and
  a pixel on the substrate, and including an emission area and a non-emission area, wherein the pixel comprises:
  a light emitting element in the emission area, the light emitting element comprising a first end and a second end;
  a first pixel electrode electrically connected to the first end of the light emitting element;
  a second pixel electrode electrically connected to the second end of the light emitting element;
  an organic transmission layer covering the first end and the second end of the light emitting element, the organic transmission layer comprising a light diffusion particle; and
  a color conversion layer on the organic transmission layer, the color conversion layer comprising a color conversion particle to convert a first color of light emitted from the light emitting element to a second color of light,
  wherein a thickness of the organic transmission layer is based on a wavelength of light emitted from the light emitting element.

2. The display device according to claim 1, wherein the light diffusion particle of the organic transmission layer comprises a light scatterer having dispersibility in an organic solvent.

3. The display device according to claim 2, wherein the light scatterer comprises at least one of titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$).

4. The display device according to claim 1, further comprising a coating layer between the organic transmission layer and the color conversion layer.

5. The display device according to claim 1, further comprising:
  a pixel circuit layer comprising a transistor electrically connected to the light emitting element, and a power line;
  a first bank pattern and a second bank pattern on the pixel circuit layer in the emission area, and spaced from each other;
  a first alignment electrode on the first bank pattern, and electrically connected to the transistor;
  a second alignment electrode on the second bank pattern, and electrically connected to the power line; and
  an insulating layer on the first alignment electrode and the second alignment electrode, wherein the light emitting element is on the insulating layer, and is between the first alignment electrode and the second alignment electrode in a plan view.

6. The display device according to claim 5, further comprising a first insulating pattern between the insulating layer and the light emitting element.

7. The display device according to claim 6, further comprising a second insulating pattern on the light emitting element, wherein the first end and the second end of the light emitting element are exposed from the second insulating pattern.

8. The display device according to claim 1, wherein the pixel comprises a first pixel configured to emit red light and a second pixel configured to emit green light.

9. The display device according to claim 8,
   wherein the organic transmission layer comprises a first organic transmission layer in the first pixel and a second organic transmission layer in the second pixel, and
   wherein a thickness of the first organic transmission layer is less than a thickness of the second organic transmission layer.

10. The display device according to claim 8, wherein the color conversion layer comprises:
   a first color conversion layer in the first pixel, and comprising a red color conversion particle to convert light emitted from the light emitting element of the first pixel to the red light; and
   a second color conversion layer in the second pixel, and comprising a green color conversion particle to convert light emitted from the light emitting element of the second pixel to the green light.

11. The display device according to claim 1, wherein the thickness of the organic transmission layer is 1.5 μm or more and less than 2.5 μm.

12. An electronic device comprising:
   a substrate; and
   a pixel on the substrate, and including an emission area and a non-emission area, wherein the pixel comprises:
   a pixel circuit layer comprising a transistor on the substrate, and a power line;
   a via layer on the transistor and the power line;
   a first alignment electrode and a second alignment electrode on the via layer and spaced from each other;
   a first bank pattern on the first alignment electrode;
   a second bank pattern on the second alignment electrode;
   an insulating layer on the first bank pattern and the second bank pattern;
   a light emitting element on the insulating layer and located between the first alignment electrode and the second alignment electrode, and comprising a first end and a second end in a longitudinal direction;
   a first pixel electrode electrically connected to the first end of the light emitting element;
   a second pixel electrode electrically connected to the second end of the light emitting element;
   an organic transmission layer covering the first end and the second end of the light emitting element, the organic transmission layer comprising a light diffusion particle; and
   a color conversion layer on the organic transmission layer, the color conversion layer comprising a color conversion particle to convert a first color of light emitted from the light emitting element to a second color of light.

13. A method of fabricating a display device, comprising:
   forming, on a substrate, a pixel including an emission area and a non-emission area, wherein forming the pixel comprises:
   forming, on the substrate, a first alignment electrode and a second alignment electrode spaced from each other;
   forming an insulating layer on the substrate, the first alignment electrode, and the second alignment electrode;
   forming, on the insulating layer, a first bank defining the emission area and the non-emission area;
   aligning a light emitting element on the insulating layer between the first alignment electrode and the second alignment electrode using an electric field formed between the first alignment electrode and the second alignment electrode;
   forming a conductive layer on the light emitting element and the insulating layer;
   forming an organic transmission layer comprising a light diffusion particle on the conductive layer;
   forming a coating layer on the organic transmission layer;
   removing the organic transmission layer and a portion of the coating layer using a first mask to expose a portion of the conductive layer;
   removing the exposed portion of the conductive layer, and forming a first pixel electrode electrically connected to a first end of the light emitting element, and a second pixel electrode electrically connected to a second end of the light emitting element; and
   forming, on the organic transmission layer, a color conversion layer comprising a color conversion particle to convert a first color of light emitted from the light emitting element to a second color of light.

14. The method according to claim 13, wherein forming the organic transmission layer comprises spraying an organic solvent including the light diffusion particle on the emission area.

15. The method according to claim 13, wherein forming the organic transmission layer comprises patterning the organic transmission layer such that the organic transmission layer overlaps the emission area other than the non-emission area.

16. The method according to claim 13,
   wherein forming the organic transmission layer comprises applying an organic solvent including the light diffusion particle to the emission area and the non-emission area, and performing a front-side exposure operation,
   wherein the organic transmission layer is on the first bank in the emission area.

17. The method according to claim 15, wherein forming the organic transmission layer comprises forming a second bank on the first bank after forming the organic transmission layer.

18. The method according to claim 13, wherein a thickness of the organic transmission layer is based on a wavelength of light emitted from the light emitting element.

19. The method according to claim 13, wherein the light diffusion particle of the organic transmission layer comprises a light scatterer having dispersibility in an organic solvent.

* * * * *